(12) United States Patent
Kimura

(10) Patent No.: US 7,049,991 B2
(45) Date of Patent: May 23, 2006

(54) SEMICONDUCTOR DEVICE, DIGITAL-ANALOG CONVERTER AND DISPLAY DEVICE THEREOF

(75) Inventor: Hajime Kimura, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

(21) Appl. No.: 10/727,057

(22) Filed: Dec. 4, 2003

(65) Prior Publication Data

US 2004/0222985 A1  Nov. 11, 2004

(30) Foreign Application Priority Data

Dec. 10, 2002 (JP) ............... 2002-357839

(51) Int. Cl.
*H03M 1/66* (2006.01)

(52) U.S. Cl. ............... 341/144; 341/118; 341/120; 341/136; 341/143

(58) Field of Classification Search ............... 341/133, 341/136, 143–144, 155–154
See application file for complete search history.

(56) References Cited

U.S. PATENT DOCUMENTS

| | | | |
|---|---|---|---|
| 6,229,506 B1 | 5/2001 | Dawson et al. | |
| 6,339,391 B1* | 1/2002 | Chung et al. | 341/153 |
| 6,373,454 B1 | 4/2002 | Knapp et al. | |
| 6,437,716 B1* | 8/2002 | Nakao | 341/118 |
| 6,445,322 B1* | 9/2002 | Watson | 341/144 |
| 6,498,575 B1* | 12/2002 | Matsusaka | 341/144 |
| 6,525,683 B1* | 2/2003 | Gu | 341/140 |
| 6,542,098 B1* | 4/2003 | Casper et al. | 341/144 |
| 6,590,516 B1* | 7/2003 | Inagaki et al. | 341/144 |
| 6,809,670 B1* | 10/2004 | Sun | 341/136 |
| 2002/0014984 A1* | 2/2002 | Matsusaka | 341/153 |
| 2003/0058687 A1 | 3/2003 | Kimura | |
| 2003/0062524 A1 | 4/2003 | Kimura | |
| 2003/0128199 A1 | 7/2003 | Kimura | |
| 2003/0156102 A1 | 8/2003 | Kimura | |
| 2003/0169250 A1 | 9/2003 | Kimura | |

FOREIGN PATENT DOCUMENTS

| | | |
|---|---|---|
| DE | 2532580 | 1/1977 |
| EP | 0 206 419 | 12/1986 |
| FR | 2155877 | 10/1971 |
| JP | 61-295721 | 12/1986 |
| JP | 2002-514320 | 5/2002 |

(Continued)

OTHER PUBLICATIONS

Reiji Hattori et al.; "Analog-Circuit Stimulation of the Current-Programmed Active-Matrix Pixel Elecrode Circuits Based on Poly-Si TFT for Organic Light-Emitting Displays"; *AM-LCD '01*; pp. 223-226; 2001.

(Continued)

*Primary Examiner*—Rexford Barnie
*Assistant Examiner*—Khai M. Nguyen
(74) *Attorney, Agent, or Firm*—Fish & Richardson P.C.

(57) ABSTRACT

A semiconductor device having a voltage-current conversion function, a digital-analog conversion function, and a gamma correction function is provided. A digital input signal (voltage) is input from an input terminal of a switching circuit. The switching circuit selects a current source to be connected to the input terminal according to the value of the digital input signal. Each current source outputs a predetermined value of current according to the signal from the input terminal. In this manner, by switching a current source for outputting current according to a digital input signal, gamma correction can be performed as well as digital-analog conversion.

46 Claims, 29 Drawing Sheets

FOREIGN PATENT DOCUMENTS

| | | |
|---|---|---|
| JP | 2002-517806 | 6/2002 |
| JP | 2003-177710 | 6/2003 |
| JP | 2003-177712 | 6/2003 |
| JP | 2003-255880 | 9/2003 |
| WO | WO 01/06484 A1 | 1/2001 |
| WO | WO 03/038793 A1 | 5/2003 |
| WO | WO 03/038794 A1 | 5/2003 |
| WO | WO 03/038795 A1 | 5/2003 |
| WO | WO 03/038796 A1 | 5/2003 |
| WO | WO 03/038797 A1 | 5/2003 |

OTHER PUBLICATIONS

Yoshito Date et al.; "36.5L: *Late-News Paper*: Development of Source Driver LSI for AMOLED Displays Using Current Driving Method"; *SID 03 DIGEST*; pp. 1138-1141; 2003.

International Search Report, Application No. PCT/JP03/15386, dated Feb. 10, 2004, 3 pages.

International Preliminary Examination Report (Application No. PCT/JP03/15386), dated Apr. 20, 2004, (partial English translation), 5 pages.

* cited by examiner

PRIOR ART

PRIOR ART

SEMICONDUCTOR DEVICE, DIGITAL-ANALOG CONVERTER AND DISPLAY DEVICE THEREOF

TECHNICAL FIELD

The present invention relates to a technology of a semiconductor device having a gamma correction function. More particularly, the invention relates to a semiconductor device integrated with a digital-analog conversion function, a voltage-current conversion function, and a gamma correction function.

BACKGROUND ART

In recent years, organic EL (organic electro luminescence (also referred to as organic LED and OLED etc.)) display has been drawing attention as a display device comprising pixels each including a light emitting element. In particular, an active matrix organic EL display in which a thin film transistor (TFT) is disposed in each pixel has actively been studied.

As the most basic pixel configuration of an organic EL display, two TFTs are used in a pixel. One of the TFTs has a function to control whether to input a video signal to the pixel or not, and referred to as a selection TFT and the like. The other TFT has a function to control the amount of current supplied to an organic EL element, and referred to as a driving TFT and the like. Depending on the level of the gate-source voltage of the driving TFT, the current value supplied to the organic EL element can be controlled.

However, the driving TFT has a problem in that its current characteristics vary among pixels, and consequently, the current value flowing in the organic EL element also varies, leading to variations in luminance.

In view of the foregoing, various pixel configurations are studied in order to prevent variations in the current value supplied to the organic EL element. As one of the configurations, a pixel to which a current but a voltage is input as a video signal to determine the luminance has been developed (see Documents 1 to 3 shown below for example). In this specification, this type of pixel is referred to as 'a current input type pixel'. In the current input type pixel, a signal current having a corresponding value to a video signal is input to the pixel. Then, a current having a corresponding value to the signal current is supplied to an organic EL element. Since the current having the corresponding value to the signal current flows in the organic EL element even when current characteristics and the transistor size of the TFT and the like vary among pixels, variations in luminance can be prevented.

In such a current input type pixel, current is used as a video signal. Therefore, a means for supplying a current having a corresponding value to a video signal, namely a driver circuit is required. Accordingly, driver circuits for the current input type pixel are studied (see Document 4 shown below for example).

FIG. 32 shows a part of a driver circuit described in Document 4. The driver circuit shown in FIG. 32 is a circuit which inputs with a 4-bit digital voltage signal and outputs an analog current signal. That is, it has a function to convert a voltage signal into a current signal and a function to convert a digital value into an analog value at the same time. Four TFTs 3206 to 3209 are disposed as the TFTs to operate as current sources since 4-bit signals are input to the circuit.

Next, the operation of FIG. 32 is described. First, a digital voltage signal for each bit is input to input terminals 3202 to 3205. A digital voltage signal of the least significant bit is input to the input terminal 3202, and a digital voltage signal of the most significant bit is input to the input terminal 3205. Since the input terminals 3202 to 3205 are connected to the gate terminals of the TFTs 3206 to 3209 respectively, each of the TFTs 3206 to 3209 is either turned ON or OFF according to the digital voltage signal which is input to the input terminals 3202 to 3205. Then, current flows through the TFTs which are turned ON, and the total current which flows from the TFTs 3206 to 3209 is output from an output terminal 3201 according to the current rule of Kirchhoff. The current which is output from the output terminal 3201 has an analog value.

That is, the TFTs 3206 to 3209 operate as current sources, and whether a current is output or not is controlled by a digital voltage which is input from the input terminals 3202 to 3205.

The TFTs 3206 to 3209 all have the same gate length L. The gate width W differs in each TFT. The TFT 3206 has the narrowest gate width W and the TFT 3209 has the widest gate width. The gate width of each TFT is twice as large as that of the left adjacent TFT in the figure. Accordingly, when the current value which flows from the TFT 3206 as the current source for the least significant bit is referred to as 10, the current value which flows from the TFT 3207 is 2×10, the current value which flows from the TFT 3208 is 4×10, and the current value which flows from the TFT 3209 is 8×10.

Accordingly, by controlling whether or not to output a current in each of the TFTs 3206 to 3209, currents for 4-bit, namely 16 types of current value can be output from the output terminal 3201. For example, when data which turns ON the TFT is input to the input terminals 3203 and 3204, the total current of 2×10 and 4×10, namely the current value of 6×10 flows from the output terminal 3201. When data which turns ON TFT is input to the input terminals 3202, 3203 and 3204, the total current of 10, 2×10 and 4×10, namely the current value of 7×10 flows from the output terminal 3201. In this manner, an analog current signal having the corresponding value to a digital voltage signal which is input to the input terminals 3202 to 3205 is output from the output terminal 3201.

Accordingly, a 16-gray scale display is achieved when the driver circuit shown in FIG. 32 is used as a driver circuit for inputting a signal current to a current input type pixel.

FIG. 33 shows a block diagram which corresponds to the digital-analog converter circuit shown in FIG. 32. Each current source 3311 comprises an input terminal 3312 and an output terminal 3313. The input terminal 3312 is connected to the input terminal 3302 and the output terminal 3313 is connected to the output terminal 3201. The four current sources 3311 correspond to the TFTs 3206 to 3209 in FIG. 32 respectively, and each character in the rectangle denotes the current value which flows from the current source 3311. A plurality of such current sources are disposed in parallel.

The reference documents described above are cited below.

(Document 1) International publication WO01/06484

(Document 2) Published Japanese Translations of PCT International Publication for Patent Applications No. 2002-514320

(Document 3) Published Japanese Translations of PCT International Publication for Patent Applications No. 2002-517806

(Document 4) 'Analog-Circuit Simulation of the Current-Programmed Active-Matrix Pixel Electrode Circuits Based on Poly-Si TFr for Organic Light-emitting Displays', AM-LCD'01, p 223–226

DISCLOSURE OF THE INVENTION (Problems to be Solved by the Invention)

Brightness of light sensed by human eyes is not proportionally related to the light intensity. Even when the light intensity becomes twice as large, human eyes do not necessarily sense that the light has become twice brighter. Therefore, it is necessary to correct the light intensity that is emitted from a display device depending on the brightness sensed by human eyes (the spectral luminous efficacy). The correction of the light intensity in a display device as above is called gamma correction.

In the above-described conventional digital-analog converter circuit shown in FIGS. 32 and 33, one input terminal corresponds to one current source, and the total current which is output from each current source is output from the output terminal 3201 by controlling whether to output a current from the current source corresponding to each bit. Accordingly, a digital voltage which is input to the input terminals 3202 to 3205 is directly proportional to an analog current which is output from the output terminal 3201.

The relationship between the input gray scale number and the output current value in the digital-analog converter circuit in FIG. 33 is shown by a graph in FIG. 34 for ease of description. The horizontal axis shows the gray scale number and the vertical axis shows the current value. As shown in FIG. 34, when the gray scale number is increased, the current value is also increased in proportion, and the relationship between the gray scale number and the current satisfies one linear function over the whole range.

Accordingly, in the conventional digital-analog converter circuit shown in FIGS. 32 and 33, the relationship between the input digital voltage and the output analog current does not satisfy a nonlinear graph, thus it is impossible to perform gamma correction.

In view of the foregoing problems, the invention provides a semiconductor device which can perform gamma correction. More particularly, the invention provides a semiconductor device in which a digital-analog conversion function, a voltage-current conversion function, and a gamma correction function are integrated.

(Means for Solving the Problem)

To solve the above-mentioned problems, a semiconductor device according to the invention comprises m-pieces of current sources $I_1, I_2, \ldots,$ and $I_m$ and a switching circuit including n-pieces of input terminals $D_1, D_2, \ldots,$ and $D_n$ and m-pieces of output terminals $O_1, O_2, \ldots,$ and $O_m$, wherein the current source $I_k$ and the output terminal $O_k$ of the switching circuit are electrically connected to each other (k=1 to m), and the switching circuit selects the output terminals $O_1, O_2, \ldots,$ and $O_m$ to be connected to the input terminal $D_k$ by using signals which are input to the input terminals $D_1, D_2, \ldots,$ and $D_n$ of the switching circuit.

Also, a semiconductor device according to the invention comprises m-pieces of current sources and a switching circuit including n-pieces of input terminals and m-pieces of output terminals, wherein the m-pieces of the current sources are each connected to one of the different output terminals, at least one of the input terminals is connected to one or a plurality of switches, the switch is connected to one of the m-pieces of the output terminals, and the switching circuit controls ON/OFF of the switch by using a signal input from at least one of the n-pieces of the input terminals.

Alternatively, according to the switching circuit, at least one of the output terminals is connected to one or a plurality of switches, the switch is connected to one of the n-pieces of the input terminals, and the switching circuit controls ON/OFF of the switch by using a signal input from at least one terminal of the n-pieces of the input terminals.

According to the switching circuit of the semiconductor device having the above configuration, it is also possible to control the ON/OFF state of the switch by using a signal which is input externally.

By adopting the above configuration, one input terminal can be connected to a plurality of current sources, or a plurality of input terminals can be connected to one current source, thus the relationship between an input signal and an output current can be set in various ways.

Furthermore, to solve the above-mentioned problems, a digital-analog converter circuit for converting an n-bit digital voltage signal into an analog current signal according to the invention comprises m-pieces of current sources, and a switching circuit including n-pieces of input terminals and m-pieces of output terminals, wherein the m-pieces of the current sources are each connected to one of the different output terminals, and the switching circuit selects an output terminal to be connected to the n-pieces of the input terminals among the m-pieces of the output terminals by using at least one of the n-bit digital voltage signals, characterized in comprising m-pieces of current sources, and a switching circuit including n-pieces of input terminals and m-pieces of output terminals, wherein the m-pieces of the current sources are each connected to one of the different output terminals, and the switching circuit selects an output terminal to be connected to the n-pieces of the input terminals among the m-pieces of the output terminals by using at least one of the n-bit digital voltage signals.

Also, according to another configuration of the invention, a digital-analog converter circuit for converting an n-bit digital voltage signal into an analog current signal comprises m-pieces of current sources and a switching circuit including n-pieces of input terminals, the m-pieces of the output terminals, and m-pieces of switch units, wherein the m-pieces of the current sources are each connected to one of the different output terminals, the m-pieces of the output terminals are each connected to one of the different switch units, the m-pieces of the switch units are each connected to one or a plurality of the input terminals, and the switching circuit controls the m-pieces of the switch units by using at least one of the n-bit digital voltage signals, thereby selecting an input terminal to be connected to the output terminal.

Alternatively, a digital-analog converter circuit for converting an n-bit digital voltage signal into an analog current signal comprisesm-pieces of current sources and a switching circuit including n-pieces of input terminals,m-pieces of output terminals, and k ($1 \leq k < m$)-pieces of switch units, wherein them-pieces of the current sources are each connected to one of the different output terminals, the k-pieces of the output terminals amongm-pieces of the output terminals are each connected to one of the switch units, the rest (m−k)-pieces of the output terminals are each connected to at least one of the input terminals without the intermediary of the switch unit, the k-pieces of the switch units are each connected to one or a plurality of the input terminals, and the switching circuit controls the k-pieces of the switch units by using at least one of the n-bit digital voltage signals, thereby selecting an input terminal to be connected to the output terminal.

A digital-analog Converter circuit according to the invention can be configured by using a digital circuit such as an AND circuit, an OR circuit, and the like for the switch units.

Also, a digital-analog converter circuit according to the invention can favorably be applied to a signal line driver circuit such as an electro luminescence display device.

(Effect of Invention)

In the conventional circuit, the relationship between the gray scale number of an input signal and the output current value satisfies one direct proportion. On the contrary, according to the invention, the relationship between the gray scale number of an input signal and the output current value and the gray scale number is divided into a plurality of regions and a function is set in advance in each region, and each current source is switched to be connected to an input terminal based on an input signal so that an output current value may have a predetermined function, thereby performing gamma correction.

Also, by switching the connection between an input terminal and a current source by using an input signal corresponding to the gray scale number and other external control signals, a plurality of functions may be selected corresponding to the same gray scale number. For example, when applying the invention to an electro luminescence display, a luminance decay can be corrected by switching a function to the one which enables the large current value in the case where the luminance is decreased due to the degradation.

Further, according to the invention, besides the gamma correction function, a digital-analog conversion function and a voltage-current conversion function are provided by using a digital voltage signal as an input signal. Accordingly, a semiconductor device integrated with a digital-analog conversion function, a voltage-current conversion function, and a gamma correction function may be provided. The integration of these functions contributes to the cost reduction since it requires no special ICs.

Figure 1:
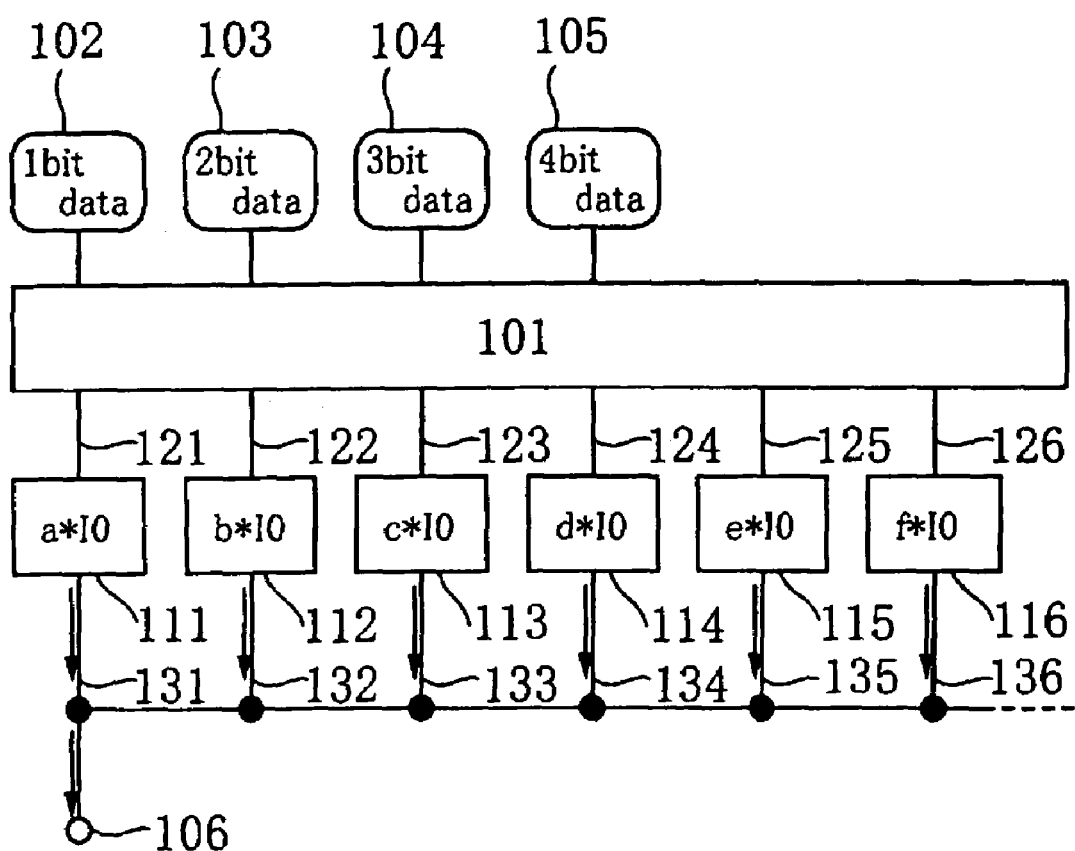
FIG. 1 is a block circuit diagram showing a semiconductor device of the invention which is provided with a gamma correction function.

BEST MODE FOR CARRYING OUT THE INVENTION (Embodiment Mode 1)

In this embodiment mode, an explanation is given on the principle of gamma correction according to the invention.

First, the gray scale number is divided into a plurality of regions every a range.

Then, in each divided region, the relationship between the gray scale number and the current is set to form a line having a predetermined shape when it is shown in a graph. That is, within one region, the relationship between the gray scale number and the current satisfies one function. In the simplest case, when the relationship between the gray scale number and the current is shown in a graph, it is shown by a straight line, and the function satisfies the relationship between the gray scale number and the current becomes linear equation.

Then, the function showing the relationship between the gray scale number and the current is made different among each region of the gray scale number. For example, when the relationship between the gray scale number and the current is expressed by using a linear function, the inclination is set to be different in each region. In consequence, the graph showing the relationship between the gray scale number and the current for the whole regions becomes a sequential line graph in the case where the graph showing the gray scale number and the current in each region is a straight line.

By using data which is input from an input terminal, it is judged to which divided region the gray scale number belongs. This is because the input data corresponds to each gray scale number. On the basis of the judgment, it is determined which function expressing the relationship between the gray scale number and the current is to be selected. That means the function to be used expressing the relationship between the gray scale number and the current is switched according to the input data.

As described above, by setting the function expressing the relationship between the gray scale number and the current in each divided region appropriately and switching the function used according to the gray scale number, gamma correction is achieved.

To realize the principle of the gamma correction described above, a Circuit is required which is provided with a function for switching a current source to be connected to an input terminal according to the signal value which is input from the input terminal.

It should be noted that when a transistor is used as a switch, its polarity is not particularly limited as it functions merely as a switch. In some cases, a transistor of polarity which has less OFF current is preferably used. As a transistor with small OFF current, there is the one provided with an LDD region.

It is desirable that an n-channel transistor is employed when a potential of the source terminal of the transistor as a switch is closer to a power supply potential on the low potential side (Vss, Vgnd, and 0V etc.), and a p-channel transistor is employed when a potential of the source terminal is closer to a power supply potential on the high potential side (Vdd etc.). This helps the switch operate efficiently since the absolute value of a gate-drain voltage of the transistor can be increased. It should be noted that a CMOS switch can also be employed by using both n-channel and p-channel transistors.

Any types of transistor may be utilized as the transistor in the invention, and any types of material, means, and manufacturing method may be adopted for the transistor. For example, the transistor may be a thin film transistor (TFT), in which a semiconductor layer is an amorphous, polycrystalline, or single crystalline TFT. Transistor formed on a single crystalline substrate, transistor formed on an SOI substrate, transistor formed on a plastic substrate, or transistor formed on a glass substrate may be adopted as well. Alternatively, transistor formed of an organic material, a carbon nanotube and the like may be adopted. Furthermore, the transistor may be a MOS transistor or a bipolar transistor.

Figure 34:
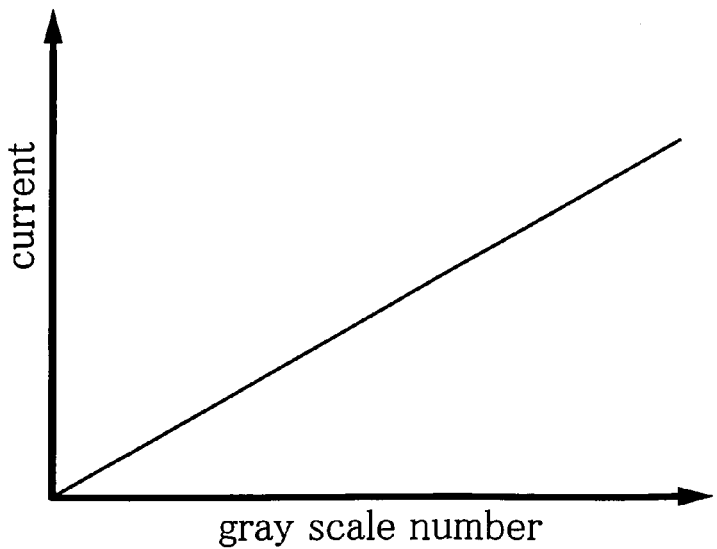
FIG. 34 is a graph showing the relationship between an input (the gray scale number) and an output (the current value) of a digital-analog circuit of FIG. 33.

As shown in FIG. 34, the graph showing the relationship between the gray scale number and the current has a straight line over the whole regions of the gray scales as usual. Described in this embodiment mode is the principle for changing the graph showing the relationship between the gray scale number and the current into a sequential line graph.

Figure 31:
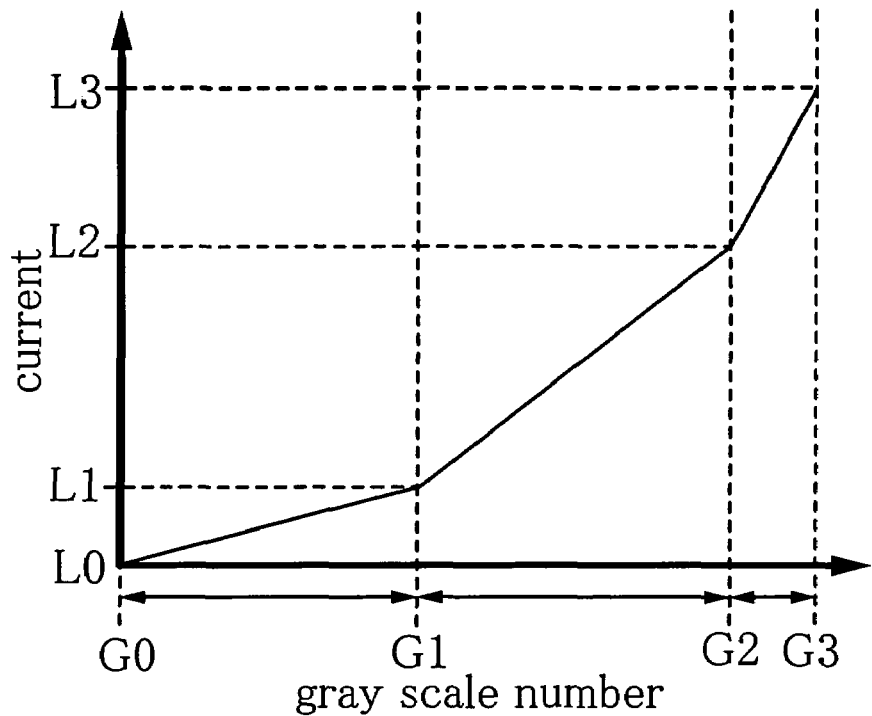
FIG. 31 is a graph showing the relationship between an input (the gray scale number) and an output (the current value) of the invention.

As an example, the relationship between the gray scale number and the current in the case of dividing the gray scale number into three regions is shown in a graph in FIG. 31. The gray number is divided into three regions: from G0 to G1, from G1 to G2, and from G2 to G3. The inclination of the graph showing the relationship between the gray scale number and the current is different in each region.

First, the expression of a general numerical value is described before explaining the principle of establishing a sequential line graph. Generally, a numerical value L is expressed as the following equation (1) based on a cardinal number. Note that six digits are taken as an example here.

$$L=f*B^5+e*B^4+d*B^3+c*B^2+b*B^1+a*B^0 \quad (1)$$

The value B corresponds to the cardinal number. In the case of the decimal number for example, the cardinal number is 10, and in the case of the binary number, the cardinal number is 2. A character string f to a represents each digit and they are normally indicated as fedcba. Since six digits are used here, the six numbers of f to a are used.

Also, when the cardinal number is raised to a power of the digit number subtracted by one is shown by Y[5] to Y[0], the equation (1) may be expressed as an equation (2).

$$L=f*Y[5]+e*Y[4]+d*B[3]+c*Y[2]+b*Y[1]+a*Y[0] \quad (2)$$

Accordingly, the number 321867 is expressed as the following equation (3) in decimal number according to the equation (1).

$$L=3*10^5+2*10^4+1*10^3+8*10^2+6*10^1+7*10^0 \quad (3)$$

Also, the number 101101 is expressed as the following equation (4) in binary number.

$$L=1*2^5+0*2^4+1*2^3+1*2^2+0*2^1+1*2^0 \quad (4)$$

In this manner, the numerical value is expressed by multiplying the number of each digit (f to a) by the proportional coefficient (Y [5] to Y[0]) which corresponds to the cardinal number raised to a power of the digit number subtracted by one and then adding each term.

Now, the principle of establishing a sequential line graph showing the relationship between the gray scale number and the current is described based on the expression method of the numerical value as described above.

As shown in FIG. 31, the graph showing the relationship between the gray scale number and the current is assumed to be a straight line graph having a different inclination in each region. For changing the inclination of the graph showing the relationship between the gray scale number and the current, the value of the proportional coefficients (Y [5] to Y[0]) to be multiplied by the numerical value of each digit in each region is changed, or the value of the cardinal number in each region may be changed as well.

A method for deriving an equation that shows the graph of the relationship between the gray scale number and the current in FIG. 31 is described below.

First, in the region where the gray scale number is G0 to G1, the relationship is expressed as an equation (5) when employing the cardinal number. Here, C is the cardinal number.

$$L=f*C^5+e*C^4+d*C^3+c*C^2+b*C^1+a*C^0 \quad (5)$$

An equation (6) is a more general expression of the equation (5). Here, C[5] to C[0] are the proportional coefficients. They are not necessarily raised to a power of the cardinal number C in the equation (5).

$$L=f*C[5]+e*C[4]+d*C[3]+c*C[2]+b*C[1]+a*C[0] \quad (6)$$

In the region where the gray scale number is G1 to G2, the relationship is expressed as an equation (7) when a cardinal number is employed. Here, D is the cardinal number. The current value in the case where the gray scale number is G1, namely on the boundary between the region where the gray scale number is G0 to G1 and the region where the gray scale number is G1 to G2 is L1.

$$L = L1 + f*D^5 + e*D^4 + d*D^3 + c*D^2 + b*D^1 + a*D^0 \quad (7)$$

An equation (8) is a more general expression of the equation (7). Here, D[5] to D[0] are the proportional coefficients. They are not necessarily raised to a power of the cardinal number D in the equation (8).

$$L = L1 + f*D[5] + e*D[4] + d*D[3] + c*D[2] + b*D[1] + a*D[0] \quad (8)$$

Finally, the region where the gray scale number is G2 to G3 is expressed as an equation (9) when a cardinal number is employed. Here, E is the cardinal number. The current value in the case where the gray scale number is G2, namely on the boundary between the region where the gray scale number is G1 to G2 and the region where the gray scale number is G2 to G3 is L2.

$$L = L2 + f*E^5 + e*E^4 + d*E^3 + c*E^2 + b*E^1 + a*E^0 \quad (9).$$

An equation (10) is a more general expression. Here, E[5] to E[0] are the proportional coefficients. They are not necessarily raised to a power of the cardinal number E in the equation (9).

$$L = L2 + f*E[5] + e*E[4] + d*E[3] + c*E[2] + b*E[1] + a*E[0] \quad (10)$$

In each region of the gray scale number in the equations (6), (8) and (10), the value of the proportional coefficients (C[5] to C[0], D[5] to D[0], and E[5] to E[0]), which are multiplied by the number of each digit (f to a) is changed, or the value of the cardinal numbers (C, D and E) is changed in each region. Thus, the graph showing the relationship between the gray scale number and the current is changed into a straight line graph having the different inclination in each region. That means, the graph showing the relationship between the gray scale number and the current is changed into a sequential line graph as a whole region.

Accordingly, by changing the number of divided regions according to the gray scale number, the range of the gray scale number in each region, and the inclination of a graph in each region, gamma correction can be performed arbitrarily. As is clear from the graph in FIG. 31, the relationship between the gray scale number and the current establishes a linear function in one region. When the number of divided regions is increased, the set of the linear function (sequential line graph) in whole regions can approximate to a non-linear function.

Also, although the relationship between the gray scale number and the current has been taken as an example in this embodiment, the invention is not limited to this. The invention can be applied to the relationship between the current and the numeric value other than the gray scale number, or the relationship between the gray scale number and the numeric value other than the current.

(Embodiment Mode 2)

Described in the foregoing Embodiment Mode 1 is the principle of establishing a sequential line graph showing the relationship between the gray scale number and the current by changing the inclination in each region. In this embodiment mode, a principle of configuring a Circuit is described, which establishes a sequential line graph showing the relationship between the gray scale number of an input signal and an output current value based on the principle described in Embodiment Mode 1.

FIG. 1 shows a schematic diagram of a circuit of the invention. Taken as an example here in the case of inputting a signal of four digits in binary number, namely a 4-bit signal.

Figure 33:
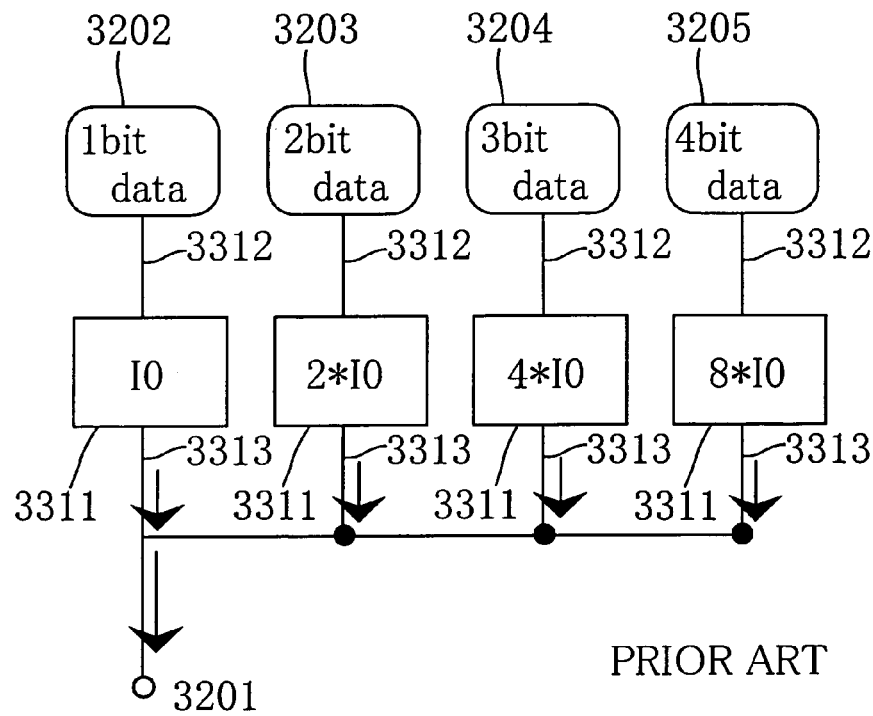
FIG. 33 is a block circuit diagram of a digital-analog converter circuit corresponding to the circuit in FIG. 32.

In the conventional digital-analog converter circuit as shown in FIG. 33, the number of input bits and the number of the current sources 3311 are equal to each other, and each of the input terminals 3202 to 3205 is connected in series to one current source 3311.

On the other hand, in this embodiment mode as shown in FIG. 1, input terminals 102 to 105 are connected to a plurality of current sources 111 to 114 which are disposed in parallel to each other via a switching circuit 101.

The number of input bits (the total number of input terminals) and the number of current sources are not necessarily equal to each other. Output terminals of the switching circuit 101 are connected to input terminals 121 to 126 of the current sources 111 to 116 respectively. Output terminals 131 to 136 of the current sources 111 to 116 are each connected to an output terminal 106.

Reference values a*10, b*10, . . . , and f*10 shown in the current sources 111 to 116 in the figure denote current values which are output from the current sources 111 to 116 (also called 'the current source amount' in this embodiment mode). The same applies to other figures.

It should be noted that in this specification, connection means an electrical connection. Therefore, other elements may be interposed between the shown elements.

The switching circuit 101 switches the connection state between each input terminal 102 to 105 and each current source 111 to 136 disposed in parallel to each input terminal 102 to 105 according to a signal which is input from the input terminals 102 to 105, a control signal, and the like.

As described in Embodiment Mode 1, the principle of gamma correction according to the invention is the method for switching the use of the equations (6), (8), or (10) based on the gray scale number. The switching circuit 101 judges the region to which the gray scale number belongs according to a signal which is input from the input terminals 102 to 105, and selects a current source to be connected to each input terminal 102 to 105 among the current sources 111 to 116. Accordingly, the operation of the switching circuit 101 corresponds to the switching the equations (6), (8), and (10) according to the gray scale number. Thus, the graph showing the relationship between the gray scale number and the output current from the output terminal 106 can be a line graph having a different inclination in each region as shown in FIG. 31.

Figure 2:
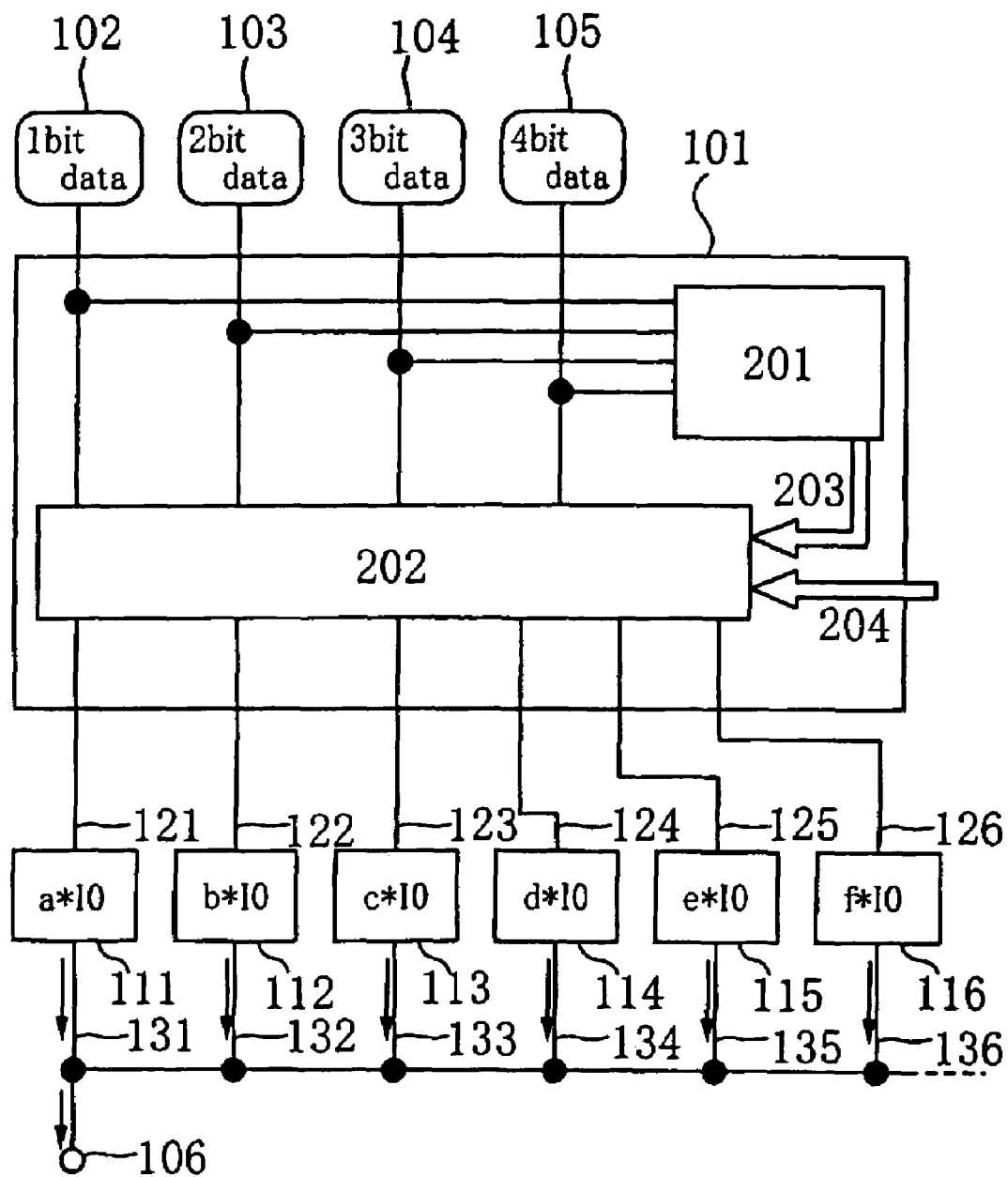
FIG. 2 is a block circuit diagram showing the configuration of a switching circuit of the invention.

FIG. 2 shows an example of the internal configuration of the switching circuit 101. It should be noted that the same reference numerals are given to the same components in each figure.

A signal from each input terminal 102 to 105 is input to a region judging circuit 201 and a switch group 202. In the region judging circuit 201, it is judged to which gray scale region the input signal belongs by using the signal input from each input terminal 102 to 105. A signal 203 which represents data obtained in the region judging circuit 201 is input to the switch group 202. The switch group 202 switches the connection of each input terminal 102 to 105 to the current source of the appropriate value based on the signal 203 which represents the data input from the region judging circuit 201. In the switch group 202, the connection between the input terminals 102 to 105 and the current sources 111 to 116 may be switched by using not only the signal 203 from the region judging circuit 201 but also a control signal 204 which is input externally. However, the control signal 204 is not necessarily used.

In FIG. 2, the region judging circuit 201 and the switch group 202 in the switching circuit 101 are independently shown as different circuits from one another. However, both circuits are integrated in many cases and it is thus difficult to separate each of them clearly. Therefore, the switching circuit 101 in which the region judging circuit 201 and the switch group 202 can not be integrated is included in the invention.

Each of a character string [a*10], [b*10], and the like described in each rectangle showing a current source denotes the current value which is output from each current source 111 to 116. The expression of the outputs from the current sources is the same in other figures.

These current values correspond to the proportional coefficients (C[5] to C[0], D[5] to D[0], and E[5] to E[0]) in the equations (6), (8), and (10) respectively. Accordingly, the number of current sources to be disposed in parallel, the current value to be output from each current source may be set based on the number of divided regions of the gray scale number, the width of the gray scale number range in each region, the inclination of the graph in each region, and the like.

For example, it is assumed that an input terminal for a certain bit is connected to an input terminal of a current source in a certain region, while in another region, an input terminal for another bit is connected to a current source having the same value of the above current source. In this case, one current source can be used in two regions in common.

In this manner, by connecting a plurality of input terminals to one current source, the number of current sources can be reduced. By reducing the number of current sources, the layout area or the circuit scale can be reduced, thus contributes to improve the yield and make the operation simpler.

Figure 3:
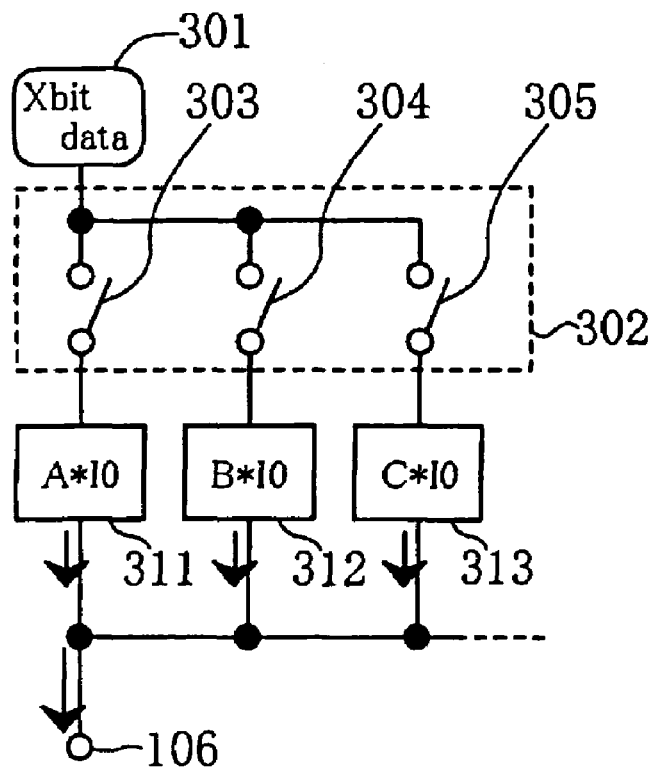
FIG. 3 is a sectional configuration diagram of a switching circuit or a switch circuit of the invention.
Figure 4:
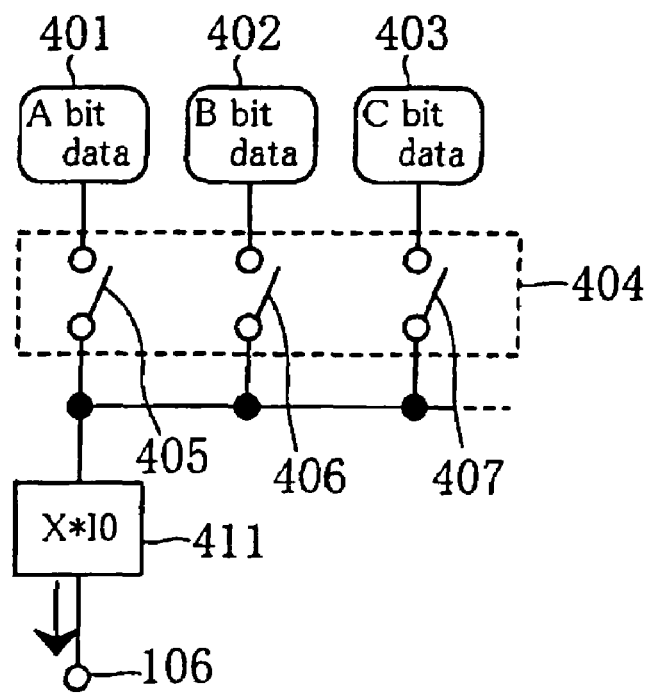
FIG. 4 is a sectional configuration diagram of a switching circuit or a switch circuit of the invention.

Referring now to FIGS. 3 and 4, the specific configuration of the switching circuit 101 or the switch group 202 is described. FIGS. 3 and 4 show sectional circuit diagrams of the switching circuit 101 or the switch group 202. FIG. 3 shows an example in which one input terminal is connected to a plurality of current sources through a switch unit. On the other hand, FIG. 4 shows an example in which a plurality of input terminals are connected to one current source.

First, the configuration of FIG. 3 is described. In FIG. 3, three switches and three current sources 311 to 313 are employed corresponding to one input terminal for ease of description. To an input terminal 301, a signal of an X-bit is input. Three switches 303 to 305 are connected in parallel to each other, and the input terminals of the current sources 311 to 313 are connected in series to the switches 303 to 305 respectively. The output terminals of the current sources 311 to 313 are each connected to the output terminal 106. A circuit 302 which integrates the switches 303 to 305 serves as a switch unit as a part of the switching circuit 101 or the switch group 202. The circuit 302 is controlled by using a signal which is input from the region judging circuit 201 and the like.

As shown in FIG. 3, the invention can be applied to the case where the gray scale number is divided at least into three regions by disposing three pairs of switches and current sources. That means, by turning ON either one of the switches 303 to 305, it becomes possible to select one of the three current sources 311 to 313 to be connected to the input terminal 301. Furthermore, by turning ON the plurality of the switches 303 to 305 at the same time, three or more combinations of the connection between the input terminal 301 and the current sources 311 to 313 is obtained, thus makes it possible to divide the gray scale number into more than three regions.

Also, when a signal other than the X-bit signal is input, the same circuit configuration can be employed. Further, the total number of the current sources can be reduced when a signal of a plurality of bits can be input to one current source.

Hereupon, the configuration example of a circuit in the case where a plurality of input terminals are connected to one current source is shown in FIG. 4. For ease of description, three input terminals are employed here.

Input terminals 401 to 403 are connected to the input terminal of a current source 411 through switches 405 to 407 respectively. The output terminal of the current source 411 is connected to the output terminal 106.

A circuit 404 which integrates the switches 405 to 407 serves as a switch unit as a part of the switching circuit 101 or the switch group 202. The circuit 404 is controlled by using a signal which is input from the region judging circuit 201 and the like.

In this manner, the invention can be applied to the case where the gray scale number is divided at least into three regions by disposing three pairs of the switches 405 to 407. That means, by turning ON either one of the switches 405 to 407, it becomes possible to select three input signals to be connected to the current source 411. By disposing a plurality of input terminals to which one current source can be connected, the current source can be used in a plurality of regions, which contributes to reduce the number of the current sources.

The switching circuit 101 or the switch group 202 is actually configured with the circuit 302 in FIG. 3, the circuit 404 in FIG. 4, or an appropriate combination of the circuit 302 in FIG. 3 and the circuit 404 in FIG. 4. The switching circuit 101 or the switch group 202 is configured so that an input terminal corresponding to data of a certain bit is connected to a plurality of current sources, or a certain current source is connected to a plurality of input terminals for each bit.

By using the switching circuit 101 as described above, a sequential line graph can be established, which shows the relationship between the gray scale number of a signal input from an input terminal and a current output from the output terminal 106.

(Embodiment Mode 3)

Described in this embodiment mode is the more specific configuration of the switching circuit 101. Firstly explained in adopting Embodiment Modes 2 and 3 is a switching circuit as the simplest example in which the gray scale number is divided into two regions in half for realizing the operation which enables the inclination of the graph showing the relationship between the gray scale number and the current in the second half region twice as large as that of the first half region.

First, a function showing the relationship between the gray scale number and the current in each region is described. Next, the circuit configuration for realizing the function is described.

In Embodiment Modes 4 to 8 including this embodiment mode, a bit number of an input signal in the switching circuit is 6-bit as an example. The first bit as the least significant bit is a, the second bit is b, the third bit is c, the fourth bit is d, the fifth bit is e, and the sixth bit is f. Also, as a digital signal is assumed to be input from the input terminal in Embodiments 3 to 8, each of a to f is the either number of 0 or 1.

Accordingly, from each input terminal for the signal corresponding to a to f, either 1 (high level signal, hereinafter referred to as 'H signal') or 0 (low level signal, hereinafter referred to as 'L signal') is input.

When 1 (H signal) is input to the input terminal of a current source, a current is output from each current source, and when 0 (L signal) is input to the input terminal thereof, no current is output from the current source. It should be noted that the control of an output or non-output of a current from each current source is not limited to this.

First, an equation showing the relationship between the gray scale number and the current value in each region is described.

In this embodiment mode, the gray scale number is divided into two regions in half, therefore, it is necessary to judge to which of the first or the second half region an input signal belongs. In this embodiment mode, a 6-bit ($2^6=64$) signal is input, thus the gray scale number on the boundary is $32=2^5$. Accordingly, the signal f of the sixth bit is not included in the first half region.

Accordingly, the signal f of the most significant bit (the sixth bit) may be given attention to in judging a region. When the most significant bit f of an input signal is 0 (L signal), the input signal belongs to the first half region of the gray scale number, while when it is 1 (H signal), the input signal belongs to the second half region of the gray scale number.

Next, a function which shows the relationship between the gray scale number and the current value is derived. First, in the first half region of the gray scale number, the current value L is expressed as the following equation (11).

$$L = a*10 + b*2*10 + c*4*10 + d*8*10 + e*16*10 + f*32*10 \quad (11)$$

As described above, the equation (11) is the general expression showing a normal binary number. As the input signal f of the sixth bit is 0 in the first half region, the equation (11) can be expressed as the following equation (12).

$$L = a*10 + b*2*10 + c*4*10 + d*8*10 + e*16*10 \quad (12)$$

When the input signal f of the sixth bit is 1 (H signal), namely in the second half region of the gray scale number, the current value L is expressed as an equation (13). In the second half region, the inclination of the graph showing the relationship between the gray scale number and the current is twice as large as that of the first half region, therefore, the proportional coefficients of a to f in the equation (11) are increased twice as large.

$$\begin{aligned} L &= a*2*10 + b*4*10 + c*8*10 + d*16*10 + e*32*10 + L1 \quad (13) \\ &= a*2*10 + b*4*10 + c*8*10 + d*16*10 + e*32*10 + \\ &\quad f*32*10 \end{aligned}$$

In the equation (13), L1 is the value of L on the boundary between each region. As the gray scale number G1 on the boundary is 32, a to d=0 can be substituted into the equation (11), thus L1=f*32*10 is satisfied. As the input signal f of the sixth bit is 1 (H signal), the equation (13) can be expressed as the following equation (14).

$$L = a*2*10 + b*4*10 + c*8*10 + d*16*10 + e*32*10 + 32*10 \quad (14)$$

When comparing the proportional coefficients of a to f in the equations (11) and (13) to each other, it is noted that 2*10, 4*10, 8*10, 16*10, and 32*10 are all used in either equation as the proportional coefficients. Accordingly, it is confirmed that these proportional coefficients may be used even in the different regions in common. That is, current sources each having the corresponding value to these proportional coefficients can be used in common in the switching circuit, thus contributes to the reduction in the number of current sources.

As described above, when the inclination becomes twice ($2^1$) as large depending on the region assuming that an input signal is a binary number, a current source to be input the signal also becomes twice as large in many cases. Accordingly, a digit of the used current source may be shifted just by one, and such a current source can be used even in the region where the inclination is twice as large, thus it can be used in common.

Next, a circuit for realizing the above-described equations (11) and (13) is described with reference to FIG. 5.

In order to input signals a to f of the first to sixth bits, six input terminals 501 to 506 are disposed. The input terminals 501 to 506 are connected to the input terminals of current sources 511 to 516 respectively through the switch group 202. The current output terminals of the current sources 511 to 516 are each connected to the output terminal 106. The connection state of the switch group 202 is switched by a control signal from the signal region judging circuit 201.

To realize the above-described equations (11) and (13), the required number of current sources and the current value which is output from the current sources are determined based on the proportional coefficients of a to f. As shown in FIG. 5, the total of seven current sources 511 to 517 are disposed, which includes five current sources 512 to 516 corresponding to [2*10], [4*10], [8*10], [16*10] and [32*10] that are used in both equations (11) and (13) in common as the proportional coefficients a to f, a current source 511 corresponding to the proportional coefficient [10] of a in the equation (1) that is not used in common, and a current source 517 corresponding to the proportional coefficient [32*10] of f in the equation (13).

In the region judging circuit 201, it is judged to which region the gray scale number belongs according to the value of the input signal f of the sixth bit. Accordingly, in the region judging circuit 201, an inverter 521 for inverting an input signal, a wiring 522 which is connected to the input terminal of the inverter 521, and a wiring 523 which is connected to the output terminal of the inverter 521 are disposed. The wiring 522 is connected to the input terminal 506 and input a signal f. Accordingly, to the wiring 523, an inverted signal which corresponds to the signal f inverted in the inverter 521 is input.

The switch group 202 includes first switches 531 to 536 which are controlled by a control signal from the wiring 522 and second switches 541 to 546 which are controlled by a signal from the wiring 523. The input terminals of the first switches 531 to 536 are connected to the input terminals 501 to 506 respectively, and the output terminals thereof are connected to the current sources 512 to 517 respectively. Meanwhile, the input terminals of the second switches 541 to 546 are connected to the input terminals 501 to 506 respectively and the output terminals thereof are connected to the current sources 511 to 516 respectively.

By the above configuration, each of the input terminals 501 to 506 is switched to either one of the input terminals of the current sources 511 to 517 according to a signal which is output from the region judging circuit 201, namely the input signal f of the sixth bit and its inverted signal from the switch group 202. That is, the connection states of the first switches 531 to 536 and the second switches 541 to 546 that are disposed in the switch group 202 are switched by signals from the wirings 522 and 523. That is, the configuration of the switch group 202 in FIG. 5 corresponds to the circuit 302 shown in FIG. 3 in Embodiment Mode 1, and it is configured with six switch units each including the first and second switches.

Figure 5:
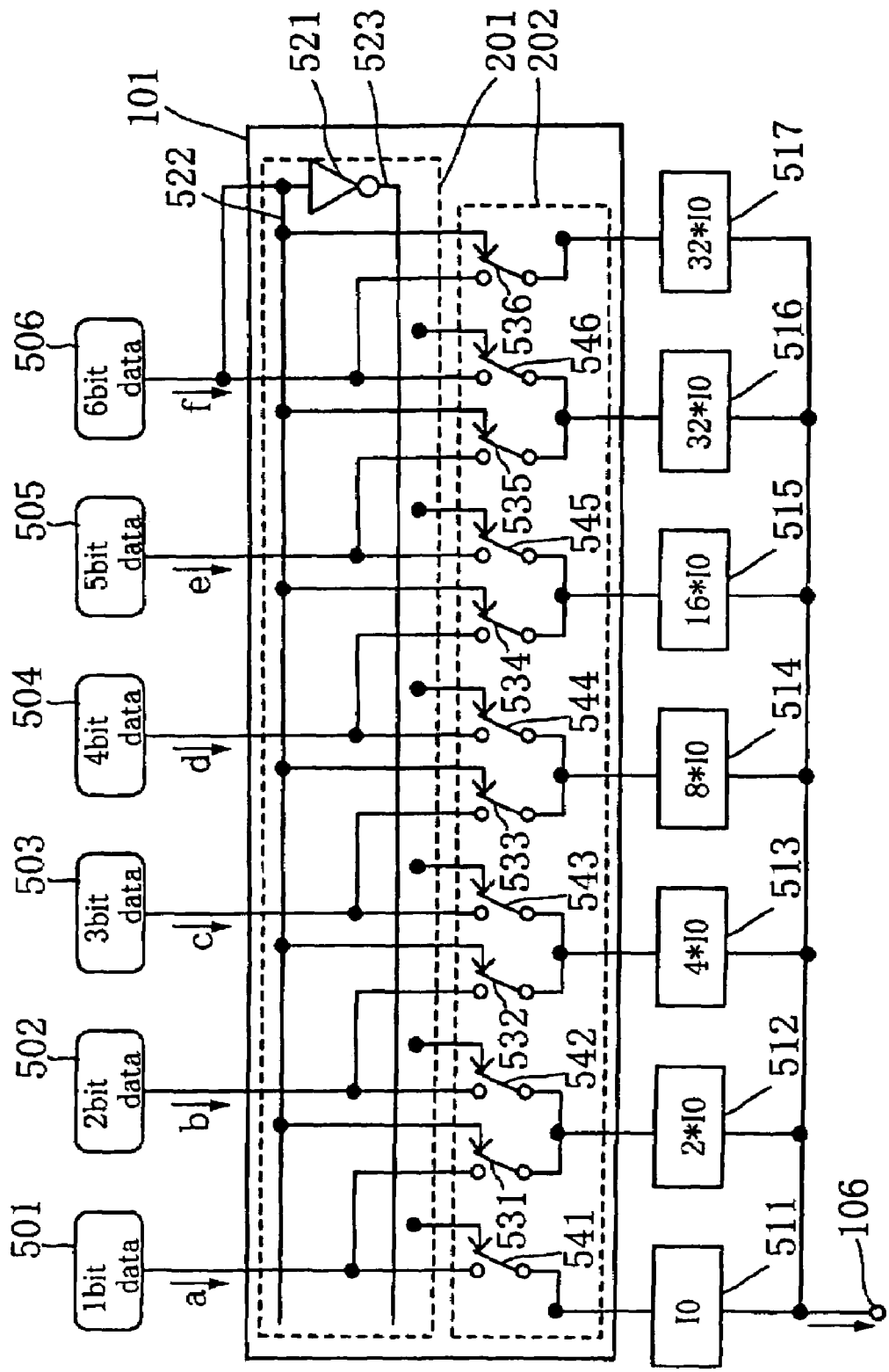
FIG. 5 is a circuit diagram of a digital-analog converter circuit of the invention.
Figure 6:
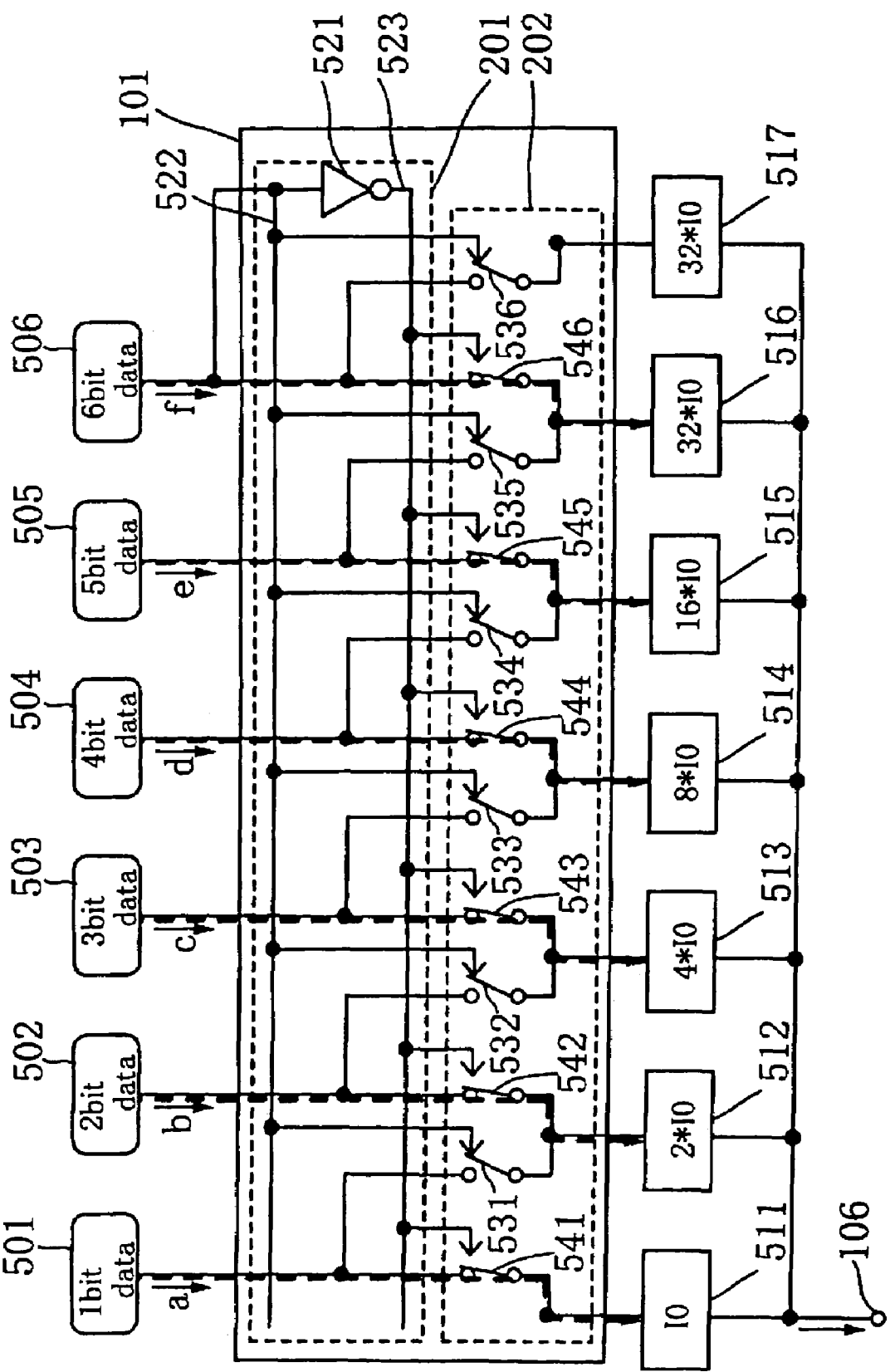
FIG. 6 is a diagram showing the operation of the digital-analog converter circuit in FIG. 5.
Figure 7:
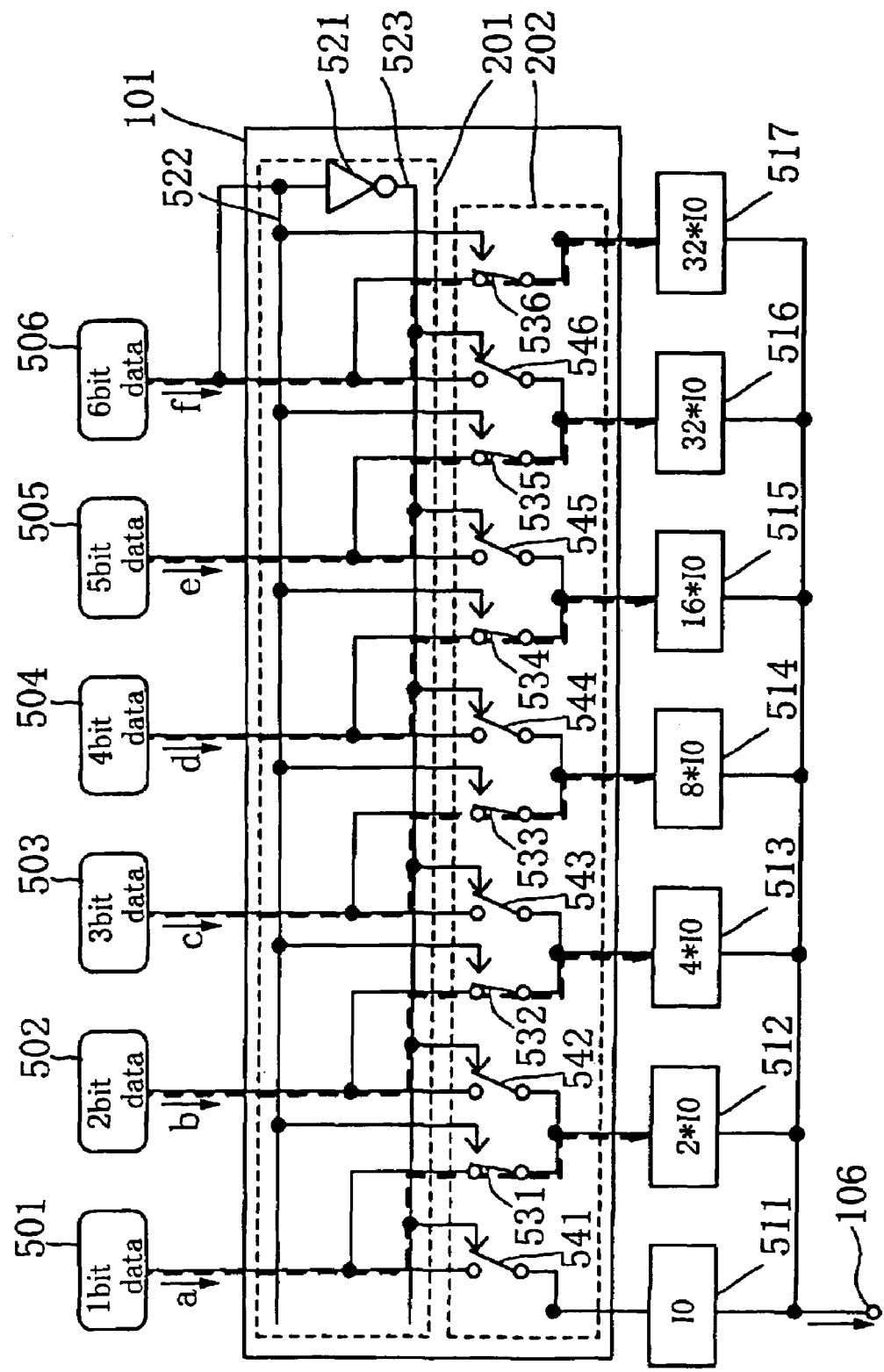
FIG. 7 is a diagram showing the operation of the digital-analog converter circuit in FIG. 5.

The operation of the digital-analog converter circuit shown in FIG. 5 is described now with reference to FIGS. 6 and 7.

Shown in FIG. 6 is the case where the input signal f of the sixth bit is 0 (L signal), namely the connection state corresponding to the equation (11). In this case, a signal input to the wiring 523 is 1 (H signal). Accordingly, the second switches 541 to 546 which become conductive state by the wiring 523 are turned ON. On the other hand, a signal input to the wiring 522 is 0 (L signal), therefore, the first switches 531 to 536 are brought into non-conductive state (OFF). Accordingly, the input terminals 501 to 506 are connected to the current sources 511 to 516 respectively in such a manner that the input signal a of the first bit is input to the current source 511 corresponding to 10, the input signal b of the second bit is input to the current source 512 corresponding to 2*10, the input signal c of the third bit is input to the current source 513 corresponding to 4*10, and so forth.

On the other hand, FIG. 7 shows the case where the input signal f of the sixth bit is 1 (H signal), namely the connection state corresponding to the equation (13). In this case, a signal input to the wiring 522 is 1 (H signal), and a signal input to the wiring 523 is 0 (L signal). Accordingly, the first switches 531 to 536 are turned ON and the second switches 541 to 546 are brought into non-conductive state by the wiring 522. Accordingly, the input terminals 501 to 506 are connected to the current sources 512 to 517 respectively in such a manner that the input signal a of the first bit is input to the current source 512 corresponding to 2*10, the input signal b of the second bit is input to the current source 513 corresponding to 4*10, the input signal c of the third bit is input to the current source 514 corresponding to 8*10, and so forth.

Figure 8:
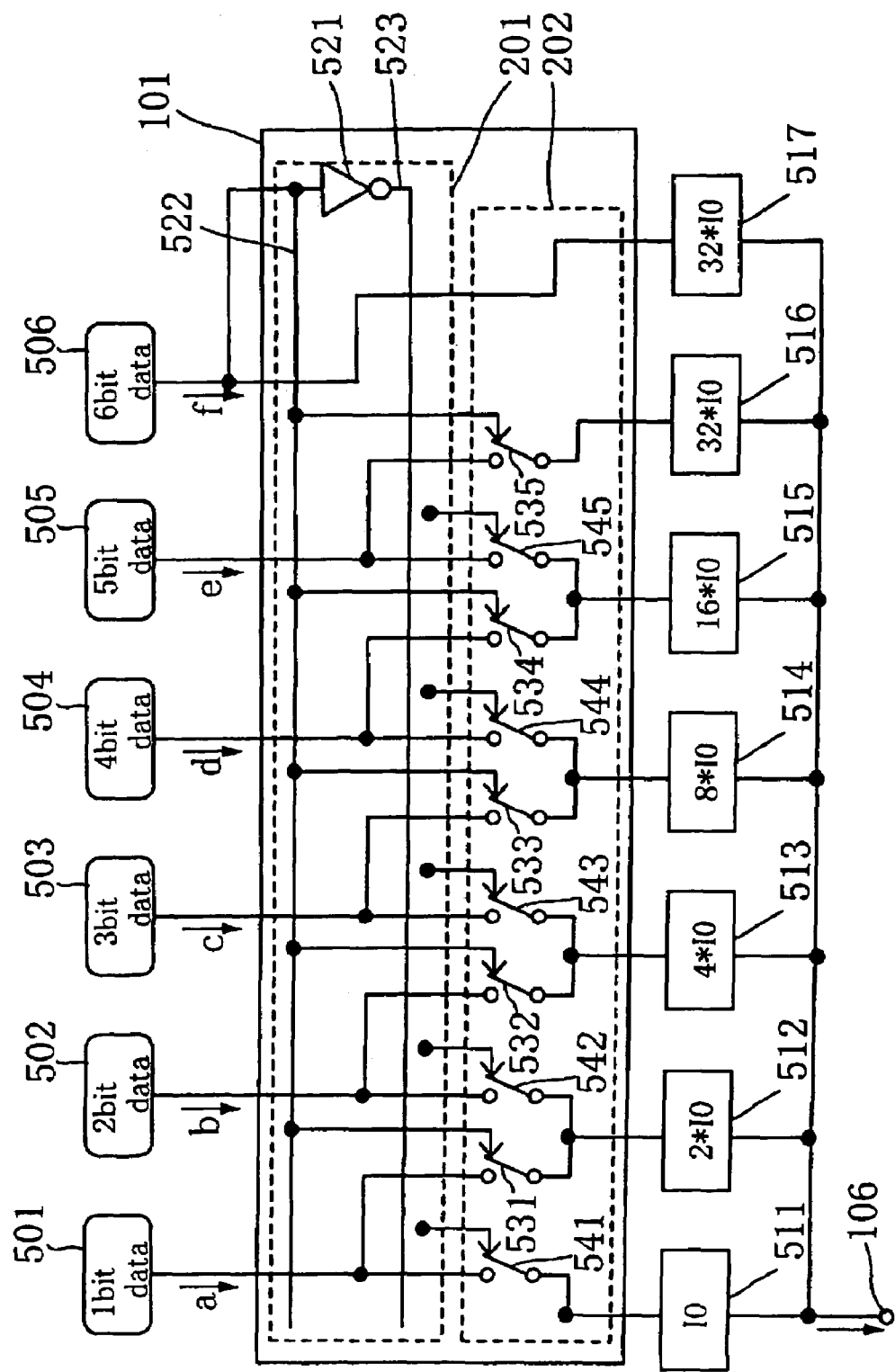
FIG. 8 is a diagram of a modified example of FIG. 5.

It should be noted that when no current is supplied to from the current source 517 in the case where 0 (L signal) is input from the input terminal 506 to the current source 517 by using the equations (12) and (14), the switch group 202 can be simplified as shown in FIG. 8. That is, the switches 536 and 546 which are connected to the input terminal 506 can be omitted in the switch group 202 shown in FIG. 5.

Figure 9:
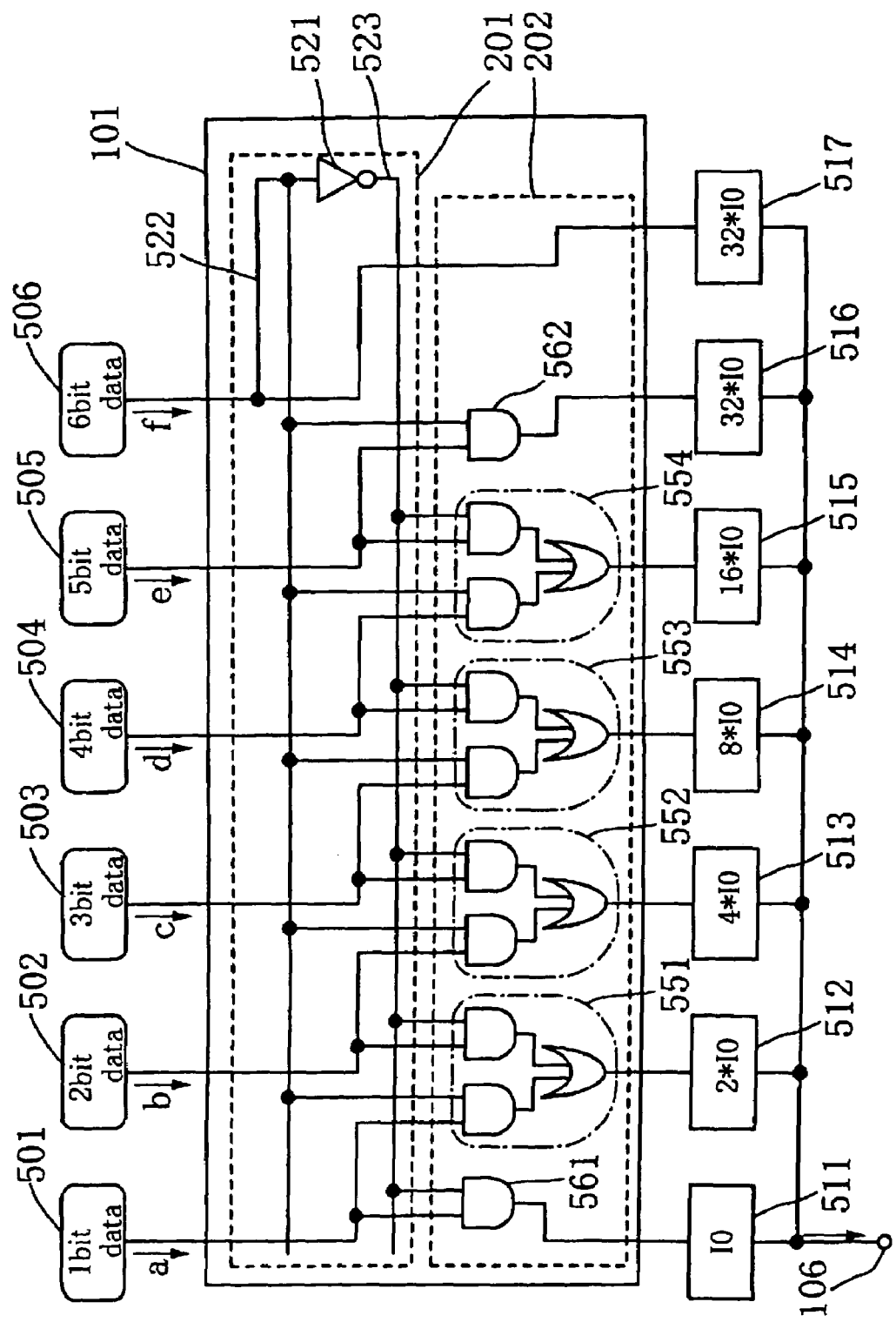
FIG. 9 is a diagram of a modified example of FIG. 8.

Next, the circuit diagram in the case where the switch group 202 in FIG. 8 is configured by using digital circuits is shown in FIG. 9.

FIG. 9 is an example in which the switch group 202 includes AND circuits and OR circuits, and six switch units 551 to 554, 561, and 562 are disposed corresponding to the seven current sources.

In the switching group 202, The input terminals of the current sources 512 to 515, each of which is used in the different gray scale regions in common are connected to the circuits 551 to 554 each including two AND circuits and one OR circuit connected to the output sides of the two AND circuits as shown in the figure. Meanwhile, the input terminals of the current sources 511 and 516, each of which is not used in common are connected to AND circuits 561 and 562 respectively.

The operation of the circuit shown in FIG. 9 is described below.

When the input signal f of the sixth bit is 0 (L signal), namely in the case corresponding to the equation (12), an inverted signal of the signal f which is input to the wiring 523 is 1 (H signal), and a signal which is input to the other wiring 522 is L signal.

Accordingly, each AND circuit connected to the wiring 523 in the switch group 202 directly outputs the signals b to e which are input from the other input of the AND circuit. On the other hand, each AND circuit which is connected to the wiring 522 directly outputs 0 (L signal). Accordingly, in the circuits 551 to 554, the signals b to e are output as an output of the AND circuit which is connected to the wiring 523 since the output from the AND circuit which is connected to the wiring 522 is 0.

Accordingly, the connection states between the input terminals 501 to 506 and the current sources 511 to 517 are similar to those shown in FIG. 6. That is, the signals a to e from the input terminals 501 to 505 are input to the current sources 511 to 515 respectively, and currents are output from the current sources 511 to 515 to the output terminal 106 according to the signals a to e. The current value to be output from the output terminal 106 is as the equation (12).

When the input signal f of the sixth bit is 1 (H signal), namely in the case corresponding to the equation (14), an H signal is input to the wiring 522 and an L signal is input to the wiring 523 as it is input with an inverted signal of the signal f.

Accordingly, each AND circuit connected to the wiring 522 in the switch group 202 directly outputs the signals a to d which are input from the other input terminal of the AND circuit, while each AND circuit which is connected to the wiring 523 directly outputs 0 (L signal). Accordingly, in the circuits 551 to 554, the signals a to d are output as an output of the AND circuit which is connected to the wiring 522 since the output from the AND circuit which is connected to the other wiring 523 is 0.

Accordingly, as in FIG. 7, the signals a to f from the input terminals 501 to 506 are each input to the current sources 512 to 517, and currents are output from the each current sources to the output terminal 106 according to the signals a to f. Therefore, the current value which is output from the output terminal 106 satisfies the equation (14).

As described above, by means of the joint function of the region judging circuit 201 and the switch group 202, the input terminals 501 to 506 are connected to either one of the appropriate current sources 511 to 517 corresponding to the different gray scales. In FIG. 9, the switch group 202 is configured with the AND circuits and the OR circuits, however, the invention is not exclusively limited to this. The switch group 202 and the switching circuit 101 may be configured by using various circuits such as a NAND circuit, a NOR circuit, an inverter circuit, a transfer gate circuit (analog switch), and a tristate buffer circuit.

Figure 10:
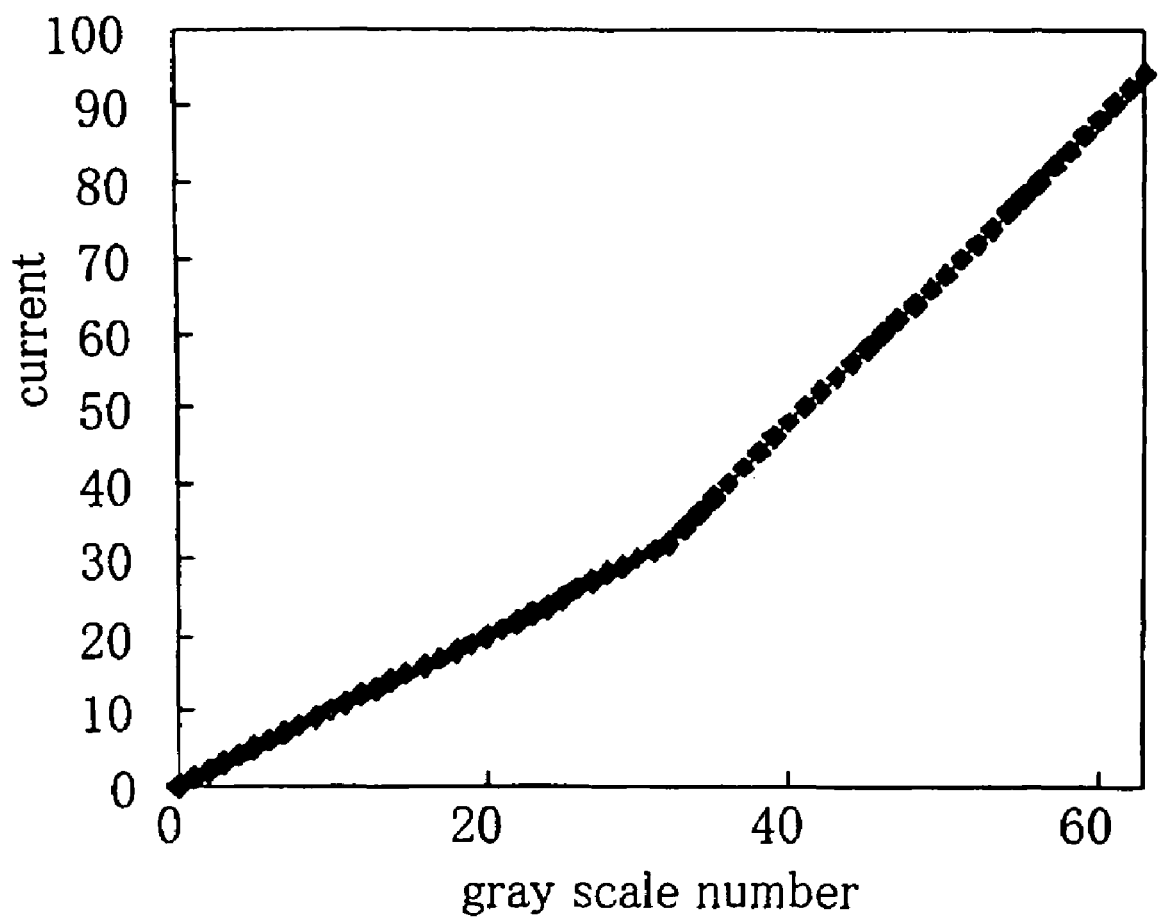
FIG. 10 is a graph showing the relationship between an input (the gray scale number) and an output (the current value) in a digital-analog converter circuit of the invention.

FIG. 10 shows the result of the digital-analog conversion according to the present embodiment mode. The horizontal axis shows the gray scale number of an input signal and the vertical axis shows the current value output from the output terminal 106. As seen in the sequential line graph in FIG. 10, the gray scale number is divided into two regions in half, and the inclination of the graph in the second half region is twice as large as that of the first half region, thus gamma correction is performed as well as voltage-current conversion.

(Embodiment Mode 4)

Described in this embodiment mode is the case where the gray scale number is divided into two regions in half as in Embodiment Mode 3, and in the second half region, the inclination of a linear function showing the relationship between the gray scale number and the current is three times as large as that of the first half region. That is, this embodiment mode is different from Embodiment Mode 3 only in the inclination of the second half region, therefore, the difference only is described here.

First, a function showing the relationship between the gray scale number and the current is derived.

First, in the first half gray scale region, namely when the input signal f of the sixth bit is 0 (L signal), the relationship between the gray scale number and the current is expressed as the equation (11) or the equation (12) as in Embodiment mode 3.

In the second half region, namely when the input signal f of the sixth bit is 1 (H signal), the relationship between the gray scale number and the current is expressed by the following equation (15). This is because, in the second half region, the inclination of the graph showing the relationship between the gray scale number and the current is three times as large as that of the first half region, and the proportional coefficients of a to f are three times as large as those of the equation (11) or the equation (12).

$$L = a*3*I0 + b*6*I0 + c*12*I0 + d*24*I0 + e*48*I0 + L1 \quad (15)$$
$$= a*3*I0 + b*6*I0 + c*12*I0 + d*24*I0 + e*48*I0 + f*32*I0$$

In the equation (15), L1 is the value of L on the boundary between each region, and L1=f*32*I0 is satisfied as in Embodiment Mode 3. Also, the input signal f of the sixth bit is constantly 1 (H signal) in the equation (15).

However, the equation (15) has no coefficients corresponding to those of the equations (11) and (12). Therefore, the equation (15) is transformed into the following equation (16) so that a current source may be used in the first and second half regions in common.

$$L=a*(2*I0+I0)+b*(4*I0+2*I0)+c*(8*I0+4*I0)+d*(16*I0+8*I0)+e*(32*I0+16*I0)+f*32*I0 \quad (16)$$

When comparing the equation (12) with the equation (16), it is noted that I0, 2*I0, 4*I0, 8*I0, 16*I0, and 32*I0 are all used in each of the equations (12) and (16) as the coefficients of the same numbers (a to f), thus it is possible to use the current sources having those coefficients even in the different gray scale regions in common.

Next, a circuit for realizing the equations (12) and (16) is described with reference to FIG. 11. The Circuit shown in FIG. 11 is brought into the connection state corresponding to the equation (12) when the input signal f of the sixth bit is 0 (L signal), and vice versa, into the connection state corresponding to the equation (16) when the input signal f of the sixth bit is 1 (H signal).

Figure 11:
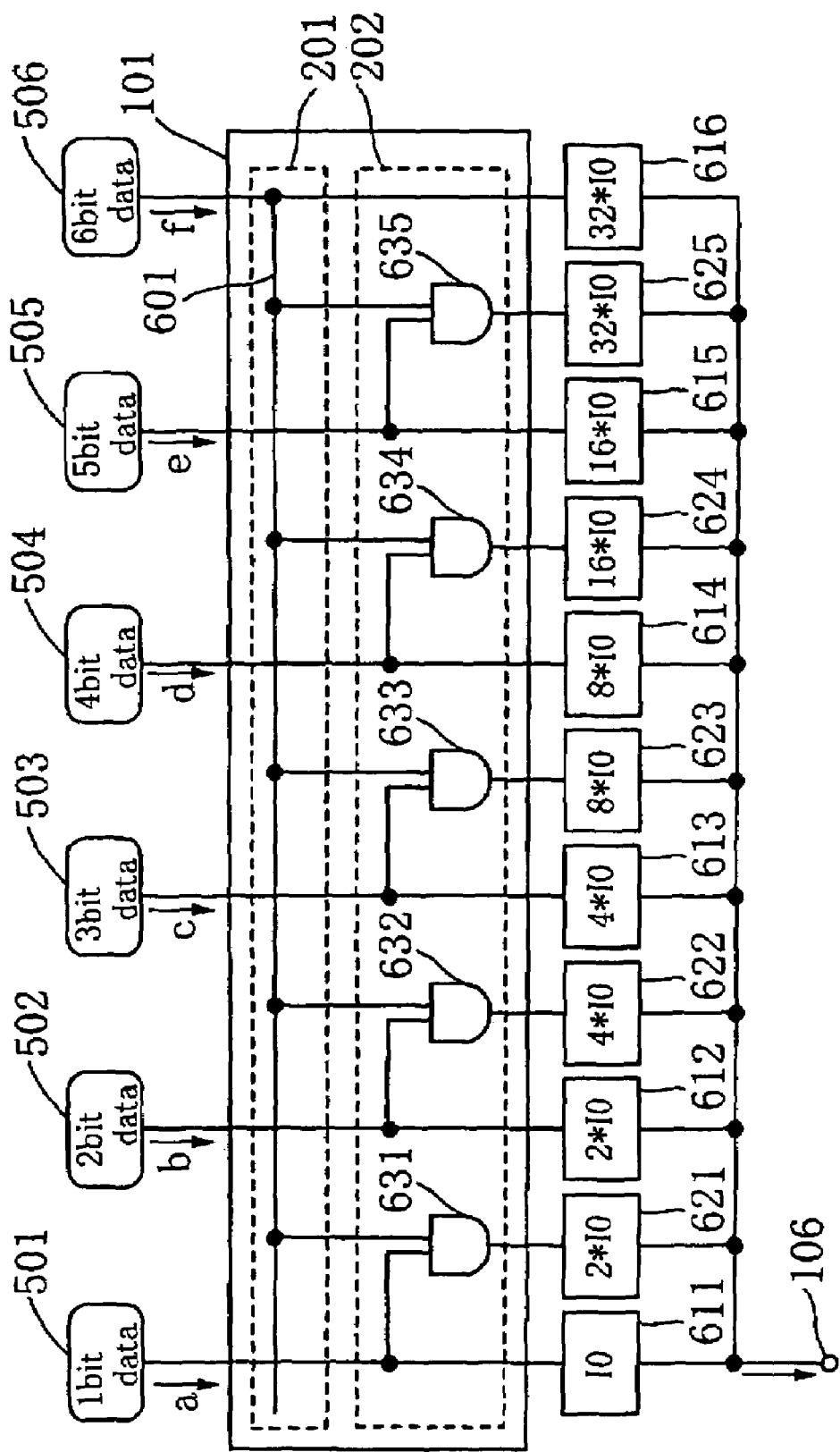
FIG. 11 is a circuit diagram of a digital-analog converter circuit of the invention.

As shown in FIG. 11, a wiring 601 which is connected to the input terminal 506 is disposed in the region judging circuit 201 so that a gray scale region can be judged by using the input signal f of the most significant sixth bit.

The number of current sources and the output current value are determined based on the equations (12) and (16). As described above, six current sources 611 to 616 for outputting currents each corresponding to the coefficients of ⌈I0⌉, ⌈2*I0⌉, ⌈4*I0⌉, ⌈8*I0⌉, ⌈16*I0⌉, and ⌈32*I0⌉ that are used in either equation in common as to the coefficients of the same numbers (a to f), and five current sources 621 to 625 for outputting current each corresponding to the coefficients of ⌈2*I0⌉, ⌈4*I0⌉, ⌈8*I0⌉, ⌈16*I0⌉, and ⌈32*I0⌉ that are not used in each equation in common are used.

The switch group 202 includes five AND circuits 631 to 635. One input terminal of each AND circuit 631 to 635 is connected to the wiring 601 and the other input terminal thereof is connected to the input terminals 501 to 505 respectively. The output terminals thereof are connected to the current sources 621 to 625 respectively.

The current sources 611 to 616 which are used in common are connected to the input terminals 501 to 506 respectively without the intermediary of switches so that the signals from each input terminal 501 to 506 corresponding to the signals a to f are input thereto regardless of the value of the signal f.

Shown in FIG. 11 is a digital-analog converter circuit in which two current sources are disposed corresponding to one input terminal, six switch units are disposed corresponding to six current sources, and five current sources are connected to the input terminals without the intermediary of the switch units.

It should be noted that the digital-analog converter circuit may be configured so as to correspond to the equations (12) and (15) although the example shown in FIG. 11 is the one corresponding to the equations (12) and (16). A circuit of the case is shown in FIG. 12.

Figure 12:
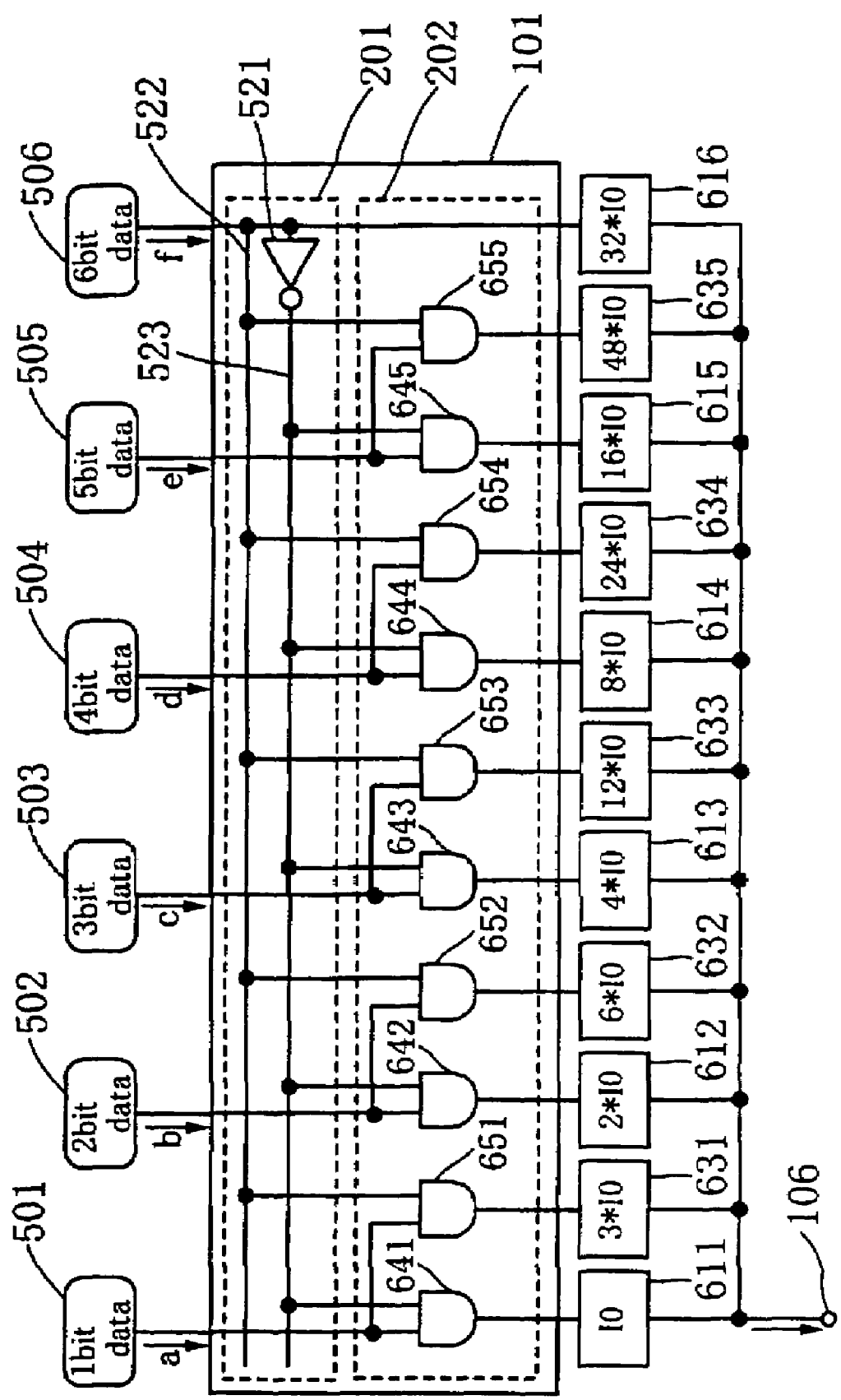
FIG. 12 is a circuit diagram of a digital-analog converter circuit of the invention.

The digital-analog converter circuit shown in FIG. 12 is brought into a connection state corresponding to the equation (12) when the input signal f of the sixth bit is 0 (L signal). On the other hand, when the input signal f of the sixth bit is 1 (H signal), the circuit is brought into a connection state corresponding to the equation (15).

As well as the region judging circuit 201 shown in Embodiment Mode 3, the region judging circuit 201 of this embodiment mode includes the wiring 522 to which the input signal f is input from the input terminal 506, the inverter 521 whose input terminal is connected to the wiring 522, and the wiring 523 to which the output of the inverter is input.

In order to configure the circuit corresponding to the equation (15), the current sources 631 to 635 which output the current each corresponding to [3*I0], [6*I0], [12*I0], [24*I0], and [48*I0] as the coefficients of a to f in the equation (15) are employed in place of the current sources 621 to 625 in FIG. 11 which are not used in common.

The switch group 202 includes first AND circuits 641 to 645 for connecting the input terminals 501 to 505 to the current sources 611 to 615 respectively and second AND circuits 651 to 655 for connecting the input terminals 501 to 505 to the current sources 631 to 635 respectively. Each one of the input terminals of the first AND circuits 641 to 645 is connected to the wiring 523, and each one of the input terminals of the second AND circuits 651 to 655 is connected to the wiring 522.

As for the operation of the switching circuit 101 shown in FIG. 12, The input terminals 501 to 505 are connected to the current sources 611 to 615 by the first AND circuits 641 to 645 respectively when the signal f is 0 (L signal), and the input terminals 501 to 505 are connected to the current sources 631 to 635 by the second AND Circuits 651 to 655 respectively when the signal f is 1 (H signal).

Although the switching circuits 101 shown in FIGS. 11 and 12 are configured with AND circuits as one of the digital circuits, the invention is not limited to this. The switching circuits 101 can be configured with various circuits, for example, with other logic circuits such as an OR circuit, a NAND circuit, a NOR circuit, an inverter circuit, a transfer gate circuit (analog switch), and a tristate buffer circuit.

(Embodiment Mode 5)

Described in this embodiment mode is an example in which a graph showing the relationship between the gray scale number and the current has the different inclination from those of Embodiment Modes 3 and 4. According to the present embodiment mode, the gray scale number is divided into two regions in half, and in the second half region, the inclination of the linear function showing the relationship between the gray scale number and the current is four times as large as that of the first half region here.

Since only the inclination of the function in the second half region is different from those of Embodiment Modes 3 and 4, the difference is mainly explained in this embodiment mode.

When the input signal f of the sixth bit is 0 (L signal), namely in the first half gray scale region, the relationship between the gray scale number and the current is the same as those in Embodiments 3 and 4. Therefore, it can be expressed as the equations (11) and (12).

When the input signal f of the sixth bit is 1 (H signal), namely in the second half gray scale region, the relationship between the gray scale number and the current is expressed as the following equation (17). The proportional coefficients are four times as large as those of the equations (11) and (12) as the inclination in the first half region is four times as large.

$$L = a*4*I0 + b*8*I0 + c*16*I0 + d*32*I0 + e*64*I0 + L1 \quad (17)$$
$$= a*4*I0 + b*8*I0 + c*16*I0 + d*32*I0 + e*64*I0 +$$
$$f*32*I0$$

In the equation (17), L1 is the value of L on the boundary between each region, and L1=f*32*I0 is satisfied as in Embodiment Modes 3 and 4. The input signal f of the sixth bit is constantly 1 (H signal) in the equation (17).

When comparing the equation (12) with the equation (17), it is noted that 4*I0, 8*I0, and 16*I0, are all used in both equations as the coefficients of each number (a to e), thus it is possible to use current sources which output currents corresponding to these proportional coefficients in common even in the different gray scale regions. Accordingly, the number of the current sources can be reduced.

As described above, when the inclination is four times as large ($2^2$) depending on the region assuming that an input signal is a binary number, a current source to be input with the signal also becomes four times as large in many cases. Accordingly, a digit of the used current source may be shifted just by two, and such a current source can be used even in the region where the inclination is four times as large, thus be used in common.

Figure 13:
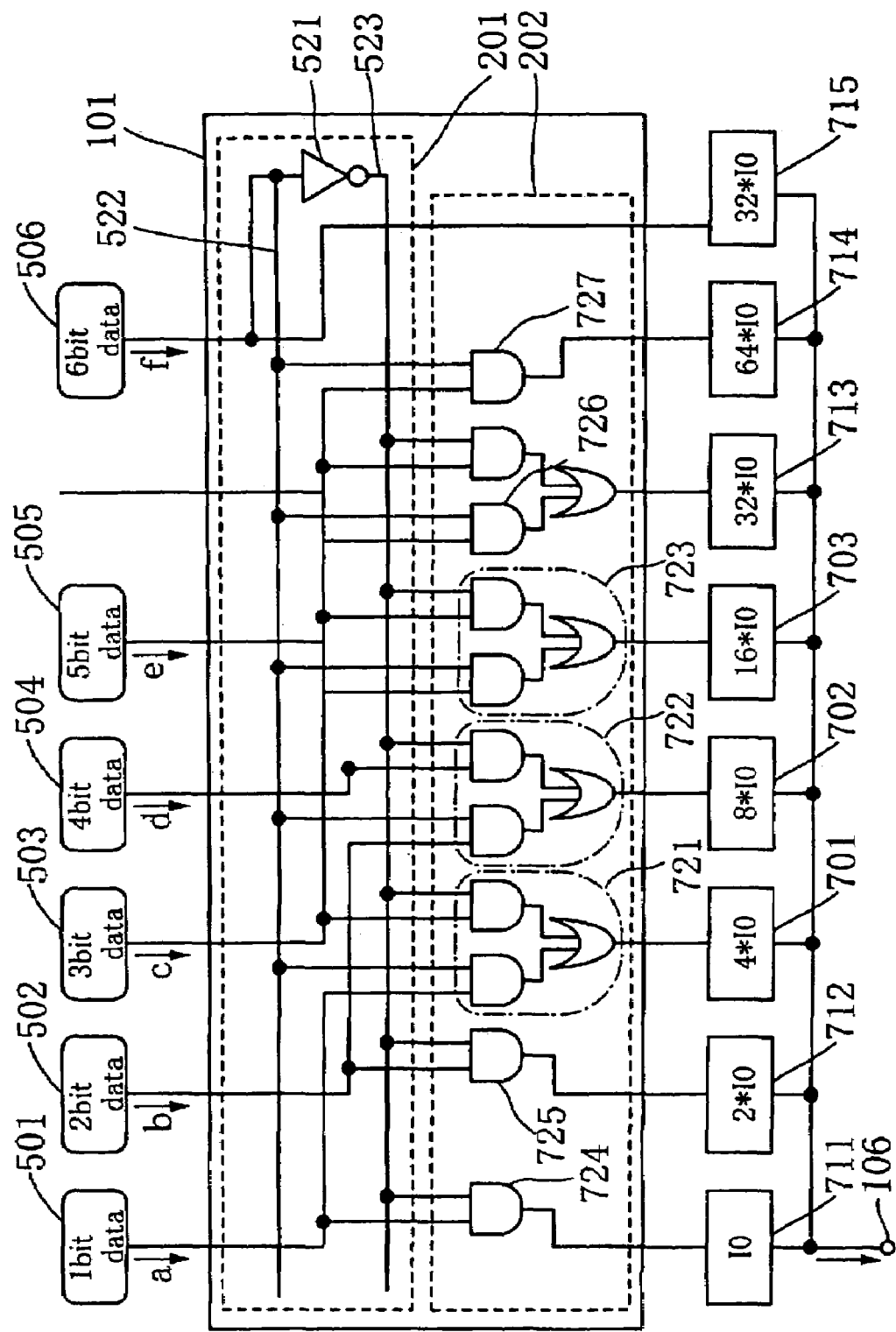
FIG. 13 is a circuit diagram of a digital-analog converter circuit of the invention.

Next, a digital-analog converter circuit corresponding to the equations (12) and (17) is shown in FIG. 13.

The circuit shown in FIG. 13 includes the region judging circuit 201 in which a gray scale region is judged by using the input signal f of the most significant sixth bit, and the switch group 202 in which a current source to be connected to each input terminal is switched according to a signal output from the region judging circuit 201.

The region judging circuit 201 includes the inverter 521 and the wirings 522 and 523 as well as the circuits shown in FIG. 5 of Embodiment Mode 3 and FIG. 12 of Embodiment Mode 4.

The number of current sources and the output current value are determined based on the equations (12) and (17). The total of eight current sources are disposed in parallel, which includes three current sources 701 to 703 corresponding to the proportional coefficients of ⌈4*I0⌉, ⌈8*I0⌉, and ⌈16*I0⌉ that can be used in the different regions in common as described above, current sources 711 and 712 corresponding to the proportional coefficients of ⌈I0⌉ and ⌈2*I0⌉ that are used only in the equation (12), and three current sources 713 to 715 corresponding to the proportional coefficients ⌈32*I0⌉, ⌈64*I0⌉, and ⌈32*I0⌉ used only in the equation (17).

The switch group 202 has a similar configuration as FIG. 9 in Embodiment Mode 3. The input terminals of the current sources 701 to 703 which are used in common are each connected to circuits 721 to 723 each including two AND circuits and one OR circuit as shown in the figure. The input terminals of currents sources 711 and 712 which correspond to the proportional coefficients used only in the equation (12) are connected to the input terminals 501 and 502 through AND circuits 724 and 725 respectively. Current sources 713 and 714 corresponding to the proportional coefficients ⌈32*I0⌉ and ⌈64*I0⌉ that are used only in the equation (17) are connected to the input terminals 504 and 505 through AND circuits 726 and 727 respectively.

Meanwhile, the input terminal 506 used for judging a region is connected directly to the current source 715 without the intermediary of a switch such as an AND circuit.

That is, the switching Circuit 101 shown in FIG. 13 includes the seven switch units 724 to 727 corresponding to the eight output terminals and one of the output terminals is connected to the input terminal without the intermediary of the switch unit.

Figure 14:
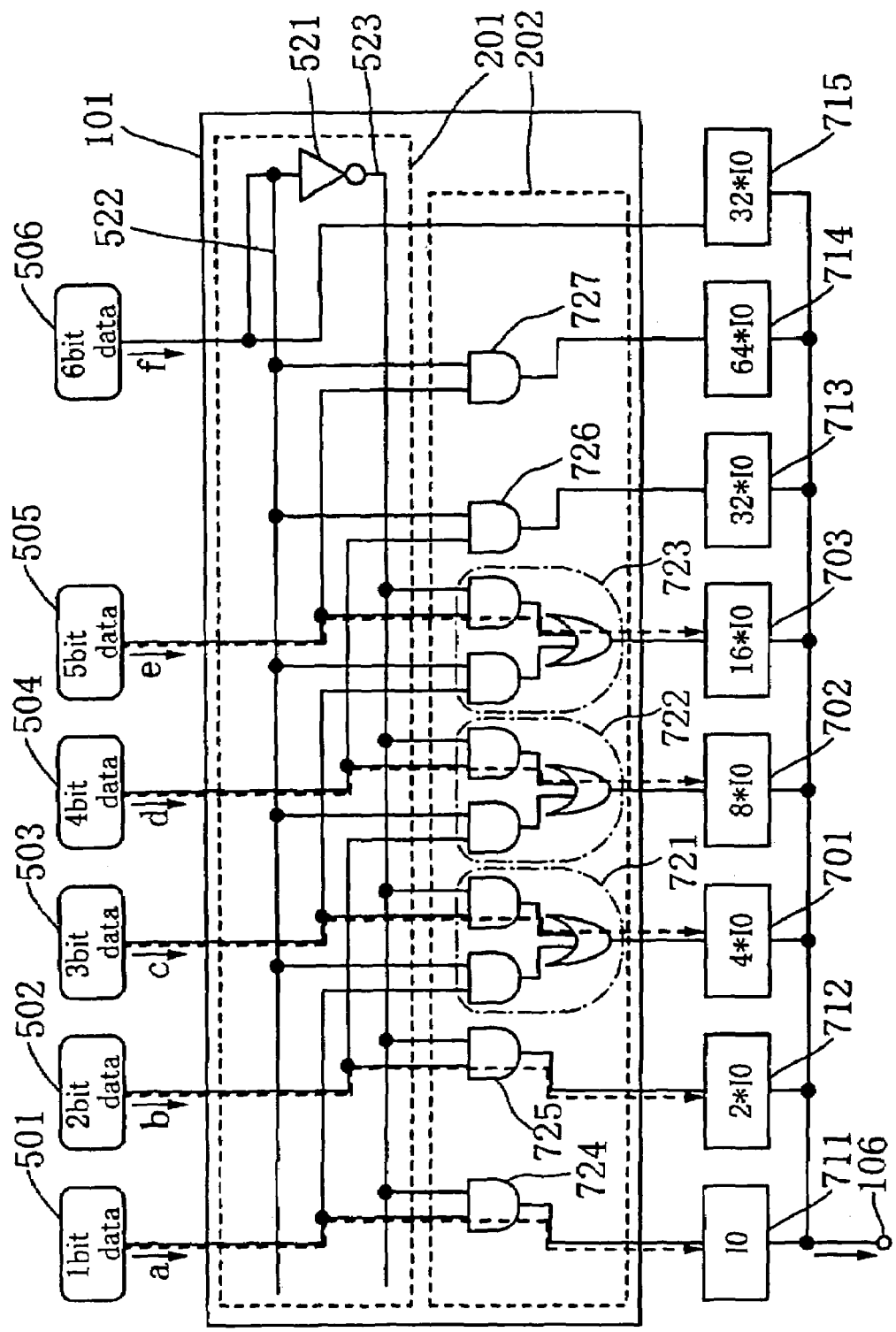
FIG. 14 is a diagram showing the operation of the digital-analog converter circuit in FIG. 13.
Figure 15:
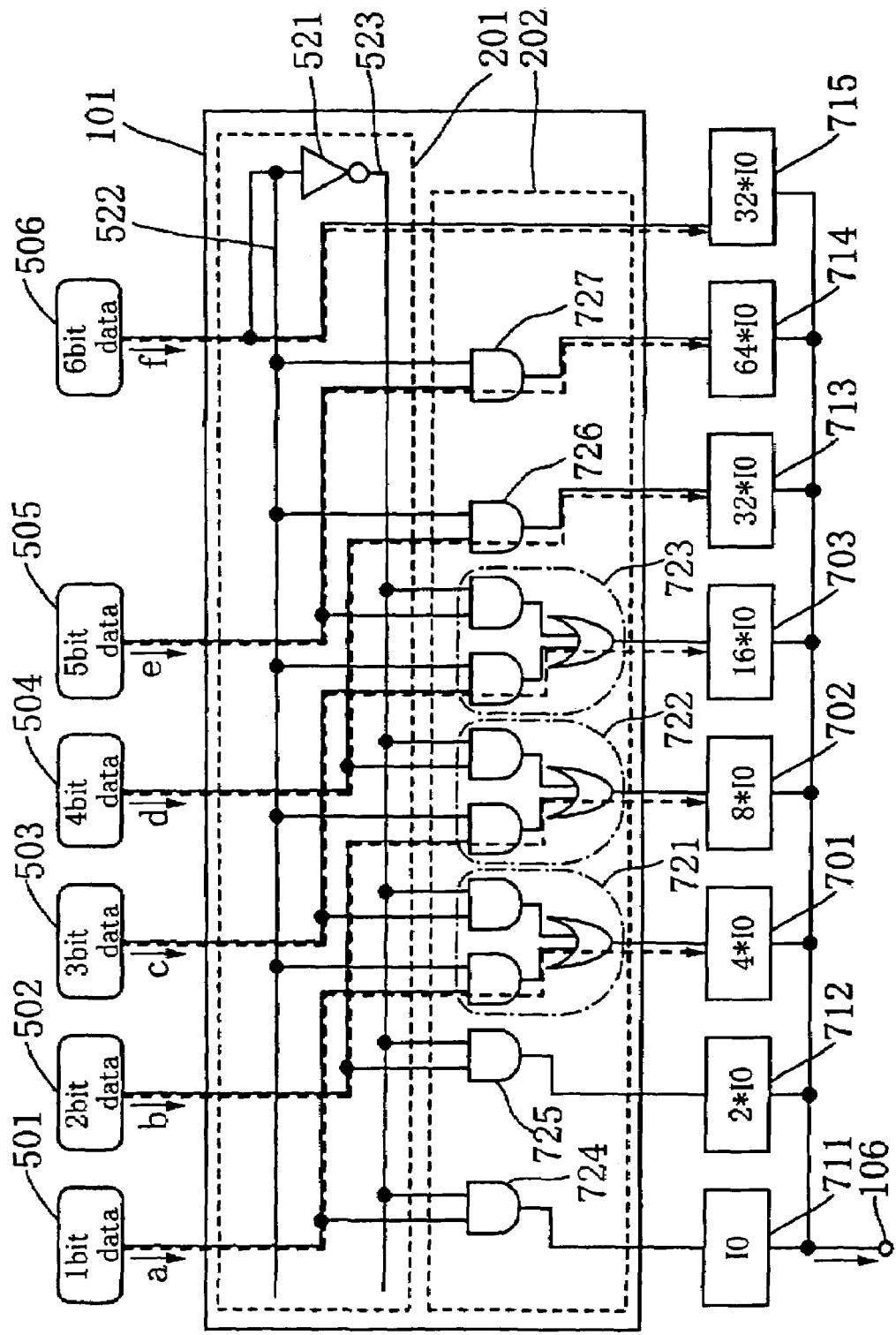
FIG. 15 is a diagram showing the operation of the digital-analog converter circuit in FIG. 13.

The operation of the digital-analog converter circuit shown in FIG. 13 is described now with reference to FIGS. 14 and 15.

FIG. 14 shows the connection state of the circuit when the input signal f of the sixth bit is 0 (L signal), namely corresponding to the equation (12). At this time, 1 (H signal) is input to the wiring 523 and 0 (L signal) is input to the other wiring 522 in the region judging circuit 201.

Each AND circuit connected to the wiring 523 directly outputs the value of the other input signal of the AND circuit. As the signal of the wiring 522 is 0 (L signal), the output of the AND circuit which is connected to the wiring 522 is 0 (L signal). Accordingly, each of the circuits 721 to 723 output values from the AND circuit which is connected to the wiring 523.

Consequently, the signals a to e from the input terminals 501 to 505 are input to the current sources 711, 712, and 701 to 703 respectively, and each of the current sources outputs current to the output terminal 106 according to the value of the signals a to e as shown by dotted arrows. The current source 715 does not output currents as the signal f from the input terminal 506 is 0 (L signal).

On the other hand, in FIG. 15, when the input signal f of the sixth bit is 1 (H signal), the circuit is brought into a connection state corresponding to the equation (17). At this time, the signal of the upper wiring 522 is 1 (H signal), and the signal of the other wiring 523 is 0 (L signal). Accordingly, the signals a to f from the input terminals 501 to 506 are input to the current sources 701 to 703 and 713 to 715 respectively and each of the current sources outputs current to the output terminal 106 according to the value of the signals a to f as shown by dotted arrows in FIG. 15. It should be noted that although the switching circuit 101 shown in FIG. 13 is configured with AND circuits and OR circuits as the digital circuits, the invention is not limited to this. The switching circuit 101 can be configured with various circuits, for example, with other circuits such as a switch, a NAND circuit, a NOR circuit, an inverter circuit, a transfer gate circuit (analog switch), and a tristate buffer circuit.

(Embodiment Mode 6)

Described in this embodiment mode is an example in the case where the method for dividing the gray scale region is different from those of Embodiment Modes 3 to 5. Here, the gray scale number is divided into two regions, and ¾ of the whole region is assigned to the first half region, and ¼ of the whole region is assigned to the second half region. The inclination of the graph showing the relationship between the gray scale number and the current in the second half region is four times as large as that of the first half region as in Embodiment Mode 5.

Since the method for dividing the gray scale region is different from those of Embodiment Modes 3 to 5, the method for judging a gray scale region is also different in this embodiment mode.

In this embodiment mode, the gray scale number is $64=2^6$, and the gray scale number G1 on the boundary is 48 since the second half region has the width of ¼. Accordingly, the signals that belong to the second half region are the input signal e of the fifth bit and the input signal f of the sixth bit each of which is 1 (H signal). When either of the input signal e of the fifth bit or the input signal f of the sixth bit is not 1, the gray scale number belongs to the first half region with the width of ¾. Accordingly, the gray scale region can be judged by using data derived by the logical multiplication (AND) of the input signal e of the fifth bit by the input signal f of the sixth bit. That is, the gray scale region may be judged depending on the case: whether each of the input signal e of the fifth bit and the input signal f or the sixth bit is 1 (H signal) or not.

Next, a function showing the relationship between the gray scale number and the current is explained. The equations (11) and (12) are to be satisfied in the first half gray scale region as in Embodiment Mode 3.

In the second half gray scale region, namely when both of the input signal e of the fifth bit and the input signal f of the sixth bit are 1 (H signal), the relationship between the gray scale number and the current is expressed by the following equation (18). This is because, the linear function showing the relationship between the gray scale number and the current in the second half region has the inclination four times as large as that of the first half region.

$$L = a*4*I0 + b*8*I0 + c*16*I0 + d*32*I0 + L1 \quad (18)$$
$$= a*4*I0 + b*8*I0 + c*16*I0 + d*32*I0 + e*16*I0 + f*32*I0$$

Here, L1 is the value of L in the gray scale number $G1=48=2^4+2^5$ which is the boundary of each region. Accordingly, a to d=0, and e and f=1 can be substituted into the equation (11), thus L1=16*I0+f*32*I0 is satisfied. Since the input signal e of the fifth bit and the input signal f of the sixth bit are constantly 1 (H signal), e and f=1 is satisfied in the equation (18).

When comparing the equations (12) with (18), it is noted that 4*I0, 8*I0, 16*I0, and 32*I0 are all used in both equations as the coefficients of a to f, thus it is possible to use current sources which output currents corresponding to these proportional coefficients even in common in the different gray scale regions. Accordingly, the number of current sources can be used.

As described above, when the inclination is four times as large ($2^2$) depending on the region assuming that an input signal is a binary number, a current source to be input with the signal also becomes four times as large in many cases. Accordingly, a digit of the used current source may be shifted just by two, and such a current source can be used even in the region where the inclination is four times as large, thus can be used in common.

Figure 16:
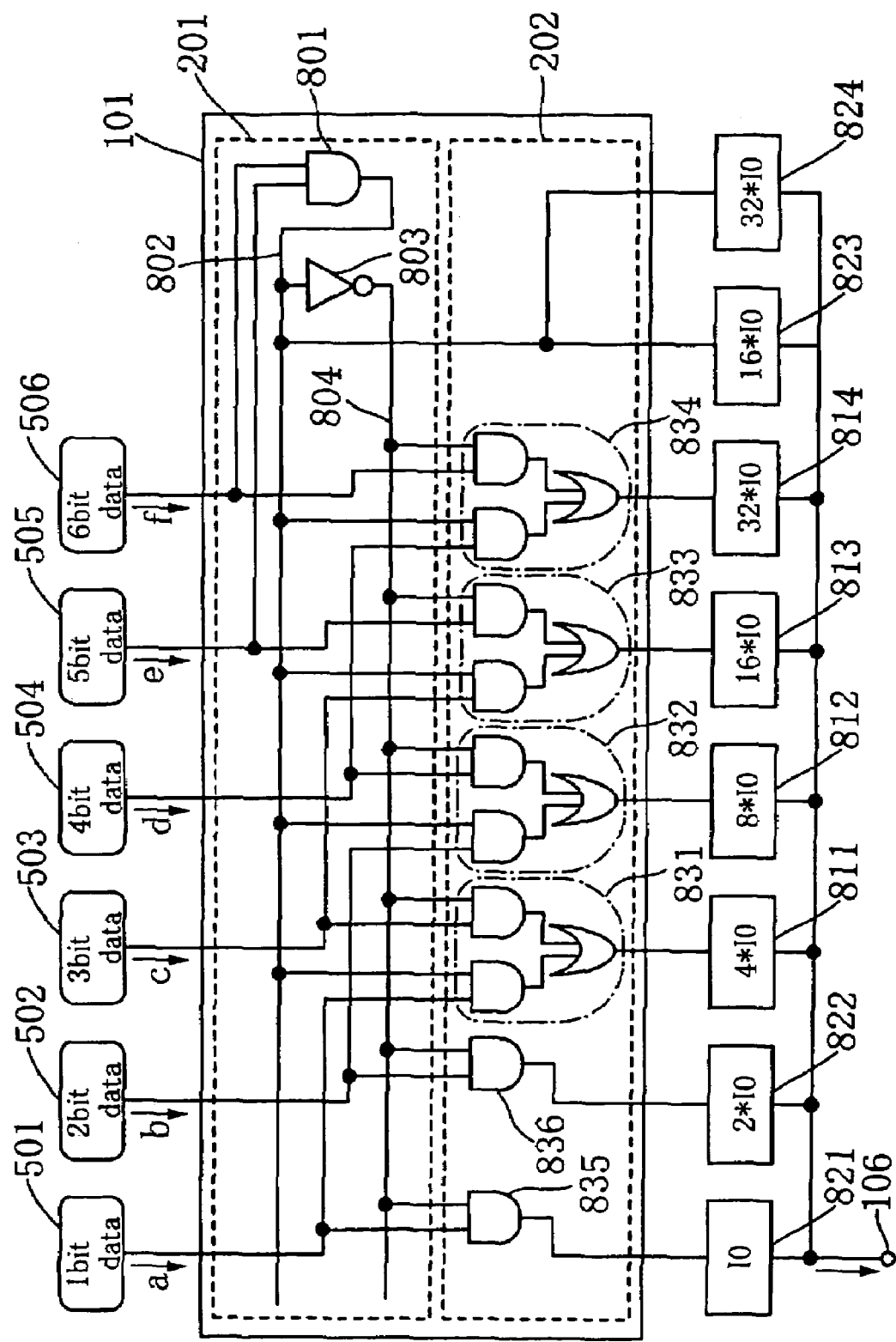
FIG. 16 is a circuit diagram of a digital-analog converter circuit of the invention.

A digital-analog converter circuit corresponding to the equations (12) and (18) is shown in FIG. 16.

In the region judging circuit 201, a region is judged by using the signal c of the fifth bit and the signal f of the sixth bit. The region judging circuit 201 includes an AND circuit 801 to which the signals e and f are input, and the output terminal of the AND circuit 801 is connected to a wiring 802. The wiring 802 is connected to an inverter 803 for inverting an output of the AND circuit 801, and the output terminal of the inverter 803 is connected to a wiring 804.

The total of eight current sources are employed in the circuit, which includes four current sources 811 to 814 which output currents of the proportional coefficients of ⌈4*I0⌋, ⌈8*I0⌋, ⌈16*I0⌋, ⌈32*I0⌋ that are used in both equations (12) and (18), two current sources 821 and 822 which output currents of the proportional coefficients of ⌈I0⌋ and ⌈2*I0⌋ that are used only in the equation (12), and two current sources 823 to 824 which output currents of the proportional coefficients ⌈16*I0⌋ and ⌈32*I0⌋ corresponding to the current value L1 on the boundary and used only in the equation (18).

The switch group 202 has the similar configuration as FIG. 9 in Embodiment Mode 3 and FIG. 13 in Embodiment Mode 4. The input terminals of the current sources 811 to 814 which are used in the different regions in common are each connected to circuits 831 to 834 each including two AND circuits and one OR circuit as shown in the figure. The input terminals of the current sources 821 and 822, which correspond to the proportional coefficients used only in the equation (12) that is not used in common, are connected to the output terminals of AND circuits 835 and 836 respectively. Each one input terminal of the AND circuits 835 and 836 is connected to the wiring 804.

Meanwhile, each input terminal of the current sources 823 and 824 are connected to the output terminal of the AND circuit 801 through the wiring 802, and a part of the region judging circuit 201 is used as a switch.

Figure 17:
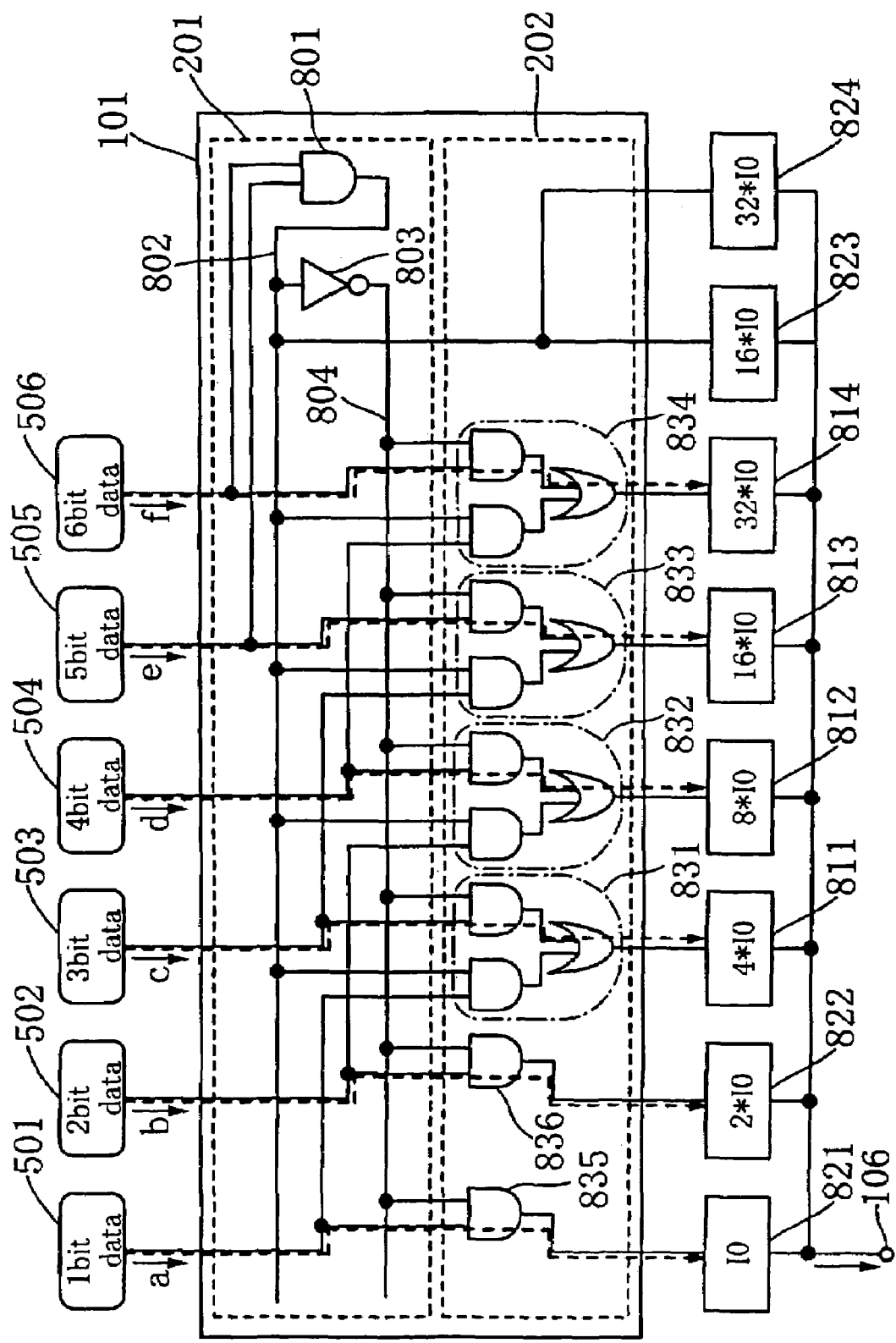
FIG. 17 is a diagram showing the operation of the digital-analog converter circuit in FIG. 16.
Figure 18:
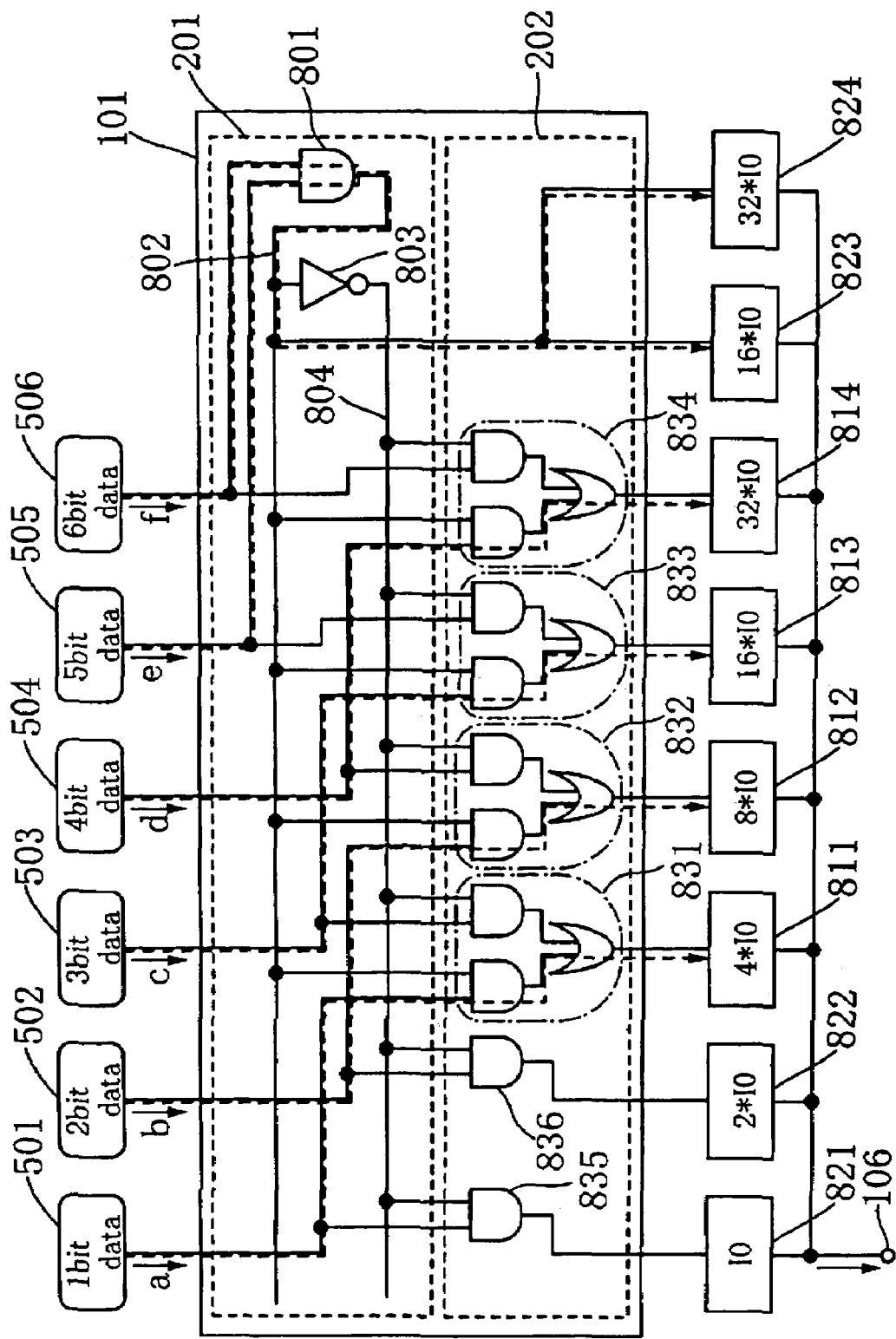
FIG. 18 is a diagram showing the operation of the digital-analog converter circuit in FIG. 16.

The operation of the circuit in FIG. 16 is described now with reference to FIGS. 17 and 18.

The circuit in FIG. 17 shows the connection state when the logical multiplication (AND) of the input signal e of the fifth bit by the input signal f of the sixth bit makes 0 (L signal), namely corresponding to the equation (12).

At this time, a signal input to the wiring 804 is 1 (H signal), and a signal input to the wiring 802 is 0 (L signal). Accordingly, each AND circuit in the switch group 202 whose input terminal is connected to the wiring 804 directly outputs the input signal a to f, which come from the input terminals 501 to 506 to another input terminal of the AND circuit. Accordingly, the input terminals 501 to 506 are connected to the current sources 821, 822, and 811 to 814 respectively, and each current source outputs current to the output terminal 106 according to the value of the input signals a to f as shown by dotted arrows.

On the other hand, the circuit in FIG. 18 shows the connection state when the logical multiplication (AND) of the input signal e of the fifth bit by the input signal f of the sixth bit makes 1 (H signal), namely corresponding to the equation (18).

At this time, a signal which is input to the upper wiring 802 is 1 (H signal), and a signal input to the wiring 804 is 0 (L signal). Accordingly, each AND circuit in the switch group 202 hose input terminal is connected to the wiring 802 can directly output an input signal which comes from another input terminal of the AND circuit. On the other hand, each AND circuit which is connected to the wiring 804 outputs 0 (L signal). Accordingly, the input terminals 501 to 506 are connected to the current sources 811 to 814, 823, and 824 respectively and each current source outputs a current to the output terminal 106 according to the value of the input signals a to f as shown by dotted arrows.

Figure 19:
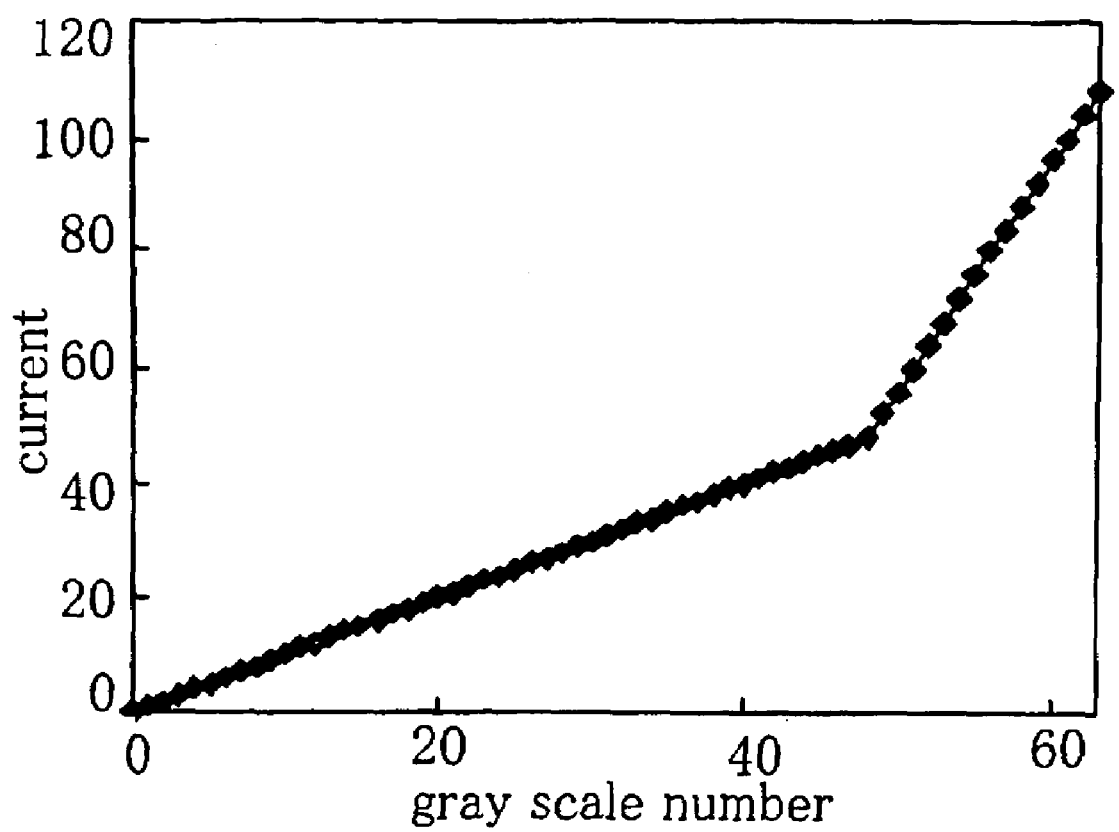
FIG. 19 is a graph showing the relationship between an input (the gray scale number) and an output (the current value) of a digital-analog converter circuit of the invention.

FIG. 19 shows the result of the digital-analog conversion according to the present embodiment mode. The horizontal axis shows the gray scale number of an input signal and the vertical axis shows the current output from the output terminal 106. As seen in the graph showing the relationship between the gray scale number and the current in FIG. 19, in the second half region with a width of ¼, the sequential line graph having an inclination four times as large as that of the first half region is obtained, thus makes it possible to perform gamma correction.

Although the switching circuit 101 shown in FIG. 16 is configured with AND circuits and OR circuits as the digital circuits, the invention is not limited to this. The switching circuit 101 can be configured with various circuits, for example, with other circuits such as a switch, a NAND circuit, a NOR circuit, an inverter circuit, a transfer gate circuit (analog switch), and a tristate buffer circuit.

(Embodiment Mode 7)

Described in this embodiment mode is the case where the gray scale number is divided into four regions, and the inclination of a linear function showing the relationship between the gray scale number and the current in each region is twice larger than the previous region forward the second region.

First, a method for judging the gray scale region is described. As the gray scale number is divided into four regions, each gray scale number G1 to G3 as a boundary corresponds to G1=16=$2^4$, G2=32=$2^5$, and G3=48=$2^4$+$2^5$ respectively.

Accordingly, each of the input signal e of the fifth bit and the input signal f of the sixth bit is 0 (L signal) in the first region. In the second region, the input signal e of the fifth bit is 1' (H signal) and the input signal f of the sixth bit is 0 (L signal). In the third region, the input signal e of the fifth bit is 0 (L signal) and the input signal f of the sixth bit is 1 (H signal). In the fourth region, both of the input signal e of the fifth bit and the input signal f of the sixth bit are 1 (H signal). Thus, all of the four regions can be judged by using the signals e and f of the upper two bits.

Next, a function showing the relationship between the gray scale number and the current in each region is derived.

First, in the first gray scale region, the relationship between the gray scale number and the current is expressed as the equation (11) as in other embodiment modes. Since both of the input signal e of the fifth bit and the input signal f of the sixth bit are always 0 (L signal) in this embodiment mode, the equation (11) is developed into the following equation (19).

$$L==a*10+b*2*10+c*4*10+d*8*10 \quad (19)$$

In the second gray scale region, the relationship between the gray scale number and the current is expressed as the following equation (20) as the inclination of a function is twice as large as that of the first gray scale region, the input signal e of the fifth bit is 1 (H signal), and the input signal f of the sixth bit is 0 (L signal). Here, L1 is the current value L on the boundary between the regions (the gray scale number G1=16).

$$L = a*2*I0 + b*4*I0 + c*8*I0 + d*16*I0 + L1 \quad (20)$$
$$= a*2*I0 + b*4*I0 + c*8*I0 + d*16*I0 + 16*I0$$

In the third gray scale region, the input signal e of the fifth bit is 0 (L signal), the input signal f of the sixth bit is 1 (H signal), and the inclination is twice as large as that of the second gray scale region, which means four times as large as that of the first gray scale region. Accordingly, the relationship between the gray scale number and the current is expressed as the following equation (21). Here, L2 is the current value L on the boundary between the regions (the gray scale number G2=32).

$$L = a*4*I0 + b*8*I0 + c*16*I0 + d*32*I0 + L2 \quad (21)$$
$$= a*4*I0 + b*8*I0 + c*16*I0 + d*32*I0 + 16*I0 + 32*I0$$

In the fourth gray scale region, the input signal e of the fifth bit is 1 (H signal), the input signal f of the sixth bit is 1 (H signal), and the inclination is eight times as large as that of the first gray scale region. Accordingly, the relationship between the gray scale number and the current is expressed as the following equation (22). Here, L3 is the current value L on the boundary between the regions (the gray scale number G3=48).

$$L = a*8*I0 + b*16*I0 + c*32*I0 + d*64*I0 + L3 \quad (22)$$
$$= a*8*I0 + b*16*I0 + c*32*I0 + d*64*I0 + 16*I0 +$$
$$32*I0 + 64*I0$$

When comparing the proportional coefficients of a to e and terms of L1 to 13 in the equations (19), (20), (21), and (22) to each other, it is noted that some of the terms are used in a plurality of regions. This proves that current sources corresponding to the proportional coefficients can be used in common even in the different gray scale regions. Thus, the number of current sources can be reduced.

As described above, when the inclination becomes twice ($2^1$), four times ($2^2$), or eight times ($2^3$) as large in each region assuming that an input signal is a binary number, current sources which are input the signal also become twice, four times, and eight times as large in many cases. Accordingly, a digit of the used current source may be shifted just by one in each region, and such a current source can thus be used in common in each region.

Now, a general description is given on the common use of current source assuming that an input signal is a binary number.

It is assumed that n-th bit data V(n), (n+1)-th bit data V(n+1), and (n+2)-th bit data V(n+2), each of which belongs to a gray scale region K(m), are input to the following current sources: the n-th bit data V(n) is input to a current source as large as I (k), the (n+1)-th bit data V(n+1) is input to a current source as large as I (k+1), and the (n+2)-th bit data V(n+2) is input to a current source as large as I (k+2).

Then, the gray scale number shown by the data of each bit is increased, and each data thus belongs to a subsequent gray scale region K (m+1). The inclination of the graph in the region K (m+1) is $2^P$ times as large as that of the region K (m), and P is an integer number here. In this case, the n-th bit data V(n) is input to the current source as large as I (k+P), the (n+I)-th bit data is input to the current source as large as I (k+P+1), and the (n+2)-th bit data V (n+2) is input to the current source as large as I (k+P+2) in the region K (m+1).

The inclination of the graph in the region K (m+1) is increased, for example, twice ($2^1$ times) as large as that of the region K (m). In this case, the n-th bit data V (n) is input to the current source as large as I (k+1) and the (n+1)-th bit data V (n+1) is input to the current source as large as I (k+2). Accordingly, each of the current source as large as I (k+1) and the current source as large as I (k+2) can be used in common in the region K (m) and the region K (m+1). Meanwhile, either one of the (n+1)-th bit data V (n+1) or the n-th bit data V (n) is input to the current source as large as I (k+1), and either one of the (n+2)-th bit data V (n+2) or the (n+1)-th bit data V (n+1) is input to the current source as large as I (k+2). Thus, the switch group is required to be configured so as to switch these connections.

Similarly, the inclination of the graph in the region K (m+1) is, for example, four times ($2^0$ times) as large as that of the region K (m). In this case, the n-th bit data V (n) is input to the current source as large as I (k+2) in the region K (m+1). Accordingly, the current source as large as I (k+2) can be used in common in each of the region K (m) and the region K (m+1). Meanwhile, either one of the (n+2)-th bit data V (n+2) or the n-th bit data V (n) is input to the current source as large as I (k+2), thus the switch group is required to be configured so as to switch these connections.

The current sources may be used in common based on the principle described above.

Figure 20:
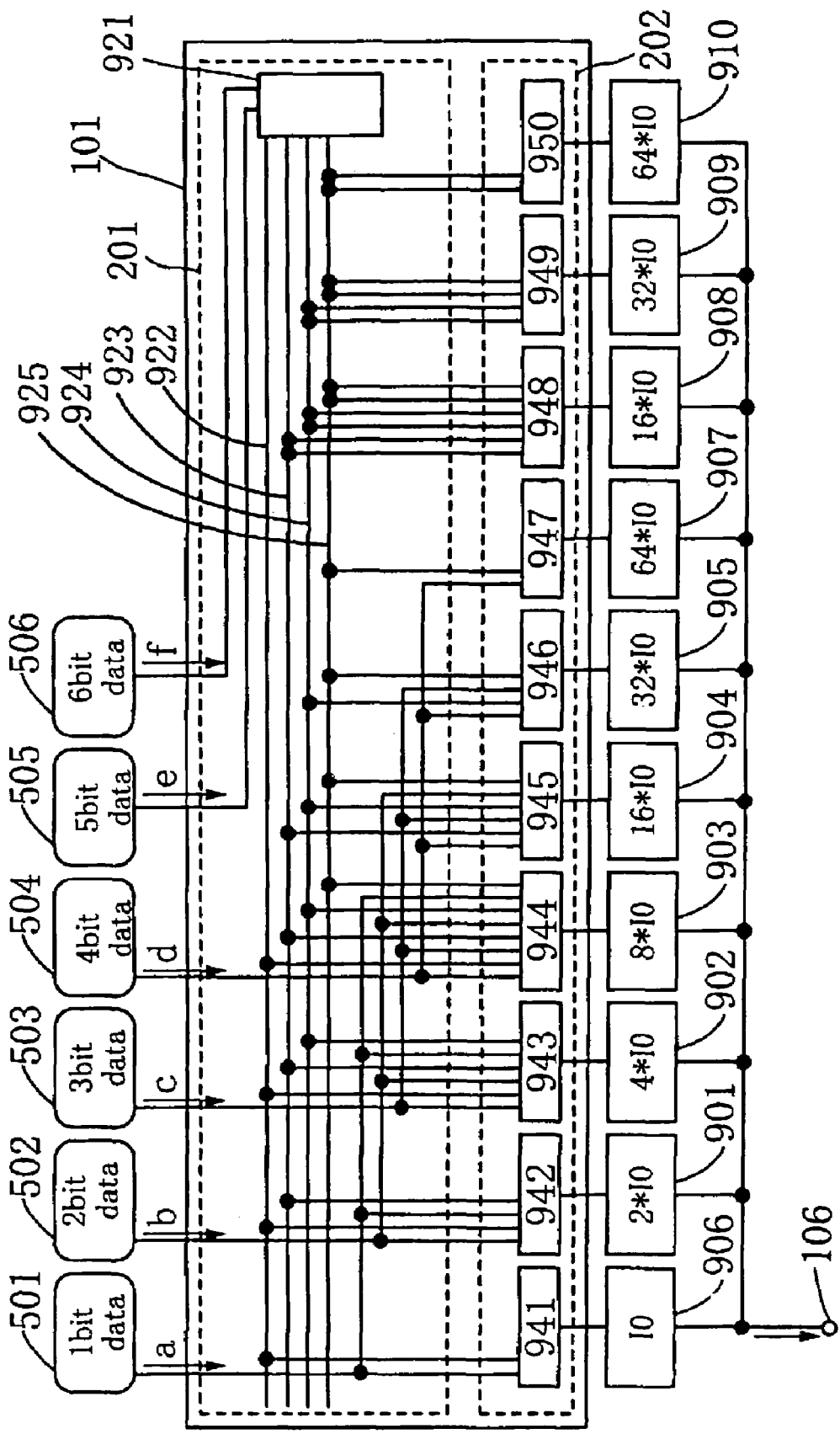
FIG. 20 is a circuit diagram of a digital-analog converter circuit of the invention.

FIG. 20 shows a digital-analog converter circuit corresponding to the equations (19), (20), (21), and (22).

Since ⌈2*10⌉, ⌈4*10⌉, ⌈8*10⌉, ⌈16*10⌉ and ⌈32*10⌉ are all used as the proportional coefficients of each number a to d in at least two of the equations (19) to (22) in common, five current sources 901 to 905 which output currents corresponding to these coefficients are employed. Also, each of the coefficient ⌈10⌉ of a in the equation (19) and the coefficient ⌈64*10⌉ of d in the equation (22) is used independently, and current sources 906 and 907 are disposed corresponding to these coefficients. Furthermore, three current sources 908 to 910 are disposed, which correspond to ⌈16*10⌉, ⌈32*10⌉, and ⌈64*10⌉ used as the terms of the current values L1 to L3 on each boundary. Thus, the total of ten current sources are disposed in parallel.

The region judging circuit 201 includes a region judging signal output circuit 921. Input terminals of the region judging signal output circuit 921 are each connected to the input terminals 505 and 506 for the upper two bits, and output terminals of the region judging signal output circuit 921 are each connected to four wirings 922 to 925 for outputting controlling signals for the selection of the four regions.

Figure 21:
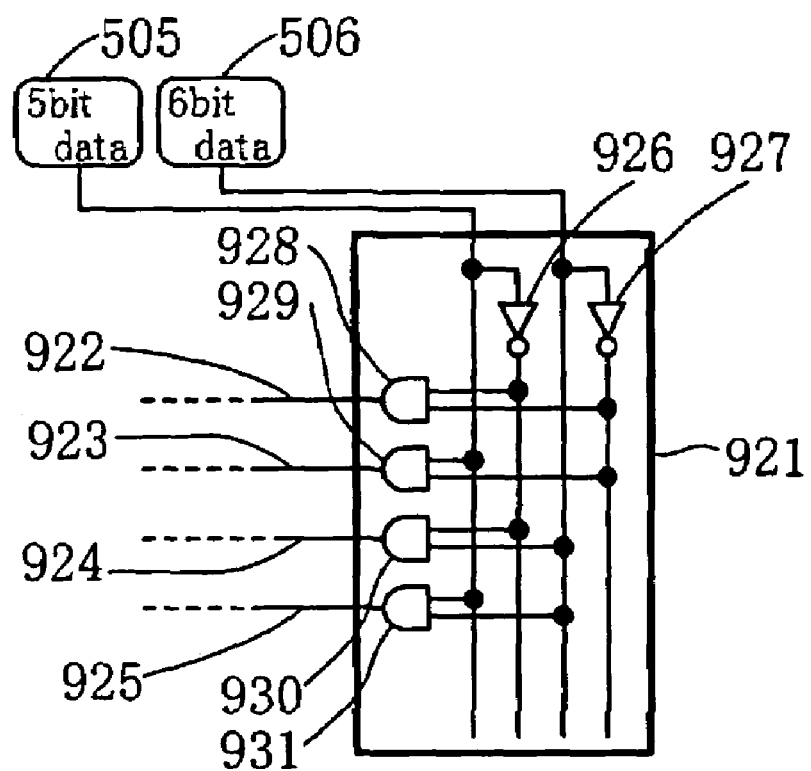
FIG. 21 is a diagram showing a configuration example of a region judging signal output circuit in FIG. 20.

As shown in FIG. 21, the region judging signal output circuit 921 includes two inverters 926 and 927 and four AND circuits 928 to 931. The output terminals of AND circuits 928 to 931 are connected to the wirings 922 to 925 respectively, and the input signal e of the fifth bit and the input signal f of the sixth bit are inverted in the inverters 926 and 927 respectively.

As described above, in the first to fourth regions, a gray scale number corresponding to each region is judged by using [e=0, f=0], [e=1, f=0], [e=0, f=1], and [e×1, f=1]. Therefore, either the signal f or its inverted signal is input to each input terminal of each AND circuit 928 to 931, and either the signal e or its inverted signal is input to the other of the input terminal of each AND circuits 928 to 931. For example, when the gray scale number belongs to the first region, the signals e and f are both 0 (L signal), thus only the AND circuit 928 outputs 1 (H signal), and all the other AND circuits output 0 (L signal). Therefore, 1 (H signal) is output only to the wiring 922 and 0 (L signal) is output to the other wirings 923 to 925. The same applies to the second to fourth regions. In this manner, signals output from the region judging signal output circuit 921 reflect data of the region to which each gray scale number belongs.

The switch group 202 includes as many switch units (941 to 950) as the current sources, and each unit is connected to the input terminal of the different current source. The switch units 941 to 950 output signals which determine whether to flow currents or not by using the input signals a to f from the input terminals 501 to 506 or a signal from the region judging circuit 201, namely signals which are input to the wirings 922 to 925.

Figure 22:
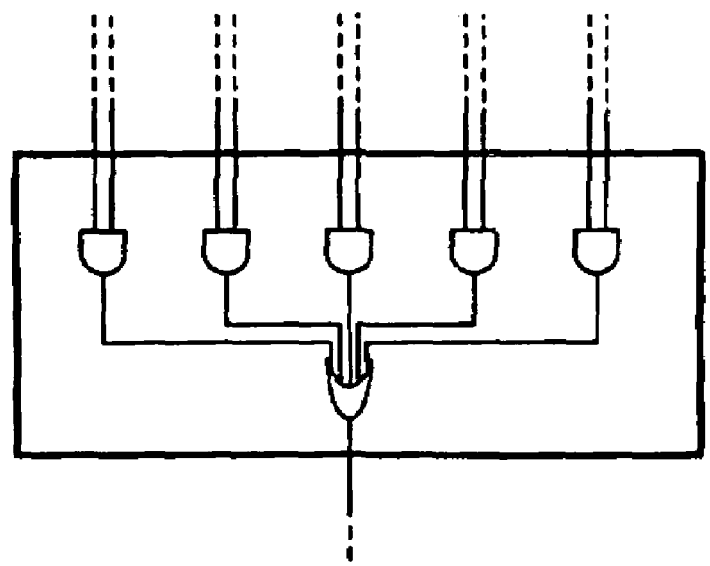
FIG. 22 is a diagram showing a configuration example of a switch unit in FIG. 20.

The configuration example of the switch units 941 to 950 is shown in FIG. 22. Each switch unit 941 to 950 includes a pair of input wirings. The pair of the input wirings is connected to an input terminal of one AND circuit. In each switch unit, one or a plurality of such AND circuits each connected to the pair of the input wirings are disposed in parallel. All the output terminals of the AND circuits are connected to the input terminal of one OR circuit, and an output signal from the OR circuit is connected to the input terminal of one current source corresponding to each switch unit. Accordingly, if at least one of the AND circuits of the switch unit outputs 1 (H signal), the OR circuit outputs 1 (H signal).

FIG. 22 shows the example of disposing five AND circuits, however, the number of AND circuits differs depending on the current source connected to each of the switch units 941 to 950, and the number of regions in which the current sources are used. Also, the pair of the input wirings connected to each AND circuit corresponds to two adjacent wirings on the input side of each switch unit shown in FIG. 20, and they are connected to the input terminals 501 to 506, and the wirings 922 to 925 in the region judging circuit 201.

The current source 906 in which the current value is ⌈10⌉ is used only in the first region. Accordingly, the switch unit 941 which is connected to the current source 906 includes one AND circuit, wherein one input terminal of the input wiring is connected to the input terminal 501 and the other input terminal thereof is connected to the wiring 922. Meanwhile, the current source 901 in which the current value is ⌈2*10⌉ is used in the first and second regions, therefore, the switch unit 942 which is connected to the current source 901 includes two AND circuits. One AND circuit is connected to the input terminal 502 and the wiring 922, and the other AND circuit is connected to the input terminal 501 and the wiring 923. The similar configuration applies to the other switch units 943 to 950.

As described above, in the region judging Circuit 201, the gray scale region is judged by using the input signal e of the fifth bit and the input signal f of the sixth bit of the upper two bits, and in the switch group 202, each switch unit 941 to 950 is controlled according to signals which are output from the region judging circuit 201, thereby selecting an input terminal connected to each current source.

Figure 23:
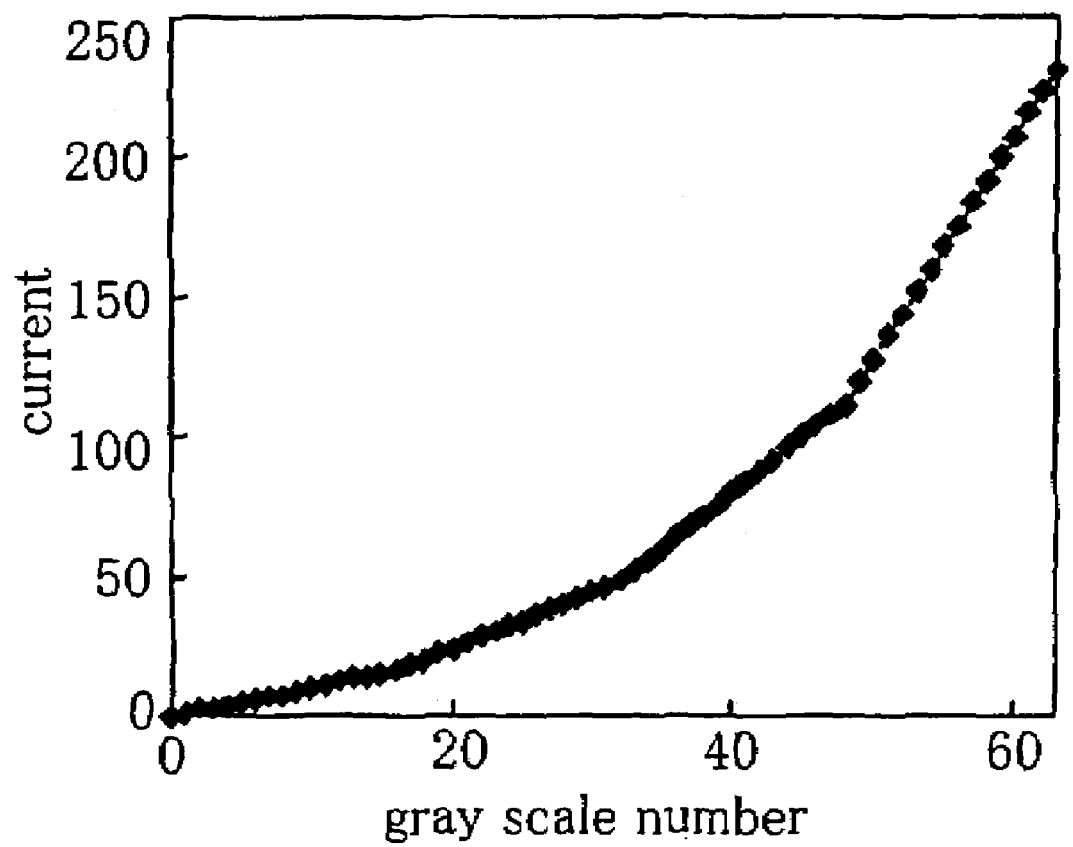
FIG. 23 is a graph showing the relationship between an input (the gray scale number) and an output (the current value) of a digital-analog converter circuit of the invention.

Finally, the result of the digital-analog conversion according to the present embodiment mode is shown in FIG. 23. As seen in the graph showing the relationship between the gray scale number and the current in FIG. 23, the gray scale number is divided into four regions, and the sequential line graph having inclinations each of which is twice as large as that of the preceding region is obtained, thus makes it possible to perform gamma correction.

It should be noted that although the switching circuit 101 shown in FIG. 20 is configured with AND circuits and OR circuits as the digital circuits, the invention is not limited to this. The switching circuit 101 can be configured with various circuits, for example, with other circuits such as a switch, a NAND circuit, a NOR circuit, an inverter circuit, a transfer gate Circuit (analog switch), and a tristate buffer Circuit.

(Embodiment Mode 8)

In Embodiment Modes 3 to 7, the number of regions for dividing the gray scale number and the inclination in each region is fixed. In this embodiment mode, a description is made on an example in which the number of regions for dividing the gray scale number and the inclination in each region are switched.

It should be noted that the description is given, for ease of description, on the case of dividing the gray scale number into two regions in half, and switching the inclination of the graph showing the relationship between the gray scale number and the current in the second half region to be twice or three times as large as that of the first half region.

First, a function showing the relationship between the gray scale number and the current is derived.

In Embodiment Mode 3, an example is given in which a gray scale number is divided into two regions in half, and the inclination of the graph showing the relationship between the gray scale number and the current in the second half region is twice as large as that of the first half region. Meanwhile, in Embodiment 4, an example is given in which a gray scale number is divided into two regions in half, and the inclination of the graph showing the relationship between the gray scale number and the current in the second half region is three times as large as that of the first half region.

Accordingly, in this embodiment mode, the current L that corresponds to the gray scale number in the first half region is expressed by the below equation (12) as in Embodiment Modes 3 and 4.

$$L=a*10+b*2*10+c*4*10+d*8*10+e*16*10 \quad (12)$$

In the second half region, the below equation (13) is satisfied when the inclination is twice as large as that of the first half region, and the below equation (16) is satisfied when the inclination is three times as large as that of the first half region.

$$L=a*2*10+b*4*10+c*8*10+d*16*10+e*32*10+f*32*10 \quad (13)$$

$$L=a*(2*10+10)+b*(4*10+2*10)+c*(8*10+4*10)+d*(16*10+8*10)+e*(32*10+16*10)+32*10 \quad (16)$$

Figure 24:
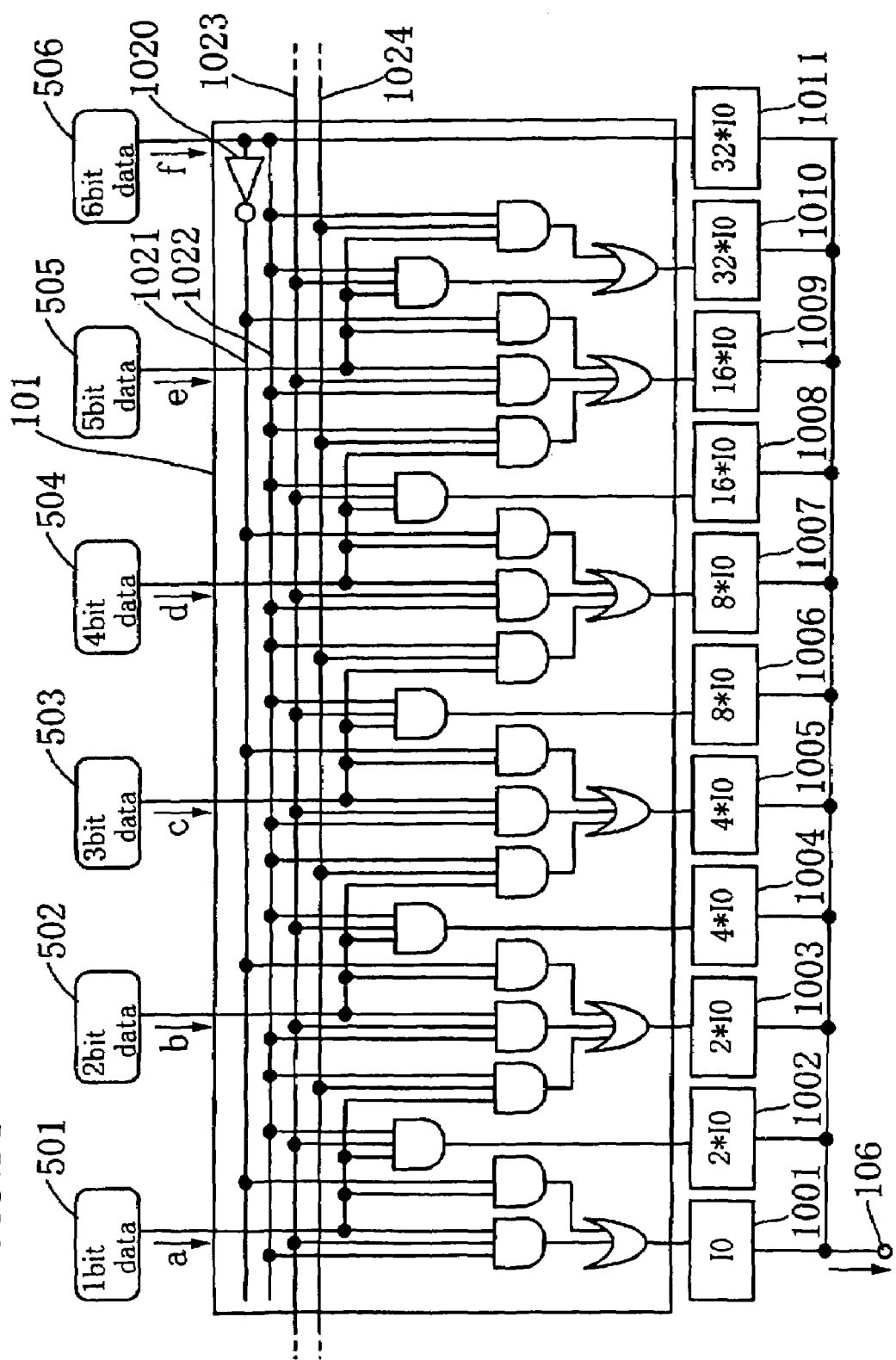
FIG. 24 is a circuit diagram of a digital-analog converter circuit of the invention.

FIG. 24 shows a digital-analog converter circuit in this embodiment mode.

In this embodiment mode, two current values are set corresponding to the gray scale number which belongs to the second half region. The switching circuit in this embodiment mode may be configured so as to switch the operation of the switching circuit 101 in Embodiment Mode 3 and the operation of the switching circuit 101 in Embodiment 4 depending on circumstances.

When comparing the proportional coefficients in the equations (12), (13), and (16) to each other, the proportional coefficients in the equations (12) and (13) are all included in those in the equation (16). Accordingly, the total of 11 current sources 1001 to 1011 are disposed in parallel corresponding to all the proportional coefficients in the equation (16) in FIG. 24.

The switching circuit 101 includes an inverter 1020 and four wirings 1021 to 1024 to judge the gray scale region. The input terminal of the inverter 1020 is connected to the input terminal 506 and the output terminal thereof is connected to the wiring 1021. Also, the signal f from the input terminal 506 is input to the wiring 1022. According to signals which are input to the wirings 1021 and 1022, it is determined to which of the first or the second half gray scale region the gray scale number belongs.

Then, from the outside of the switching circuit 101, signals for determining the inclination of the graph showing relationship between the gray scale number and the current in the second half gray scale region are output to the wirings 1023 and 1024. Here, when the signal input to the wiring 1023 is 1 (H signal) and the signal input to the wiring 1024 is 0 (L signal), the inclination of the graph is made third as large as that of the first half region, and when the signal input to the wiring 1023 is 0(L signal) and the signal input to the wiring 1024 is 1(H signal), the inclination of the graph is made twice as large as that of the first half region. The signal input to the wirings 1023 and 1024 is just an example of the control signal 204 in FIG. 2.

In the circuit shown in FIG. 24, the total of 10 switch units each including an AND circuit and an OR circuit are disposed corresponding to 11 current sources. A current source 1001 is connected to a switch unit including two AND circuits and one OR circuit, current sources 1002, 1004, 1006, and 1008 are connected to switch units each including one AND circuit, and current sources 1003, 1005, 1007, and 1009 are connected to switch units each including three AND circuits and one OR circuit.

Signals which are input to wirings 1021 to 1024 reflect the data of the region to which the gray scale number belongs and the inclination of a graph. In accordance with the signals from the wirings 1021 to 1024, the switch units are controlled respectively and current sources to be connected to the input terminals 501 to 506 are selected.

The detailed description of the operation of the switching circuit shown in FIG. 24 is omitted here as it is similar to those of Embodiment Modes 3 and 4. When the signal f is 0 (L signal), the gray scale number belongs to a first half region, thus the signals a to c from each input terminal 501 to 505 are input to the current sources through the AND circuits connected to the wiring 1021. At this time, the current value output from the output terminal 106 satisfies the equation (12).

Meanwhile, when the signal f is 1 (H signal), a signal of the wiring 1023 is 0 (L signal), and a signal of the wiring 1024 is 1 (H signal), the signals a to c from each input terminal 501 to 505 are input to the current sources 1003, 1005, 1007, 1009, and 1010 through the AND circuits connected to the wirings 1022 and 1024, and the current value output from the output terminal 106 satisfies the equation (13).

Also, when the signal f is 1 (H signal), a signal of the wiring 1023 is 1 (signal), and a signal of the wiring 1024 is 0 (L signal), the signals a to e from each input terminal 501 to 505 are input to current sources (1001, 1002), (1003, 1004), (1005, 1006), (1007, 1008), and (1009, 1010) through the AND circuits connected to the wirings 1022 and 1023, and the current value output from the output terminal 106 satisfies the equation (16).

By adopting the above-described configuration, it becomes possible to switch the inclination of a graph. Although this embodiment mode employs a graph in which the gray scale number is divided into two regions in half and the inclination of the graph showing the relationship between the gray scale number and current in the second half region is switched to be twice or three times as large as that of the first half region, the invention is not limited to this. The number of divided region of the gray scale number may be changed or both of the inclination of the graph and the dividing number may be changed. The inclination of the graph may also be changed, not only two kinds as the twice and three times.

It should be noted that although the switching circuit 101 shown in FIG. 24 is configured with AND circuits and OR circuits as the digital circuits, the invention is not limited to this. The switching circuit 101 can be configured with various circuits, for example, with other circuits such as a switch, a NAND circuit, a NOR circuit, an inverter circuit, a transfer gate circuit (analog switch), and a tristate buffer circuit.

As described above in Embodiment Modes 3 to 8, the region to which the gray scale number of an input signal belongs is determined by giving attention to the input signal f of the most significant bit as the sixth bit or the signals e and f of the upper two bit as the fifth and sixth bits, however, the invention is not limited to this. It is also possible to employ an alternative method to judge to which gray scale region the input signal belongs.

The number and size of current sources, the number of switches, the number of divided regions of the gray scale number, the inclination of the graph in each region, the digit for expressing the number, the number of input bits, the number of input terminals, and the like are not limited to the ones shown in Embodiment Modes 3 to 8, and they can be modified based on the concept of each Embodiment Mode.

(Embodiment Mode 9)

In this Embodiment Mode, the specific configuration of the current source shown in Embodiment Modes 3 to 8 is described.

Figure 32:
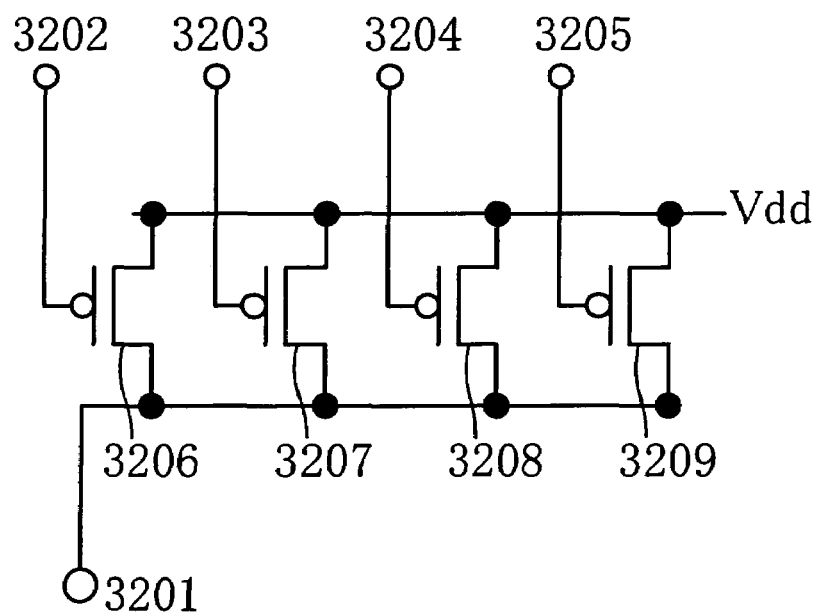
FIG. 32 is a configuration diagram of a conventional digital-analog converter circuit.

The simplest configuration of the current source is shown in FIG. 32 which is previously described. In FIG. 32, all the voltages applied to the gate terminal of each transistor have the binary value. To change the current value flowing in each transistor, the transistor size (the gate length L and the gate width W etc.) is adjusted.

Figure 25:
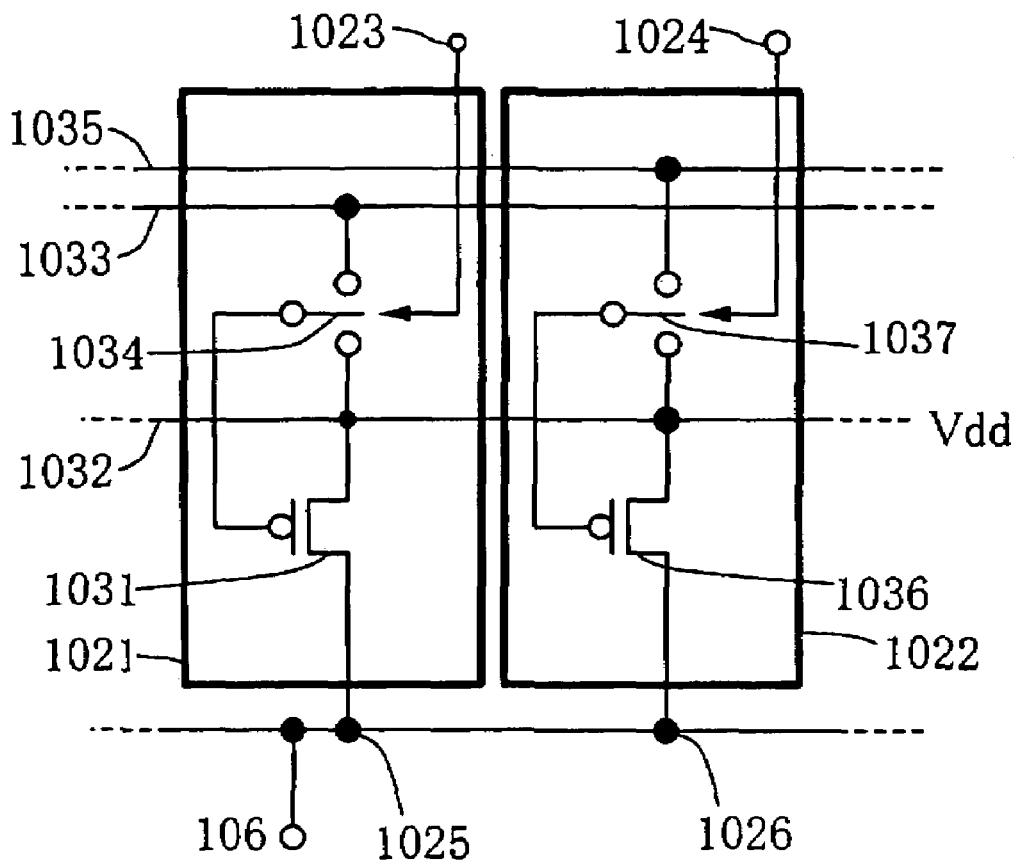
FIG. 25 is a diagram showing a configuration example of a current source of the invention.

Hereupon, an example of the current source in which a voltage applied to the gate terminal of each transistor is different from each other is shown in FIG. 25 as a different configuration from that shown in FIG. 32. In FIG. 25, two current sources 1021 and 1022 are disposed in parallel to each other for ease of description.

An input terminal 1023 and an input terminal 1024 of the current source 1021 and current source 1022 are input with a voltage signal from the switching circuit 101 as described above, and output terminals 1025 and 1026 are each connected to the output terminal 106.

The source terminal of the transistor 1031 in the current source 1021 is connected to a wiring 1032 which is connected to a power supply on the high voltage side, and the drain terminal thereof is connected to the output terminal 1025. Either a voltage Vdd which is equal to that of the source terminal or a voltage which is supplied to the wiring 1033 is applied to the gate terminal. Meanwhile, the current source 1022 has a similar configuration as that of the current source 1021, and either a voltage Vdd which is equal to that of the source terminal or a voltage which is supplied to the wiring 1035 is applied to the gate terminal of the transistor 1036.

The voltages of the gate terminals of the transistors 1031 and 1036 are each controlled depending on the connection states of the switches 1034 and 1037, and the switches 1034 and 1037 are each controlled by signals which are input from the input terminals 1023 and 1024. When currents are output from the current sources 1021 and 1022, the gate terminals of the transistors 1031 and 1036 are connected to the wiring 1033 and 1035 respectively. When no current is output, each gate terminal is connected to the wiring 1032.

When the voltages in the wirings 1033 and 1035 differ from each other, voltages applied to the gate terminals of the transistors 1031 and 1036 also differ from each other when current flows. As a result, the currents output from the transistors 1031 and 1036 have different current values, thus it becomes possible to control the current value output from the current sources 1021 and 1022. The transistor size (the channel length and the channel width etc.) of the transistors 1031 and 1036 may be either the same or different.

Figure 26:
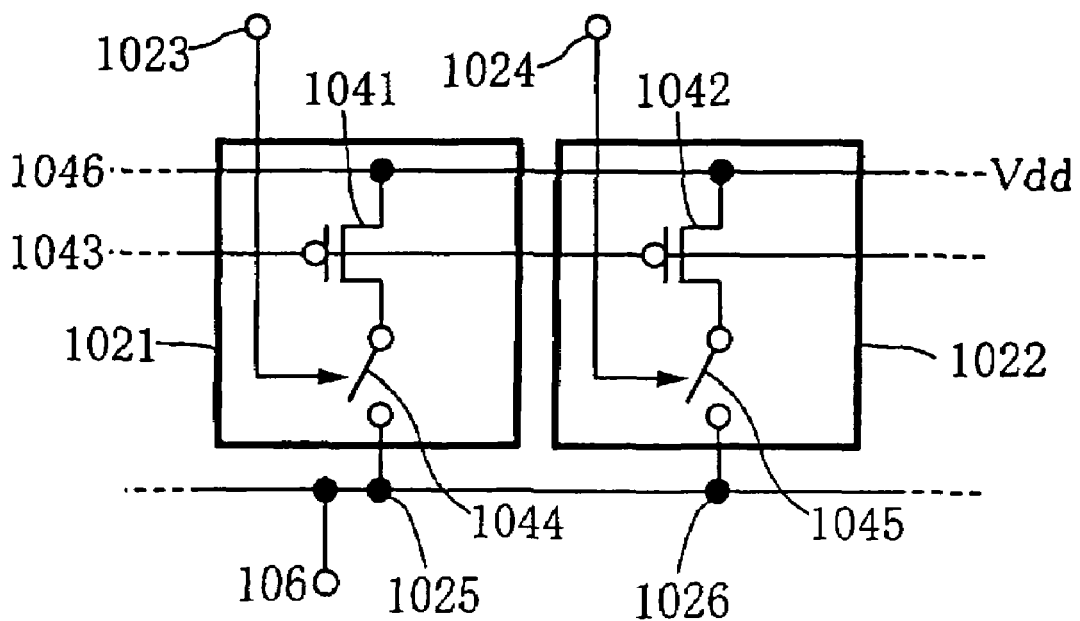
FIG. 26 is a diagram showing a configuration example of a current source of the invention.

In this manner, in each of the current sources shown in FIGS. 32 and 25, by controlling a voltage applied to the gate terminal of the transistor, it is switched that a current is finally output from an output terminal of the current source or not. FIG. 26 shows current sources in which whether a current is output or not output from the output terminal of the current source is switched by an alternative method.

In FIG. 26, the gate terminals of transistors 1041 and 1042 in each current source 1021 and 1022 are connected to the same wiring 1043, the drain terminals thereof are connected in series to switches 1044 and 1045 respectively, and the source terminals thereof are connected to a wiring 1046 which is connected to a power supply Vdd on the high voltage side.

The switches 1044 and 1045 are controlled by signals which are input from the input terminals 1023 and 1024 from the switching circuit 101 respectively.

Voltages applied to the gate terminals of the transistors 1041 and 1042 have nothing to do with the selection to output a current or not from the output terminals 1025 and 1026. The selection to output a current or not from the output terminals 1025 and 1026 is controlled by turning ON/OFF the switches 1044 and 1045 connected in series to the transistor 1041 and 1042 respectively.

The switches 1044 and 1045 connected in series to the transistors 1041 and 1042 respectively may be disposed in any location as long as they can block the current flowing from the transistors 1041 and 1042 to the output terminals 1025 and 1026.

Although the same voltage is applied to the gate terminals of the transistors 1041 and 1042 in two current sources 1021 and 1022 in FIG. 26, the invention is not limited to this. A different voltage may be applied to each transistor. When the same voltage is applied to each gate terminal, the size of each transistor (the channel length and the channel width etc.) needs to be changed according to the current value to be output from the output terminal. When applying different voltages to each gate terminal, each transistor size may be the either the same or different.

The current sources shown in FIGS. 32, 25, and 26 output a predetermined value of currents by applying a voltage to the gate terminal of each transistor externally from the current sources. However, when transistor characteristics (threshold voltage or mobility etc.) and the transistor size (the channel length and the channel width etc.) and the like vary, the current value flowing from the transistors varies as well.

Figure 27:
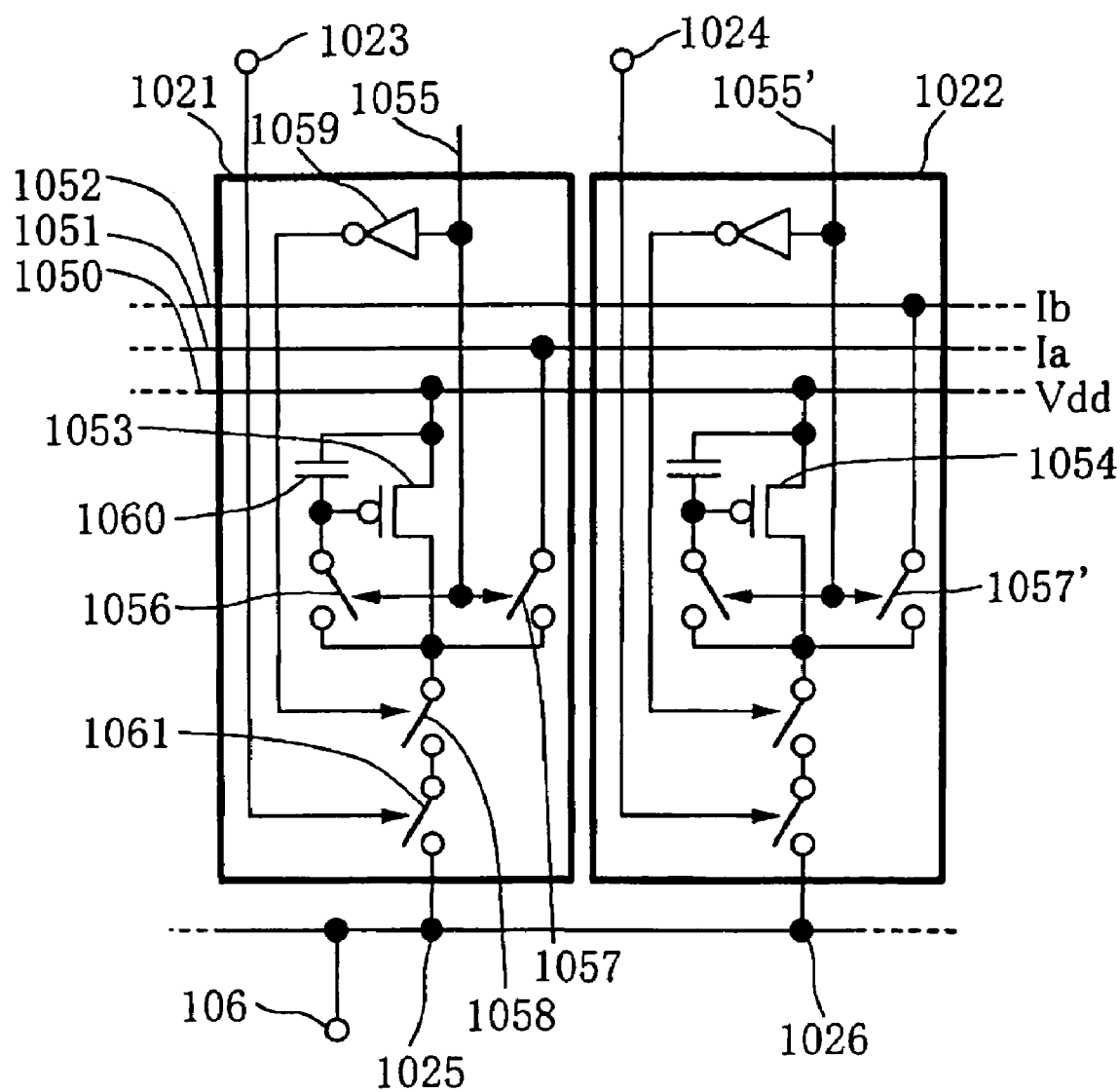
FIG. 27 is a diagram showing a configuration example of a current source of the invention.

Hereupon, a current source which outputs current having a proportional value to a current supplied externally to a transistor may be favorably employed, not by applying a voltage to the gate terminal from outside of the current source. FIG. 27 shows the configuration of such current sources.

As shown in FIG. 27, a wiring 1050 is connected to the current supply Vdd on the high voltage side and wirings 1051 and 1052 are connected to current sources (not shown) for supplying the predetermined value of currents Ia and Ib respectively.

In the current source 1021, when the current Ia is input to a transistor 1053 from a wiring 1051, the transistor 1053 can flow a current as large as the current Ia which is input from the wiring 1051. Similarly, in the current source 1022, the transistor 1054 can flow a current as large as the current Ib which is input from the wiring 1052. Each of the transistors 1053 and 1054 is a P-channel transistor.

The operation of the current source 1021 shown in FIG. 27 is described now.

First, switches 1056 and 1057 are turned ON and a switch 1058 is turned OFF by controlling a voltage of a wiring 1055. The operation of the switch 1056 and that of the switch 1057 are opposite to each other as the switch 1058 is controlled by an inverted signal that corresponds to a signal of the wiring 1055 inverted in an inverter 1059. Then, charges are accumulated in a storage capacitor 1060 connected between the gate and source of the transistor 1053 from the wiring 1051 through the switches 1056 and 1057.

When it comes to the steady state, the current Ia supplied to the wiring 1051 and a current flowing between the source and drain of the transistor 1053 become equal to each other, thus no current flows in the storage capacitor 1060. As a result, because of the accumulated charge, the voltage of the storage capacitor 1060 has a value enough to flow a current as large as Ia between the source and drain of the transistor 1053. This operation is referred to as a setting operation.

Next, the switches 1056 and 1057 are turned OFF and the switch 1058 is turned ON by controlling a voltage of the wiring 1055. Then, the charges that have been accumulated during the setting operation are stored in the storage capacitor 1060. According to the stored charges, the gate terminal of the transistor 1053 stores a voltage enough to flow a current as large as the current Ia which is supplied to the wiring 1051 between the source and drain of the transistor 1053.

Next, ON/OFF of a switch 1061 is switched according to a signal which is input from the input terminal 1023 to select whether to flow a current flowing in the transistor 1053 to the output terminal 1025 or not. This operation is referred to as a normal operation. When the switch 1061 is turned ON, a current flowing between the source and drain of the transistor 1053 is output to the output terminal 1025. The output current value is Ia. That is, a current as large as the current Ia which is supplied to the wiring 1051 from the current source 1021 can be output from the current source 1021.

The current source 1022 has a similar configuration as the current source 1021 in FIG. 27 although some of the reference numerals are omitted. What is different is that a switch 1057' is connected to the wiring 1052. The current source 1022 operates in the same manner as the current source 1021, and the setting operation and normal operation are performed by using a signal which is input from the input terminal 1024 and the wiring 1055'. Also, a current as large as the current Ib which is supplied to the wiring 1052 is output to the output terminal 1026.

By operating the current sources as described above, variations in transistor characteristics, the transistor size, and the like can be reduced.

It should be noted that the configuration and ON/OFF operation of the switches 1056 to 1058 are not limited to the ones shown in FIG. 27. An alternative configuration and ON/OFF operation can be employed as long as the similar operation can be performed.

In the current sources shown in FIG. 27, the same transistors (transistors 1053 and 1054) are used both in the setting operation and the normal operation. However, the invention is not limited to this and different transistors may be employed for each of the setting operation and the normal operation so as to configure a current mirror circuit. Alternatively, some of the transistors may be doubled for a part of these operations while employing other transistors for the other part of the operations.

It is also possible to employ a plurality of transistors to operate as a current source in each of the current sources 1021 and 1022. For example, two transistors to operate as a current source may be employed, whereby one of the transistors performs the setting operation and the other transistor performs the normal operation. These functions may be switched as well. Accordingly, the setting operation and the normal operation can be performed at the same time.

The data between the gate and source of the transistor 1053 and that of the transistor 1054 may be used in common in the current sources by keeping the gate potentials at the same value by connecting the gate electrode of the transistor 1053 to that of the transistor 1054 and the like.

Although the transistors 1053 and 1054 are P-channel transistors in FIG. 27, N-channel transistors can be employed as well. In that case, the connection of the switch 1056 may be changed by connecting the storage capacitor 1060 between the gate and source of the transistor.

Although FIGS. 32, 25, 26 and 27 each employs a method in which currents are output from the current sources 1021 and 1022 to the external part, the invention is not limited to this. In the case where currents flow into the current sources 1021 and 1022 from outside as well, the invention can be easily employed by changing the polarity of the transistors and potentials of the wirings and the like.

It is needless to mention that the configuration of the current sources used in a semiconductor device of the invention for performing gamma correction is not limited to the one shown in this embodiment mode. Various known configurations of a current source can be employed by using an operational amplifier and the like. For example, the international publication WO03/038793, WO03/038794, WO03/038795, WO03/038796, WO03/038797, and the like disclose a current source circuit in the case where a current flows in the different direction, the polarity of a transistor as a current source is different, potentials of the wirings are modified, the switch configuration is different, and the like. These cases can all be applied to the invention.

(Embodiment Mode 10)

Described in this embodiment mode is an example in which a circuit of the invention is applied to a part of a signal line driver circuit of a display device.

Figure 28:
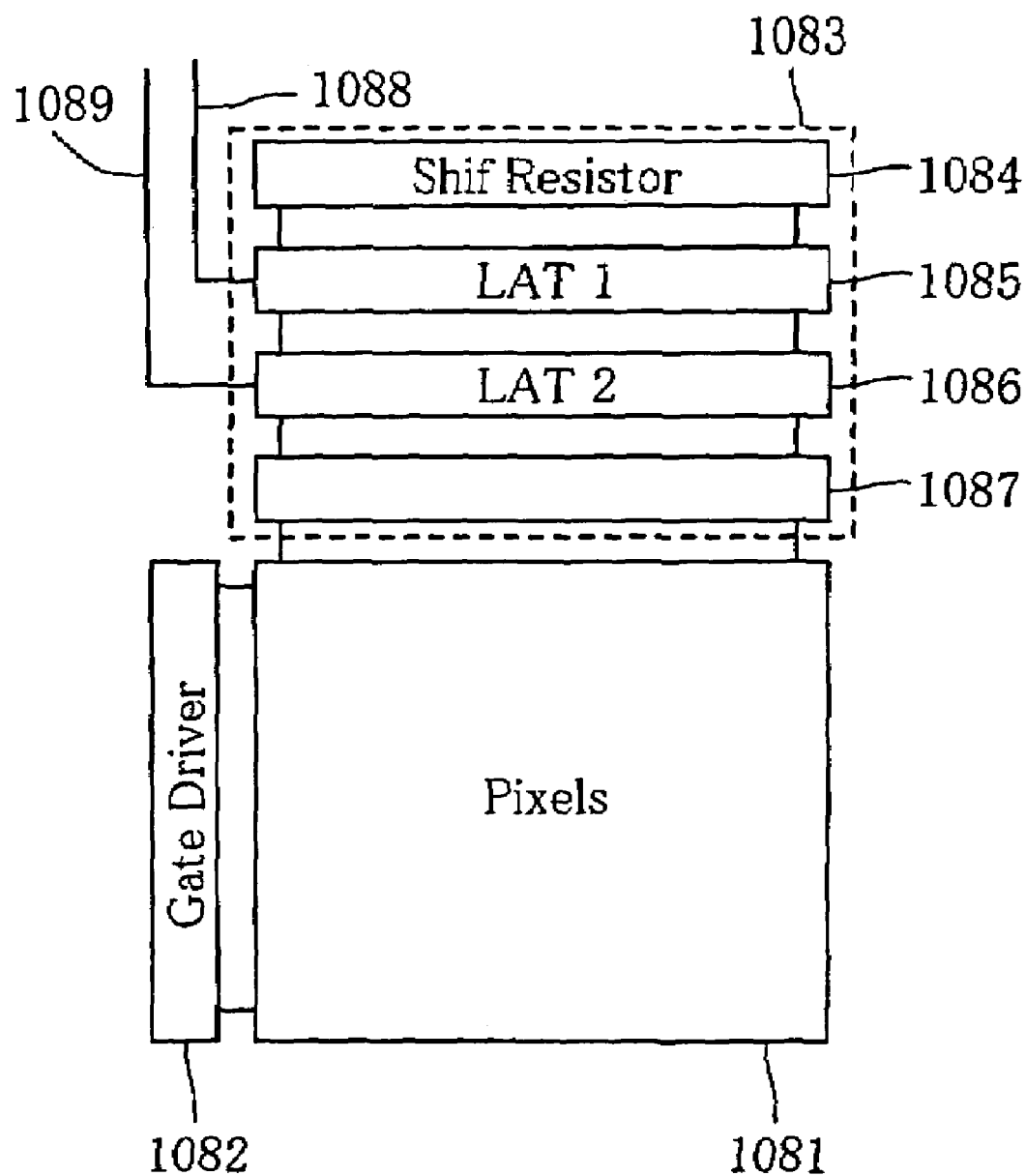
FIG. 28 is a block diagram showing the configuration of a display device of the invention.

The display device of the invention includes an EL (Electro Luminescence) display, an FED (Field Emission Display), and the like. As shown in FIG. 28, the display device includes a pixel portion 1081 including a plurality of pixels, a gate line driver circuit 1082, and a signal line driver circuit 1083. The gate line driver circuit 1082 sequentially outputs selection signals to the pixel portion 1081. The signal line driver circuit 1083 sequentially outputs video signals to the pixel portion 1081. The pixel portion 1081 displays an image by controlling the luminance according to the video signal. The video signal input to the pixel portion 1081 from the signal line driver circuit 1083 is a current. That is, the states of a display element disposed in each pixel and an element for controlling the display element are changed according to the video signal (current) which is input to the signal line driver circuit 1083. The display element disposed in the pixel 1081 is typified by an organic EL element or an EL element containing both of inorganic and organic ELs, and the like.

The number of the gate line driver circuit 1082 and the signal line driver circuit 1083 may be more than one.

The signal line driver circuit 1083 can be divided into a plurality of circuits, for example, into a shift register 1084, a first latch circuit (LAT1) 1085, a second latch circuit (LAT2) 1086, and a digital-analog converter circuit 1087. The digital-analog converter circuit 1087 has a function for converting voltage into current and a gamma correction function. That is, the digital-analog converter circuit 1087 can employ the circuit of the invention.

The operation of the signal line driver circuit 1083 is described in brief below. The shift register 1084 includes a plurality of lines of flip flop circuits (FF) and it is input a clock signal (S-CLK), a start pulse (SP), and an inverted clock signal (S-CLKb). In accordance with the liming of these signals, sampling pulses are sequentially output.

A sampling pulse which is output from the shift register 1084 is input to the first latch circuit 1085. The first latch circuit 1085 is input with a video signal from a video signal line 1088 and it stores the video signal in accordance with the timing at which the sampling pulse is input in each line. A video signal input from the video signal line 1088 has a digital value as the digital-analog converter circuit 1087 is disposed in the circuit. The video signal at this stage is generally a voltage signal.

When the video signal storage is completed up to the last line in the first latch circuit 1085, a latch pulse (Latch Pulse) is input from a latch control line 1089 during a horizontal fly-back period and the video signals stored in the first latch circuit 1085 are transferred to the second latch circuit 1086 all at once, and then stored. Subsequently, one row of the video signals stored in the second latch circuit 1086 is simultaneously input to the digital-analog converter circuit 1087. Then, the signals which are output from the digital-analog converter circuit 1087 are input to the pixel portion 1081.

While the video signals stored in the second latch circuit 1086 are input to the digital-analog converter circuit 1087 and to the pixel portion 1081, a sampling pulse is again output to the first latch circuit 1086. That is, two operations are performed at the same time. Accordingly, a line sequential drive is enabled. This operation is repeated in this manner.

Figure 29:
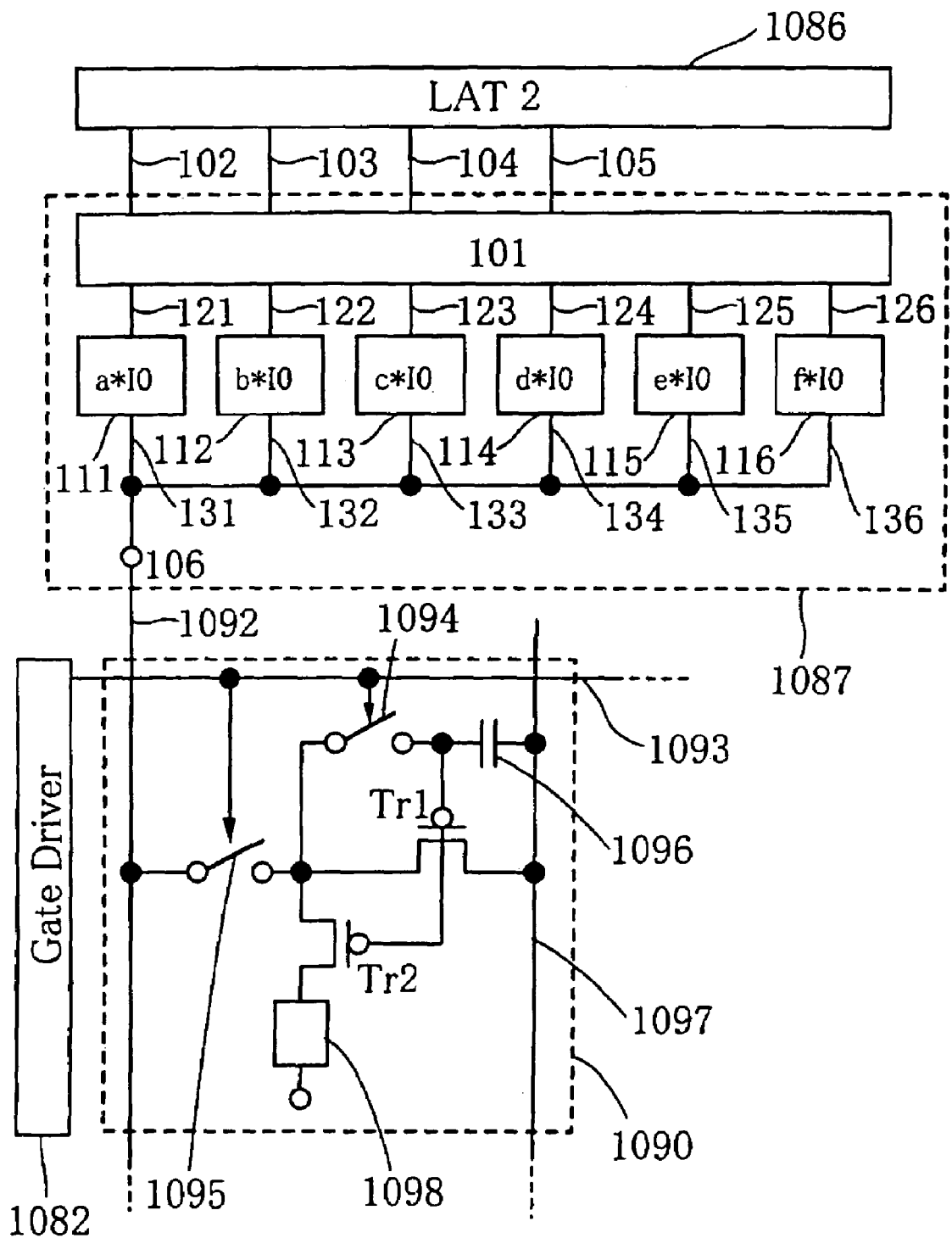
FIG. 29 is a diagram showing the connection between a digital-analog converter circuit and a pixel in the display device in FIG. 28.

FIG. 29 shows the connection between the digital-analog converter circuit 1087 and the pixel portion 1081 shown in FIG. 28. One line of the digital-analog converter circuit 1087 and one pixel 1090 in the pixel portion 1081 are shown here for ease of description.

A signal (voltage) output from the second latch circuit 1086 is input to the digital-analog converter circuit 1087. In the digital-analog converter circuit 1087, a digital signal is converted into an analog signal and a voltage signal is converted into a current signal as well as gamma correction, thus an analog current is output to the output terminal 106 at the end.

The output terminal 106 is connected to a signal line 1092 of the pixel portion 1081. The signal line 1092 is connected to the pixel 1090. The signal line 1092 is connected to one pixel 1090 and the gate signal line 1093 is connected to one pixel 1090 in FIG. 29 for simplicity, while in the pixel portion 1081 in FIG. 28, one signal line 1092 is connected to a plurality of the pixels 1090 and one gate signal line 1093 is also connected to a plurality of the pixels 1090. Also, a plurality of the signal lines 1092 and the gate signal lines 1093 are disposed and a plurality of the pixels 1090 are disposed in matrix in the pixel portion 1081. The pixel 1090 includes two transistors: a selection transistor Tr1 and a driving transistor Tr2.

The operation of the pixel 1090 is as follows.

A signal (analog current) input to the signal line 1092 has a value corresponding to an image to be displayed in the pixel, namely the gray scale number, thus gamma correction is performed.

First, when switches 1094 and 1095 are turned ON by controlling the gate signal line 1093, charges are stored in a storage capacitor 1096. One terminal of the storage capacitor 1096 is connected to the gate of the transistor Tr1 and the other terminal is connected to a wiring 1097 which is supplied with a predetermined value of voltage.

Subsequently, when the switches 1094 and 1095 are turned OFF by controlling the gate signal line 1093, current flows into a display element 1096. The value of a signal (analog current) which is input to the signal line 1092 has a correlation with the current flowing to an element 1098. In the case of the pixel 1090, a current having a proportional value to the signal (analog current) which is input to the signal line 1092 flows into the display element 1098.

Since gamma correction is performed for a signal (analog current) which is input to the pixel 1090, it is performed for the current flowing to the display element 1098 as well. Accordingly, the gamma correction is performed for the luminance of the display element 1098.

It should be noted that, the pixel 1090 shown in FIG. 29 is only an example, and the invention is not limited to this. Any pixel configuration in which a current is input from the signal line 1092, namely a current input type pixel may be employed. For example, when a current is supplied to a current source circuit disposed in a pixel by using a signal current input to the pixel, and the current is then supplied to a display element such as an EL element disposed in the pixel from the current source circuit, a unit for converting a signal current into a voltage (hereinafter referred to as a converter unit) and a unit for supplying a current to a display element by using the converted voltage, namely a unit for driving a display element (hereinafter referred to as a driver unit) may be integrated or provided independently. When each of the converter unit and the driver unit is independent, the circuit is called a current mirror circuit generally. On the other hand, when the converter unit and the driver unit are integrated, (hereinafter referred to as a converter driver unit) another driver unit may be additionally disposed. In this case, current is supplied to a display element such as an EL element by the driver unit and the converter driver unit. In some cases, the converter unit and the converter driver unit are disposed. In such a case, a signal current is converted into a voltage in the converter unit and the converter driver unit. The channel length L and the channel width W of the transistor in the current source circuit may be different in the case where a signal current is supplied (a current is converted into a voltage) and the case where a current is supplied to the display element.

For example, in the pixel shown in FIG. 29, when a current is supplied to the display element, the transistors Tr1 and Tr2 function as a multi-gate transistor. When a signal is input to the pixel, the transistor Tr2 is turned OFF while the transistor Tr1 is input with a current. Accordingly, when a current is supplied to the display element, the channel length L becomes long in appearance, thus the current flowing in the display element becomes smaller than the signal current. Thus, the value of the signal current is increased and the writing speed of the signal is improved.

Also, the current source circuit may be configured such that the polarity of the transistor as a current source circuit is inversed, the direction in which the signal current flows is inversed, or the switch configuration is changed.

The detailed description of them is disclosed, for example, in Japanese Patent Application No. 2002-274680, Japanese Patent Laid-Open No. 2003-177710, and Japanese Patent Laid-Open No. 2003-177712, and such configurations can be adopted as well.

The signal input to the pixel portion 1081 is not limited to current. Alternatively, voltage may be supplied before and after current is supplied or current and voltage may be supplied at the same time. Also, although the digital-analog converter circuit 1087 of this embodiment mode is disposed with current sources, the configuration of the current source circuit is not limited to this as long as it can achieve the desired function.

For example, it is possible to switch a current source every certain period as disclosed in Japanese Patent Laid-Open No. 2003-255880, not by supplying a current to a signal line in each line by using the same current source at all times. For example, a current may be supplied to a signal line in the i-th line by using a current source circuit disposed in a signal line in the (i−1)-th line in a period, and by using a current source circuit disposed in a signal line in the i-th line in the other period, and further by using a current source circuit disposed in a signal line in the (i+1)-th line in the other period. Needless to say, the current source as described in Embodiment Mode 9 may be used as well. In the case of using the circuit shown in FIG. 27, the setting operation is required to be performed by inputting a current to the current source. In that case, a special driver circuit (shift register etc.) may be disposed for controlling the setting operation. Alternatively, the setting operation of the current source circuit may be controlled by using a signal for controlling the LAT 1 circuit which is output from a shift register. That is, both of the LAT1 circuit and the current source circuit may be controlled by one shift register. In such a case, the signal for controlling the LAT1 circuit which is output from the shift register may directly be input to the current source circuit or the current source circuit may be controlled through a circuit for switching the control of the LAT1 circuit or the control of the current source circuit. Alternatively, the setting operation of the current source circuit may be controlled by using a signal which is output from the LAT 2 circuit. A signal which is output from the LAT 2 circuit is generally a video signal. Therefore, the current source circuit may be controlled through a circuit for switching the use of the video signal whether to be used as a video signal or to be used for controlling the current source circuit.

The circuit configuration and operation for controlling the setting operation and the normal operation in the case of using the current source as shown in FIG. 27 and the like are disclosed in the international publication WO03/038793, WO03/038794, WO03/038795, WO03/038796, WO03/038797, and the like and they can be applied to the invention.

Although the luminance of the display element 1096 is controlled by using a signal (analog current) input from the signal line 1092, the invention is not limited to this. Not only a signal (analog current) input from the signal line 1092, but also other methods to combine with can be employed to control the luminance of the display element 1098. That is, the luminance may be controlled by combining with the time gray scale method by changing the display period of the display element 1098 or combining with the area gray scale method by changing the display area of the display element 1098. Both of the lime gray scale method and the area gray scale method may be combined as well.

It should be noted that described heretofore is the case of converting a gray scale number into a current value. The output current value is equal to the value of the total current from each current source according to the current rule of Kirchhoff. Accordingly, physical value other than current can also be employed as long as the total physical value of each matter is equal to the whole physical value.

For example, when the gray scale is controlled by using time gray scale method, the total light emitting time of each display element corresponds to the gray scale number, which means the light emitting time and the gray scale number have a correlation to each other. Accordingly, the invention can be applied by replacing current with time.

Similarly, when the gray scale is controlled by using area gray scale method, the total light emitting area of each display element corresponds to the gray scale number, which means the light emitting area and the gray scale number have a correlation. Accordingly, the invention can be applied by replacing current with light emitting area.

Similarly, the invention can be applied to the case where the time gray scale and the area gray scale are combined.

This embodiment mode can be freely combined with Embodiment Modes 1 to 9. The configuration of the display device of the invention is not limited to the one shown in the block diagram in FIG. 28. Any configuration employing the digital-analog converter circuit of the invention can be employed.

In addition, the types of the transistor and the substrate used in the invention are not limited as described above.

Accordingly, it is possible to form the whole circuit in FIG. 28 on a glass substrate, a plastic substrate, a single crystal substrate, or an SOI substrate. Incidentally, not all part of the circuit shown in FIG. 28 is necessarily formed on the same substrate and a part of the circuit may be formed on a different substrate. For example, in FIG. 28, the pixel 1081 and the gate line driver circuit 1082 may be formed with thin film transistors on a glass substrate and the signal line driver circuit 1083 may be all or partially formed on a single crystal substrate as an integrated circuit, thereby connecting the IC chip onto the other circuit on the glass substrate with COG(Chip On Glass) bonding. In place of COG bonding, TAB (Tape Auto Bonding), a print substrate and the like may be used to connect the IC chip onto the other circuit on the glass substrate.

(Embodiment Mode 11)

Electronic apparatuses using the invention include a video camera, a digital camera, a goggle type display (head mounted display), a navigation system, a sound reproducing device (a car audio equipment and an audio set etc.), a laptop personal computer, a game machine, a portable information device (a mobile computer, a cellular phone, a portable game machine, and an electronic book etc.), an image reproducing device including a recording medium (more specifically, a device which can reproduce a recording medium such as a digital versatile disc (DVD), and which includes a display for displaying the reproduced image), or the like. Specific examples of these electronic apparatuses are shown in FIGS. 30A to 30H.

Figure 30A:
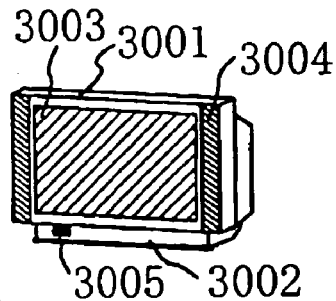
FIGS. 30A to 30H are views showing electronic apparatuses to which the invention is applied.
Figure 30:
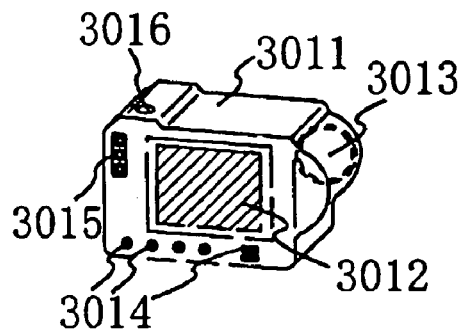
Figure 30:
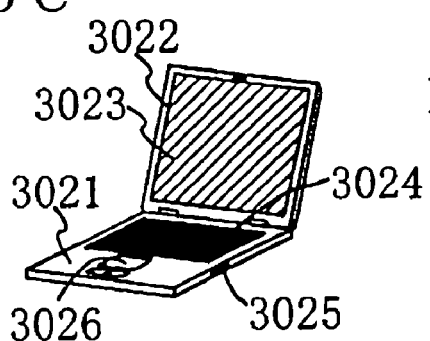
Figure 30:
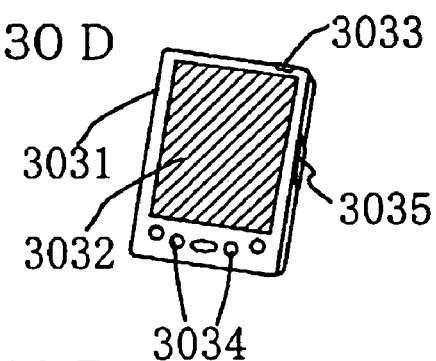
Figure 30:
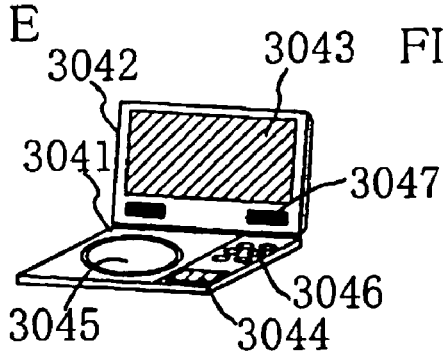
Figure 30:
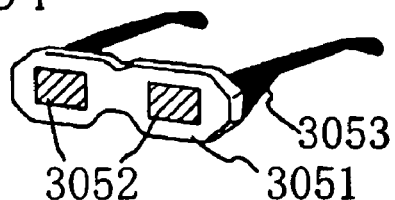
Figure 30:
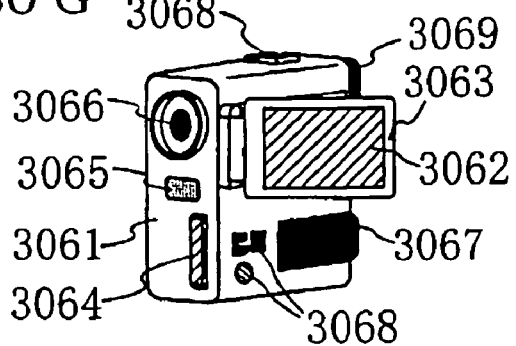
Figure 30:
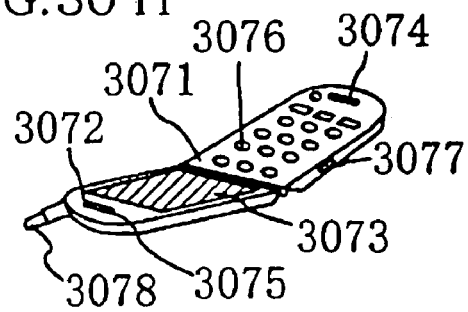

FIG. 30A is a light emitting device, which includes a housing 3001, a support base 3002, a display portion 3003, a speaker portion 3004, a video input terminal 3005 and the like. The invention can be applied to an electric circuit configuring the display portion 3003. The light emitting device shown in FIG. 30A is completed by the invention. Since a light emitting device emits light by itself and does not require a back light, it can have a thinner display portion than a liquid crystal display. Note that the display device includes all the information display devices for personal computers, television broadcast reception, advertisement displays and the like.

FIG. 30B is a digital still camera, which includes a main body 3011, a display portion 3012, an image receiving portion 3013, operating keys 3014, an external correction port 3015, a shutter 3016 and the like. The invention can be applied to an electric circuit configuring the display portion 3012.

FIG. 30C is a laptop personal computer, which includes a main body 3021, a housing 3022, a display portion 3023, a key board 3024, an external connection port 3025, a pointing mouse 3206 and the like. The invention can be applied to an electric circuit configuring the display portion 3023.

FIG. 30D is a mobile computer, which includes a main body 3031, a display portion 3032, a switch 3033, operating keys 3034, an infrared port 3035 and the like. The invention can be applied to an electric circuit configuring the display portion 3032.

FIG. 30E is a portable image reproducing device provided with a recording medium (specifically, a DVD reproducing device), which includes a main body 3041, a housing 3042, a display portion A 3043, a display portion B 3044, a recording medium (such as a DVD) read-in portion 3045, an operating key 3046, a speaker portion 3047 and the like. The display portion A 3043 mainly displays image data and the display portion B 3044 mainly displays text data. The invention can be applied to electric circuits each configuring the display portions A 3043 and B 3044. Note that, an image reproducing device provided with a recording medium includes game machines for domestic use and the like.

FIG. 30F is a goggle type display (bead mounted display), which includes a main body 3051, a display portion 3052, an arm portion 3053 and the like. The invention can be applied to an electric circuit configuring the display portion 3052.

FIG. 30G is a video camera, which includes a main body 3061, a display portion 3062, a housing 3063, an external connection port 3064, a remote control receiving portion 3065, an image receiving portion 3066, a battery 3067, an audio input portion 3068, an operating key 3069 and the like. The invention can be applied to an electric circuit configuring the display portion 3062.

FIG. 30H is a cellular phone, which includes a main body 3071, a housing 3072, a display portion 3073, an audio input portion 3074, an audio output portion 3075, an operating key 3076, an external connection port 3077, an antenna 3078, and the like. The invention can be applied to an electric circuit configuring the display portion 3073. The current consumption of the cellular phone can be suppressed by displaying white characters on a black background of the display portion 3073.

When the higher luminance of an organic light emitting material becomes available in the future, the display device of the invention will be applicable to a front or a rear projector in which light including output image data is enlarged by lenses or the like.

The above-described electronic apparatuses are becoming to be more used for displaying data that is transmitted through telecommunication paths such as internet or a CATV (cable television), in particular for displaying moving image data. Since a light emitting material exhibits high response speed, a light emitting device is suitably used for a moving image display.

Also, since a light emitting device consumes power in its light emitting portion, it is desirable that data is displayed so that the light emitting portion occupies as small space as possible. Accordingly, in the case of using a light emitting device in a display portion that mainly displays text data to a portable information device such as a cellular phone and a sound reproducing device, it is desirable to drive the device so that text data is displayed by light emitting parts on a non-light emitting background.

As described above, an application range of the invention is so wide that the invention can be applied to electronic apparatuses in various fields. The electronic apparatuses in this embodiment can employ a semiconductor device having any configurations shown in the foregoing Embodiment Modes 1 to 9.

The invention claimed is:

1. A semiconductor device comprising:
    a switching circuit including:
        n-pieces of input terminals $D_1, D_2, \ldots,$ and $D_n$; and
        m-pieces of output terminals $O_1, O_2, \ldots,$ and $O_m$, and
    m-pieces of current sources $I_1, I_2, \ldots,$ and $I_m$,
    wherein the current source $I_k$ and the output terminal $O_k$ of the switching circuit are electrically connected to each other (k=1 to m),
    the switching circuit selects the output terminals $O_1, O_2, \ldots,$ and $O_m$ to be connected to the input terminal $D_j$ (j=1 to n) by using signals which are input to the input terminals $D_1, D_2, \ldots,$ and $D_n$ of the switching circuit, and
    a signal which is output from the output terminal $O_k$ is input to the current source $I_k$.

2. The semiconductor device according to claim 1, wherein the switching circuit selects the output terminals $O_1, O_2, \ldots,$ and $O_m$ to be connected to the input terminal $D_j$ by further using a signal which is input externally.

3. A display device comprising the semiconductor device according to claim 1.

4. An electronic apparatus using in its display portion a display device comprising the semiconductor device according to claim 1.

5. The semiconductor device according to claim 1, wherein the current source $I_k$ and the output terminal $O_k$ of the switching circuit are connected directly to each other (k=1 to m).

6. The semiconductor device according to claim 1, further comprising:
    a signal line electrically connected to the m-pieces of current sources $I_1, I_2, \ldots,$ and $I_m$; and
    a pixel connected to the signal line, wherein a current having a correlation with a signal which is input to the signal line flows into a display element in the pixel.

7. The semiconductor device according to claim 6, wherein the correlation is a proportion.

8. A semiconductor device comprising:
a switching circuit including n-pieces of input terminals and m-pieces of output terminals, and
m-pieces of current sources,
wherein the m-pieces of the current sources are each connected to one of the different output terminals,
at least one of the input terminals of the switching circuit is connected to one or a plurality of switches,
the switch is connected to one of the m-pieces of the output terminals,
the switching circuit controls ON/OFF of the switch by using a signal which is input from at least one of the n-pieces of the input terminals, and
a signal which is output from one of the m-pieces of output terminals is input to the current source connected to the output terminal.

9. The semiconductor device according to claim 8, wherein the switching circuit controls ON/OFF of the switching circuit by further using a signal which is input externally.

10. The semiconductor device according to claim 8, wherein the switch comprises a digital circuit.

11. A display device comprising the semiconductor device according to claim 8.

12. An electronic apparatus using in its display portion a display device comprising the semiconductor device according to claim 8.

13. The semiconductor device according to claim 8, wherein the m-pieces of the current sources are each connected directly to one of the different output terminals.

14. The semiconductor device according to claim 8, further comprising:
a signal line electrically connected to the m-pieces of current sources; and
a pixel connected to the signal line,
wherein a current having a correlation with a signal which is input to the signal line flows into a display element in the pixel.

15. The semiconductor device according to claim 14, wherein the correlation is a proportion.

16. A semiconductor device comprising:
a switching circuit including n-pieces of input terminals and m-pieces of output terminals, and
m-pieces of current sources,
wherein the m-pieces of the current sources are each connected to one of the different output terminals,
at least one of the output terminals of the switching circuit is connected to one or a plurality of switches,
the switch is connected to one of the n-pieces of the input terminals,
the switching circuit controls ON/OFF of the switch by using a signal which is input from at least one of the n-pieces of the input terminals, and
a signal which is output from one of the m-pieces of output terminals is input to the current source connected to the output terminal.

17. The semiconductor device according to claim 16, wherein the switching circuit controls ON/OFF of the switching circuit by further using a signal which is input externally.

18. The semiconductor device according to claim 16, wherein the switch comprises a digital circuit.

19. A display device comprising the semiconductor device according to claim 16.

20. An electronic apparatus using in its display portion a display device comprising the semiconductor device according to claim 16.

21. The semiconductor device according to claim 16, wherein the m-pieces of the current sources are each connected directly to one of the different output terminals.

22. The semiconductor device according to claim 16, further comprising:
a signal line electrically connected to the m-pieces of current sources; and
a pixel connected to the signal line,
wherein a current having a correlation with a signal which is input to the signal line flows into a display element in the pixel.

23. The semiconductor device according to claim 22, wherein the correlation is a proportion.

24. A digital-analog converter circuit for converting an n-bit digital voltage signal into an analog current signal, comprising:
a switching circuit including n-pieces of input terminals and m-pieces of output terminals, and
m-pieces of current sources,
wherein the m-pieces of the current sources are each connected to one of the different output terminals,
the switching circuit selects an output terminal to be connected to the n-pieces of the input terminals among the m-pieces of the output terminals by using at least one of the n-bit digital voltage signals, and
a signal which is output from one of the m-pieces of output terminals is input to the current source connected to the output terminal.

25. The digital-analog converter circuit according to claim 24, wherein the switching circuit selects an output terminal to be connected to the n-pieces of the input terminals among the m-pieces of the output terminals by further using a signal which is input externally.

26. A digital-analog converter circuit according to claim 24, wherein the switch unit comprises a digital circuit.

27. A display device comprising the digital-analog converter circuit according to claim 24 in a signal line driver circuit.

28. An electronic apparatus using in its display portion a display device comprising the digital-analog converter circuit according to claim 24.

29. The digital-analog converter circuit according to claim 24, wherein the m-pieces of the current sources are each connected directly to one of the different output terminals.

30. The digital-analog converter circuit according to claim 24, wherein a signal line is electrically connected to the m-pieces of current sources and a pixel is connected to the signal line, wherein a current having a correlation with the analog current signal flows into a display element in the pixel.

31. The digital-analog converter circuit according to claim 30, wherein the correlation is a proportion.

32. A digital-analog converter circuit for converting an n-bit digital voltage signal into an analog current signal, comprising:
a switching circuit including n-pieces of input terminals, m-pieces of output terminals, and m-pieces of switch units, and
m-pieces of current sources,
wherein the m-pieces of the current sources are each connected to one of the different output terminals, the m-pieces of the output terminals are each connected to one of the different switch units, the m-pieces of the switch units are each connected to one or a plurality of the input terminals, the switching circuit controls the m-pieces of the switch units by using at least one of the n-bit digital voltage signals, thereby selecting an input terminal to be connected to the output terminal, and a signal which is output from one of the m-pieces of output terminals is input to the current source connected to the output terminal.

33. The digital-analog converter circuit according to claim 32, wherein the switching circuit controls the m-pieces of the switch units by further using a signal which is input externally.

34. A digital-analog converter circuit according to claim 32, wherein the switch unit comprises a digital circuit.

35. A display device comprising the digital-analog converter circuit according to claim 32 in a signal line driver circuit.

36. An electronic apparatus using in its display portion a display device comprising the digital-analog converter circuit according to claim 32.

37. The digital-analog converter circuit according to claim 32, wherein the m-pieces of the current sources are each connected directly to one of the different output terminals.

38. The digital-analog converter circuit according to claim 32, wherein a signal line is electrically connected to the m-pieces of current sources and a pixel is connected to the signal line, wherein a current having a correlation with the analog current signal flows into a display element in the pixel.

39. The digital-analog converter circuit according to claim 38, wherein the correlation is a proportion.

40. A digital-analog converter circuit for converting an n-bit digital voltage signal into an analog current signal, comprising:
a switching circuit including, n-pieces of input terminals, m-pieces of output terminals, and k ($1 \leq k < m$)-pieces of switch units, and
m-pieces of current sources,
wherein the m-pieces of the current sources are each connected to one of the different output terminals,
the k-pieces of the output terminals among m-pieces are each connected to one of the switch units,
the rest (m–k)-pieces of the output terminals are each connected to at least one of the input terminals without an intermediary of the switch unit,
the k-pieces of the switch units are each connected to one or a plurality of the input terminals, and
the switching circuit controls the k-pieces of the switch units by using at least one of the n-bit digital voltage signals, thereby selecting an input terminal to be connected to the output terminal.

41. The digital-analog converter circuit according to claim 40, wherein the k-pieces of the switch units are controlled by further using a signal which is input externally.

42. A digital-analog converter circuit according to claim 40, wherein the switch unit comprises a digital circuit.

43. A display device comprising the digital-analog converter circuit according to claim 40 in a signal line driver circuit.

44. An electronic apparatus using in its display portion a display device comprising the digital-analog converter circuit according to claim 40.

45. The digital-analog converter circuit according to claim 40, wherein a signal line is electrically connected to the m-pieces of current sources and a pixel is connected to the signal line, wherein a current having a correlation with the analog current signal flows into a display element in the pixel.

46. The digital-analog converter circuit according to claim 45, wherein the correlation is a proportion.

* * * * *